(12) United States Patent
Mukesh et al.

(10) Patent No.: US 12,438,085 B2
(45) Date of Patent: Oct. 7, 2025

(54) VIA TO BACKSIDE POWER RAIL THROUGH ACTIVE REGION

(71) Applicant: INTERNATIONAL BUSINESS MACHINES CORPORATION, Armonk, NY (US)

(72) Inventors: Sagarika Mukesh, Albany, NY (US); Nikhil Jain, Albany, NY (US); Devika Sarkar Grant, Amsterdam, NY (US); Ruilong Xie, Niskayuna, NY (US); Kisik Choi, Watervliet, NY (US); Prabudhya Roy Chowdhury, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 587 days.

(21) Appl. No.: 17/662,874

(22) Filed: May 11, 2022

(65) Prior Publication Data

US 2023/0369220 A1    Nov. 16, 2023

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76897* (2013.01); *H01L 23/5226* (2013.01);
(Continued)

(58) Field of Classification Search
CPC .. H10D 64/254; H10D 84/013; H10D 84/017; H10D 62/378; H10D 30/6757;
(Continued)

(56) References Cited

U.S. PATENT DOCUMENTS 7,867,822 B2 *   1/2011   Lee ................... H10D 84/0195
                                                   438/107
8,237,228 B2 *   8/2012   Or-Bach ............... G03F 9/7084
                                                   257/369
(Continued)

FOREIGN PATENT DOCUMENTS

CN      113555314 A     10/2021
EP       4523256 A1      3/2025
(Continued)

OTHER PUBLICATIONS

International Searching Authority, "Notification of Transmittal of the international Search Report and the Written Opinion of the International Searching Authority, or Declaration," Patent Cooperation Treaty, Aug. 21, 2023, 9 pages, International Application No. PCT/IB2023/053956.

(Continued)

*Primary Examiner* — Eduardo A Rodela
(74) *Attorney, Agent, or Firm* — Robert R. Aragona

(57) ABSTRACT

According to the embodiment of the present invention, a semiconductor device includes a first source/drain and a second source/drain. A first source/drain contact includes a first portion and a second portion. The first portion of the first source/drain contact is located directly atop the first source/drain. The second portion of the first source/drain contact extends vertically past the first source/drain. The first source/drain is in direct contact with three different sides of a first section of the second portion of the first source/drain contact.

25 Claims, 68 Drawing Sheets

(51) Int. Cl.
  *H01L 23/522* (2006.01)
  *H10D 30/67* (2025.01)
  *H10D 62/17* (2025.01)
  *H10D 64/23* (2025.01)
  *H10D 84/01* (2025.01)
  *H10D 84/03* (2025.01)
  *H10D 62/10* (2025.01)

(52) U.S. Cl.
  CPC ....... *H10D 30/6757* (2025.01); *H10D 62/378* (2025.01); *H10D 64/254* (2025.01); *H10D 84/0149* (2025.01); *H10D 84/017* (2025.01); *H10D 84/038* (2025.01); *H10D 62/121* (2025.01)

(58) Field of Classification Search
  CPC .. H10D 84/014; H10D 84/038; H10D 62/121; H10D 30/014; H10D 30/0198; H10D 30/43; H10D 30/6735; H10D 62/151; H10D 84/0133; H10D 64/017; H10D 64/256; H10D 84/83; H10D 86/201; H10D 89/611; H10D 89/931; H10D 64/258; H10D 84/853; H01L 23/5286; H01L 21/76897; H01L 23/5226; H01L 21/76895; H01L 23/485; H01L 21/76898; H01L 23/535; H01L 23/5283; B82Y 10/00
  See application file for complete search history.

(56) References Cited

U.S. PATENT DOCUMENTS

| | | | |
|---|---|---|---|
| 8,754,533 B2 * | 6/2014 | Or-Bach | H10B 20/00 257/797 |
| 9,093,316 B2 * | 7/2015 | Kuroda | H01L 21/76895 |
| 9,570,395 B1 | 2/2017 | Sengupta | |
| 10,586,765 B2 | 3/2020 | Smith | |
| 10,636,739 B2 | 4/2020 | Beyne | |
| 10,700,207 B2 | 6/2020 | Chen | |
| 11,004,855 B2 | 5/2021 | Wang | |
| 11,145,550 B2 | 10/2021 | Wang | |
| 11,355,381 B2 * | 6/2022 | Or-Bach | H10D 88/01 |
| 11,688,757 B2 * | 6/2023 | Tsugawa | H01L 21/76283 257/431 |
| 2018/0269152 A1 | 9/2018 | Sengupta et al. | |
| 2019/0378790 A1 | 12/2019 | Bohr | |
| 2020/0004914 A1 | 1/2020 | Peng et al. | |
| 2020/0105671 A1 | 4/2020 | Lai et al. | |
| 2020/0402909 A1 | 12/2020 | Hong | |
| 2021/0117606 A1 | 4/2021 | Peng et al. | |
| 2021/0231620 A1 | 7/2021 | Obermayr | |
| 2021/0305381 A1 | 9/2021 | Chiang | |
| 2021/0305428 A1 | 9/2021 | Ju | |
| 2021/0335690 A1 | 10/2021 | Huang | |
| 2021/0336012 A1 | 10/2021 | Huang | |
| 2021/0343646 A1 | 11/2021 | Chen | |
| 2021/0376093 A1 | 12/2021 | Chu | |
| 2021/0376155 A1 | 12/2021 | Chang | |
| 2022/0077140 A1 | 3/2022 | Thomson | |
| 2022/0140128 A1 | 5/2022 | Morrow | |
| 2023/0317563 A1 * | 10/2023 | Amin | H10D 62/121 |

FOREIGN PATENT DOCUMENTS

| | | |
|---|---|---|
| KR | 10-2021-0133850 A | 11/2021 |
| KR | 10-2024-0157043 A | 10/2024 |
| TW | 201901906 A | 1/2019 |
| TW | I681520 B | 1/2020 |
| TW | I858585 B | 10/2024 |
| WO | 2023/218266 A1 | 11/2023 |

OTHER PUBLICATIONS

Mathur et al., "Buried Bitline for sub-5nm SRAM Design", 2020 IEEE International Electron Devices Meeting (IEDM), 2020, pp. 5.

Prasad et al., "Buried Power Rails and Back-side Power Grids: Arm® CPU Power Delivery Network Design Beyond 5nm", 2019 IEEE, pp. 446-449.

Intellectual Property Office, "Request for the Submission of an Opinion," Aug. 11, 2025, 20 Pages, KR Application No. 10-2024-7031753.

* cited by examiner

VIA TO BACKSIDE POWER RAIL THROUGH ACTIVE REGION

BACKGROUND

The present invention relates generally to the field of microelectronics, and more particularly to a semiconductor device structure, and a method for forming a semiconductor device.

A nanosheet (NS) is the lead device architecture in continuing CMOS scaling. However, nanosheet technology has shown issues when scaling down such that as the devices become smaller and closer together, they are interfering with each other. Furthermore, as the devices become smaller and closer together, forming the connections to a backside power network is becoming more difficult.

SUMMARY

According to the embodiment of the present invention, a semiconductor device includes a first source/drain and a second source/drain. A first source/drain contact includes a first portion and a second portion. The first portion of the first source/drain contact is located directly atop the first source/drain. The second portion of the first source/drain contact extends vertically past the first source/drain. The first source/drain is in direct contact with three different sides of a first section of the second portion of the first source/drain contact. A backside power rail is in contact with a surface of the second portion of the first source/drain contact. A bottom surface of the backside power rail is larger than a top surface of the second portion of the first source/drain contact.

According to the embodiment of the present invention, a first source/drain and a second source/drain are formed on a buried oxide layer. A first source/drain contact including a first portion and a second portion is formed. The first portion of the first source/drain contact is formed directly atop the first source/drain. The second portion of the first source/drain contact is formed to extend vertically past the first source/drain. The first source/drain is formed to be in direct contact with three different sides of a first section of the second portion of the first source/drain contact.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
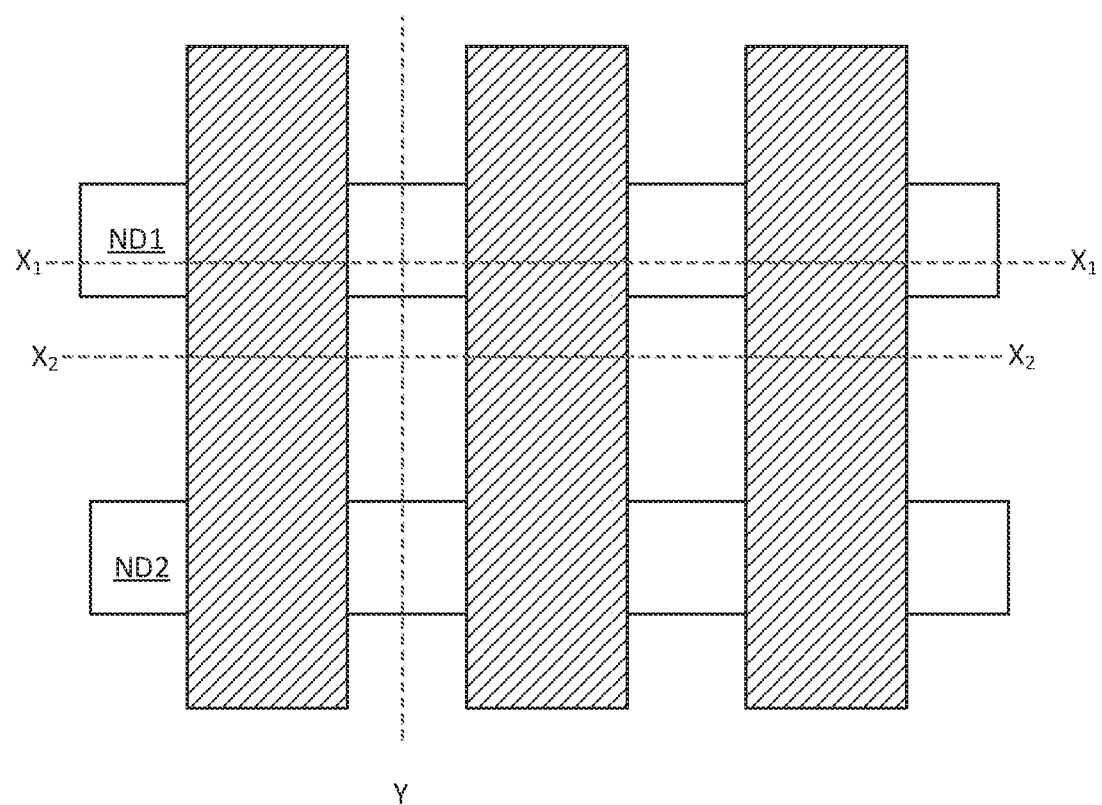
FIG. 1 illustrates a top-down view of a plurality of nanodevices, in accordance with the embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

References in the specification to "one embodiment," "an embodiment," "an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "formed on," or "formed atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be a direct or indirect positional relationship. As an example of an indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes which are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

When a via extends downwards from a frontside contact the via may be located between two active regions on a nanodevice. The downwards extending via is connected to a component, for example, a backside power rail. The limited amount of space for the formation of the via may cause defects in the nanodevice to be formed. For example, there is a high risk of shorting because of a small tip-to-tip space between the via and the adjacent source/drain contact.

By relocating the via to the backside power rail (VBPR) to partially pass through or fully pass through the active region (e.g., the source/drain), the high risk of shorting may be greatly reduced.

The present invention is directed to forming a frontside contact (e.g., the source/drain contact) that includes a VBPR that passes through at least a portion of the active region to connect to a backside power rail (BPR). The VBPR is formed through a multistage processing, where the first stage forms a first trench that partially overlaps with the source/drain. The second stage forms a liner inside the first trench. The third stage etches a second trench by extending the first trench downwards through the source/drain to an underlying layer. A fourth stage forms a third trench adjacent to and connected to the first trench, where the third trench is located over the remaining source/drain. The fifth stage fills the first trench, the second trench and third trench with a conductive metal, forming the source/drain contact that includes VBPR.

FIG. 1 illustrates a top-down view of a plurality of nanodevices ND1, ND2 in accordance with the embodiment of the present invention. The adjacent devices include a first nanodevice ND1 and a second nanodevice ND2. Cross-section $X_1$ is a cross section perpendicular to the gates along the horizontal axis of the first nanodevice ND1 and cross-section Y is a cross section parallel to the gates in the source/drain region across both nanodevices ND1, ND2. Cross-section $X_2$ is a cross section through the gate region along the horizontal axis between the nanodevices ND1, ND2, near the source/drain region of ND1. It may be appreciated that the embodiment of the present invention is not limited to nanodevices ND1 and ND2, and that other devices including, but not limited to, FinFET, PFET, nanowire, and a planar device may also be used.

Figure 2:
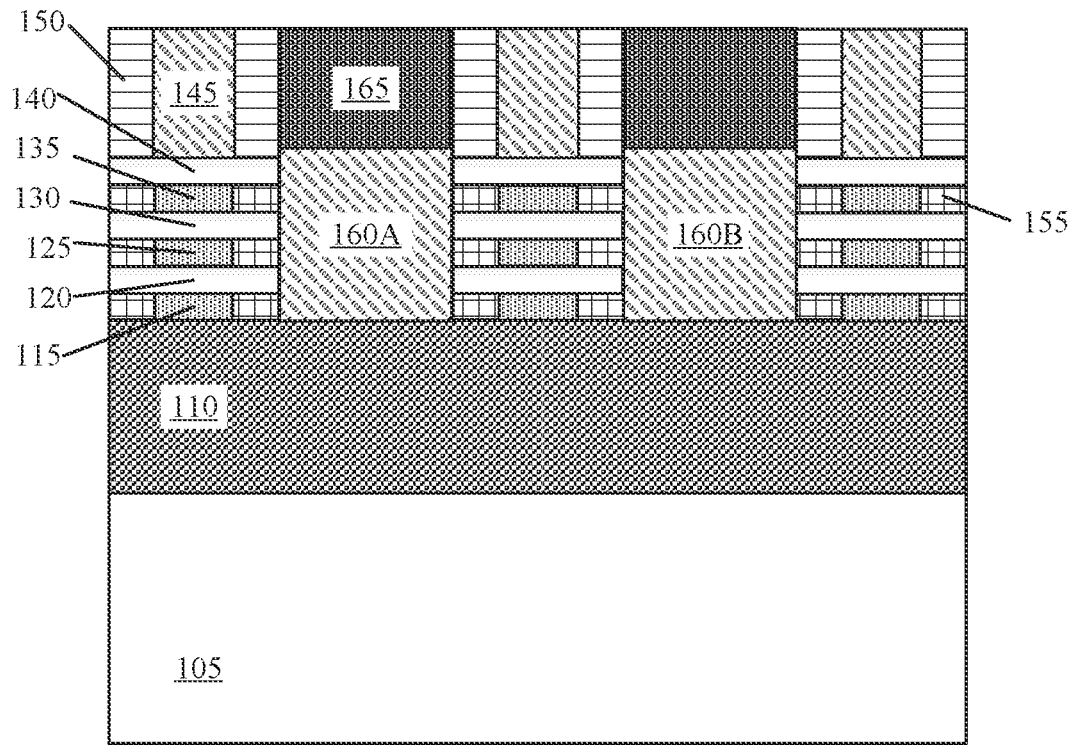
FIGS. 2-4 illustrate cross sections $X_1$, $X_2$, and Y, respectively, of the plurality of nanodevices after nanosheet formation, dummy gate formation, gate spacer and inner spacer formation, source/drain formation, and interlayer dielectric deposition and CMP.
Figure 3:
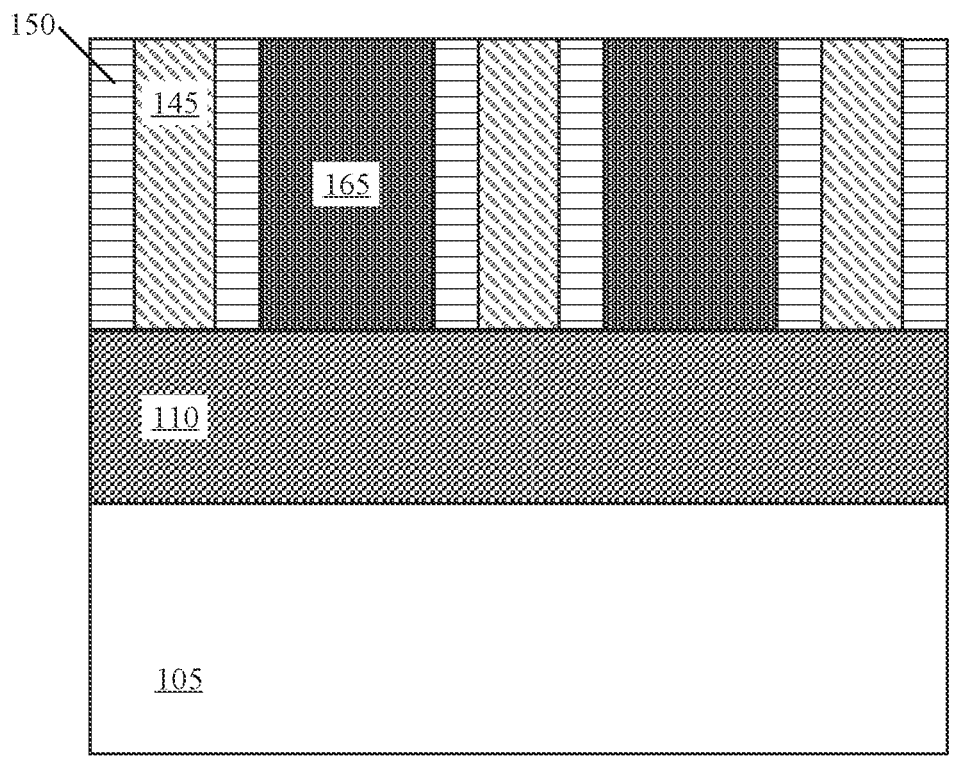
Figure 4:
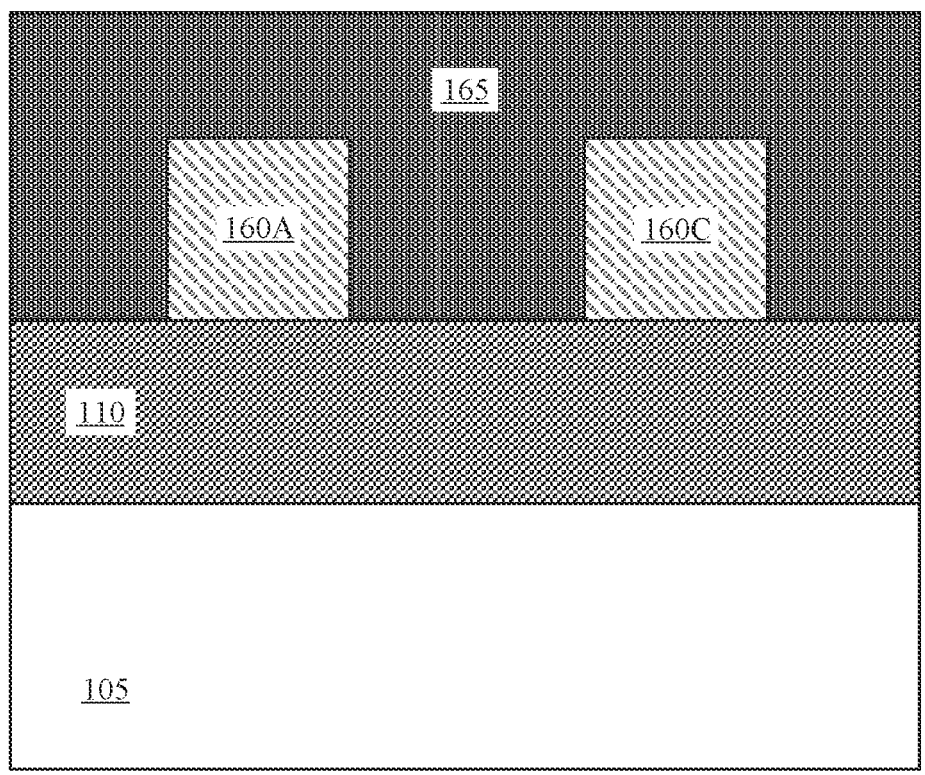

FIGS. 2-4 illustrate the stage of the device fabrication after nanosheet 120, 130, 140 formation, dummy gate 145 formation, gate spacer 150 and inner spacer 155 formation, source/drain 160A, 160B, 160C formation, and interlayer dielectric 165 deposition and CMP. FIG. 2 illustrates cross section $X_1$ of the plurality of nanodevices ND1, ND2, in accordance with the embodiment of the present invention.

The plurality of nanodevices ND1, ND2 include a substrate 105, a buried oxide layer 110, a first sacrificial layer 115, a first nanosheet 120, a second sacrificial layer 125, a second nanosheet 130, a third sacrificial layer 135, a third nanosheet 140, a dummy gate 145, a gate spacer 150, an inner spacer 155, a first source/drain 160A, a second source/drain 160B, and an interlayer dielectric (ILD) 165. The substrate 105 and the buried oxide layer 110 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 and the buried oxide layer 110 may be doped, undoped or contain doped regions and undoped regions therein.

The first sacrificial layer 115 is formed directly atop the buried oxide layer 110. The first nanosheet 120 is formed directly atop the first sacrificial layer 115. The second sacrificial layer 125 is formed directly atop the first nanosheet 120. The second nanosheet 130 is formed directly atop the second sacrificial layer 125. The third sacrificial layer 135 is formed directly atop the second nanosheet 130. The third nanosheet 140 is formed directly atop the third sacrificial layer 140. The first sacrificial layer 115, the second sacrificial layer 125, and the third sacrificial layer 135 are hereinafter referred to as the plurality of sacrificial layers 115, 125, 135. In addition, the first nanosheet 120, the second nanosheet 130, and the third nanosheet 140 are hereinafter referred to as the plurality of nanosheets 120, 130, 140. The plurality of sacrificial layers 115, 125, 135 may be comprised of, for example, SiGe, where Ge is about 35%. The plurality of nanosheets 120, 130, 140 may be comprised of, for example, Si. The number of nanosheets and the number of sacrificial layers described above are not intended to be limiting, and it may be appreciated that in the embodiment of the present invention the number of nanosheets and the number of sacrificial layers may vary. After formation of the plurality of nanosheets 120, 130, 140 and the plurality of sacrificial layers 115, 125, 135, together the nanosheet stack, the nanosheet stack may be further patterned using conventional lithography and etching processes.

The dummy gate 145 is formed directly atop the third nanosheet 140. The gate spacer 150 is formed on both sides of the dummy gate 145. Then, the exposed nanosheets 120, 130, 140 is recessed, followed by selective SiGe indentation to create cavities in the sacrificial layers 115, 125, 135. The inner spacer 155 is then formed inside the cavities. The first source/drain 160A, the second source/drain 160B, and the third source/drain 160C grow from exposed surfaces of the nanosheets 120, 130, 140. Then, the ILD 165 is formed directly atop the first source/drain 160A and the second source/drain 160B and surrounds one side of the gate spacer 150.

FIG. 3 illustrates cross section $X_2$ of the plurality of nanodevices ND1, ND2, in accordance with the embodiment of the present invention. The dummy gate 145 is formed directly atop the buried oxide layer 110 with the gate spacer 150 on both sides of the dummy gate 145. The ILD 165 is formed directly atop the buried oxide layer 110 and surrounds one side of the upper spacer 150.

FIG. 4 illustrates cross section Y of the plurality of nanodevices ND1, ND2, in accordance with the embodiment of the present invention. The first source/drain 160A and the third source/drain 160C are formed directly atop the buried oxide layer 110. The ILD 165 is also formed directly atop the buried oxide layer 110 and surrounds the first source/drain 160A and the third source/drain 160C on three sides.

The first source/drain 160A, the second source/drain 160B, and the third source/drain 160C can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 5:
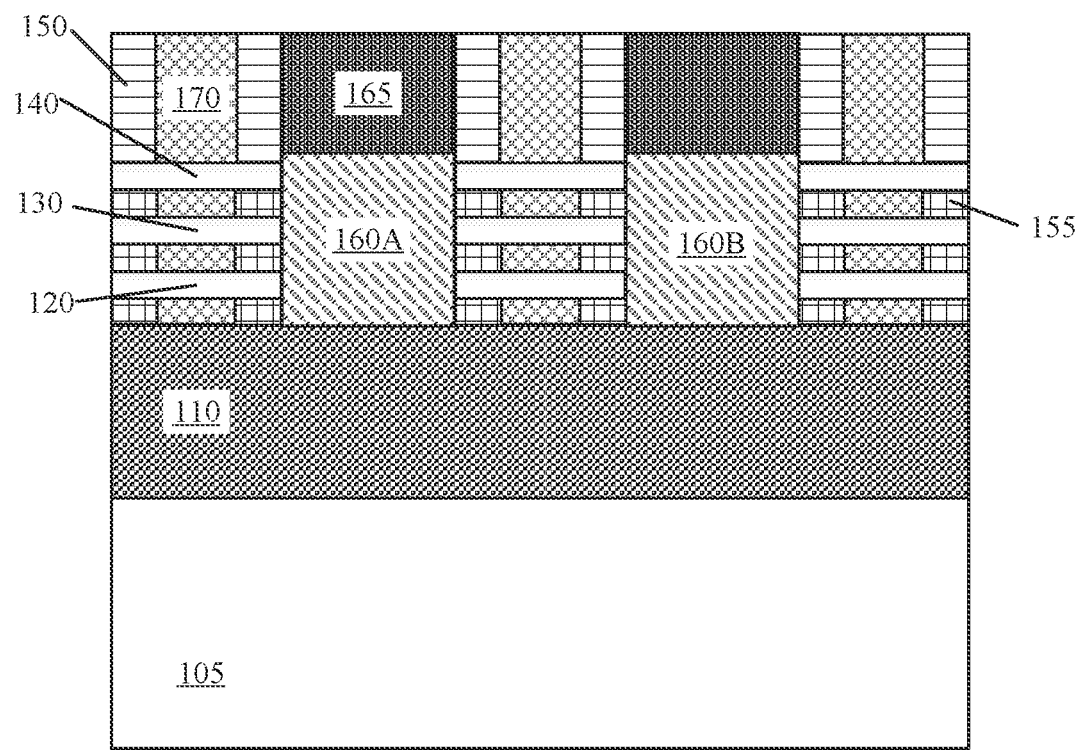
FIGS. 5-7 illustrate cross sections $X_1$, $X_2$, and Y, respectively, of the plurality of nanodevices after the formation of a gate and a gate cut dielectric pillar, in accordance with the embodiment of the present invention.
Figure 6:
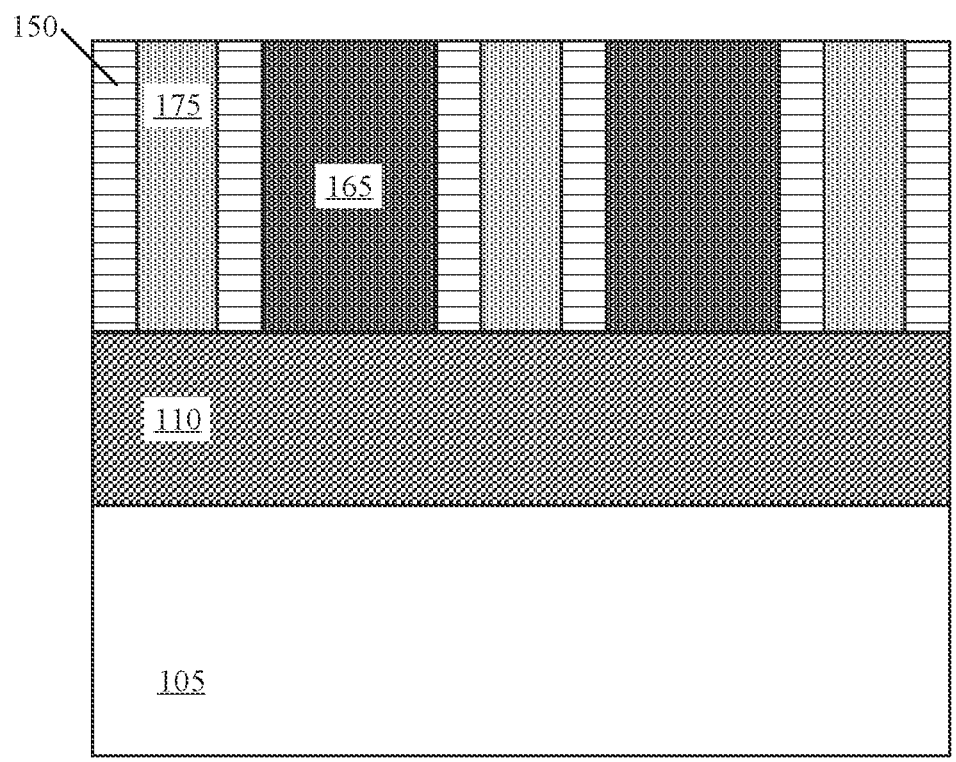
Figure 7:
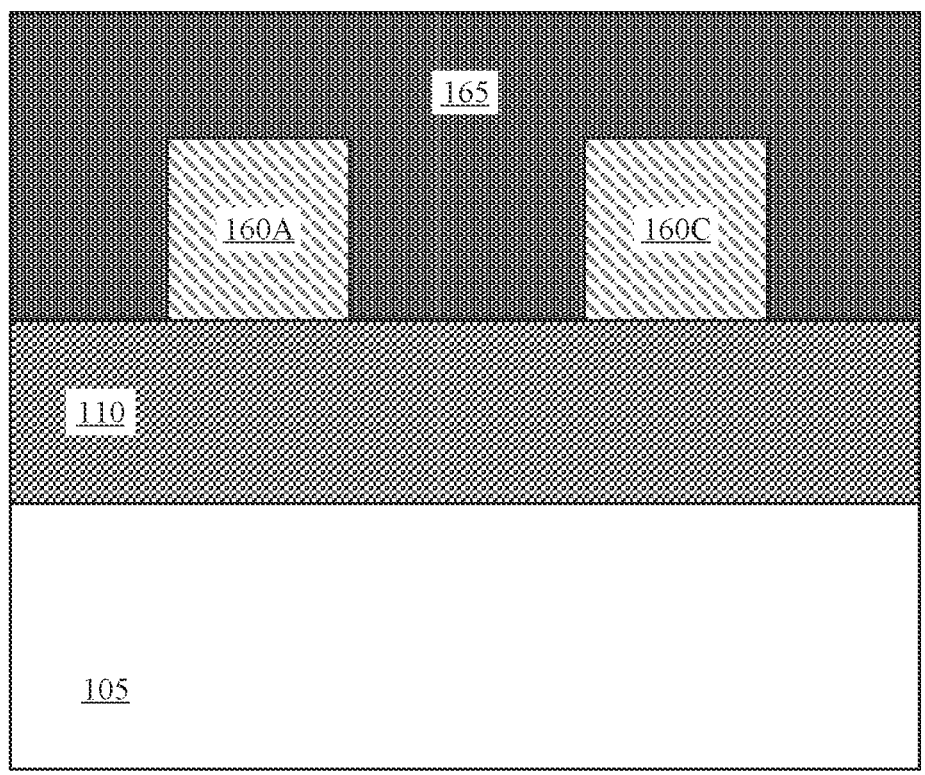

FIGS. 5-7 illustrate cross sections $X_1$, $X_2$, and Y, respectively, of the plurality of nanodevices ND1, ND2 after the formation of a gate 170 and a gate cut dielectric pillar 175, in accordance with the embodiment of the present invention. In FIG. 5, the dummy gate 145 and the plurality of sacrificial layers 115, 125, 135 are removed. A gate material is deposited in the space created by the removal of the dummy gate 145 and sacrificial layers 115, 125, 135 to form a replacement gate (i.e., the gate 170). The gate 170 can be comprised of, for example, a gate dielectric liner, such as a high-k dielectric like HfO2, ZrO2, HfLaOx, etc., and work function layers, such as TiN, TiAlC, TiC, etc., and conductive metal fills, like W. In FIG. 6, the dummy gate 145 or gate 170 is removed and a dielectric material is filled in the space to form the gate cut dielectric pillar 175. The gate spacer 150 remains on both sides of the gate cut dielectric pillar 175.

Figure 8:
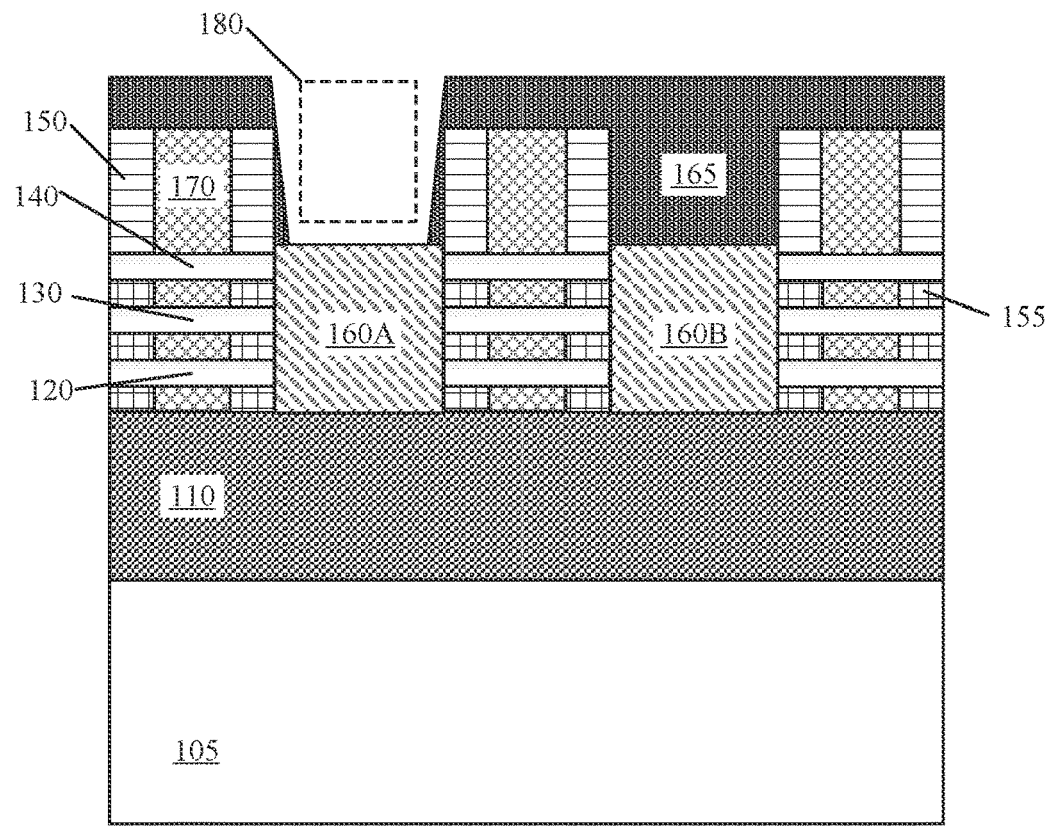
FIGS. 8-10 illustrate cross sections $X_1$, $X_2$, and Y, respectively, of the plurality of nanodevices after the formation of a first trench, in accordance with the embodiment of the present invention.
Figure 9:
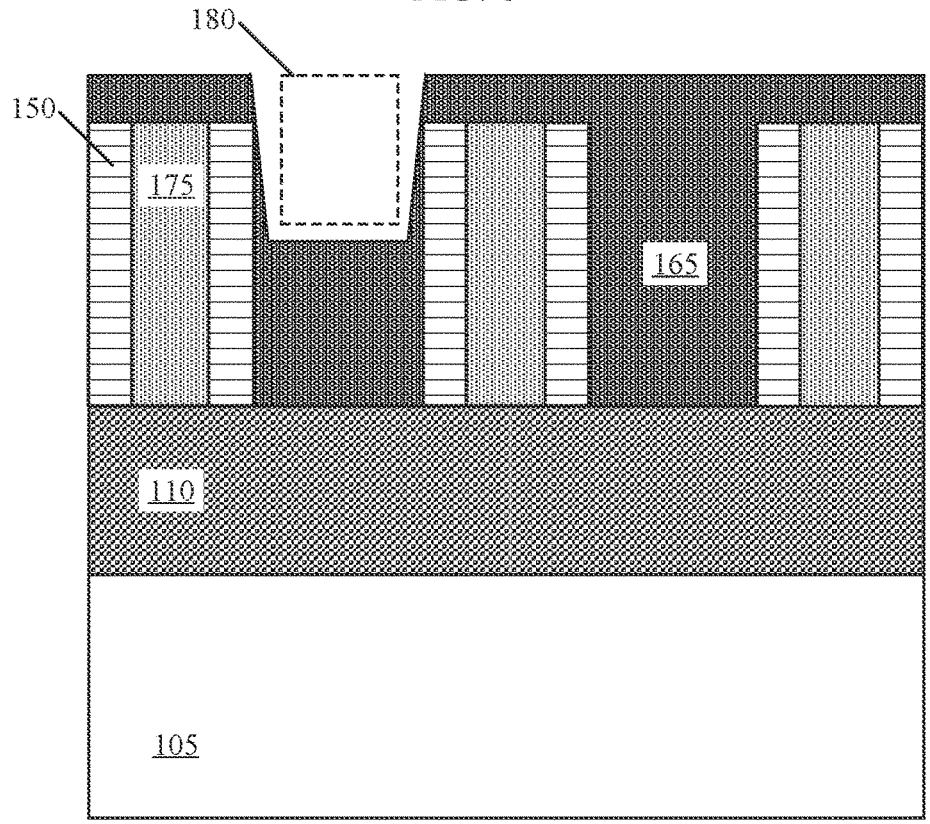
Figure 10:
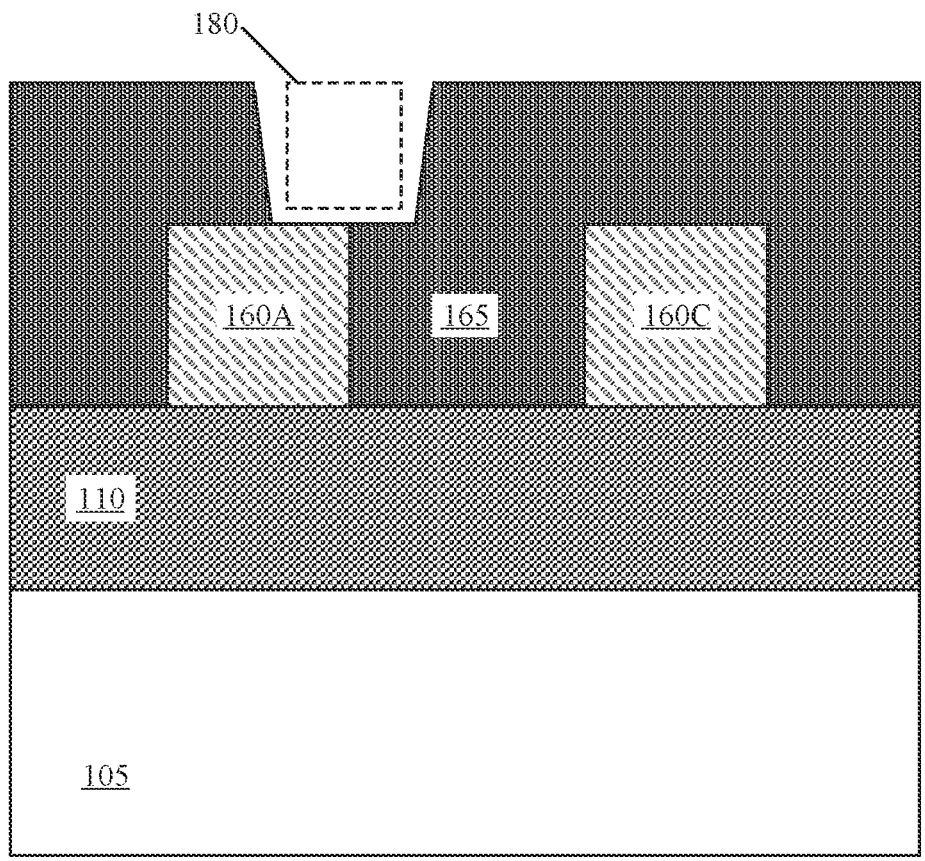

FIGS. 8-10 illustrate cross sections $X_1$, $X_2$, and Y, respectively, of the plurality of nanodevices ND1, ND2 after the formation of the first trench 180, in accordance with the embodiment of the present invention. In FIG. 8, a portion of the ILD 165 is etched by, for example, reactive ion etch (RIE) to form the first trench 180. The bottom surface of the first trench 180 exposes a portion of a top surface of the first source/drain 160A. In FIG. 9, the bottom surface of the first trench 180 is comprised of a surface of the ILD 165. The first trench 180 is located adjacent to and between two gate spacers 150. In FIG. 10, the bottom surface of the first trench 180 exposes a portion of the first source drain 160A and is comprised of a surface of the ILD 165.

Figure 11:
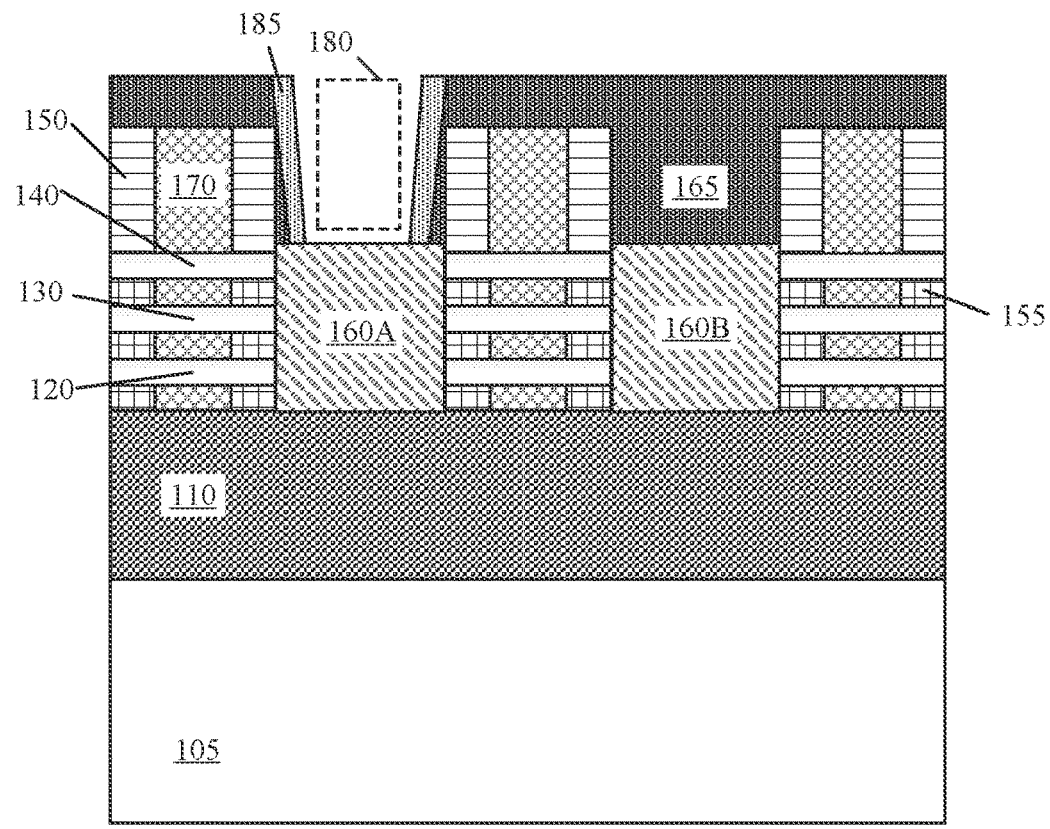
FIGS. 11-13 illustrate cross sections $X_1$, $X_2$, and Y, respectively, of the plurality of nanodevices after the formation of a trench liner, in accordance with the embodiment of the present invention.
Figure 12:
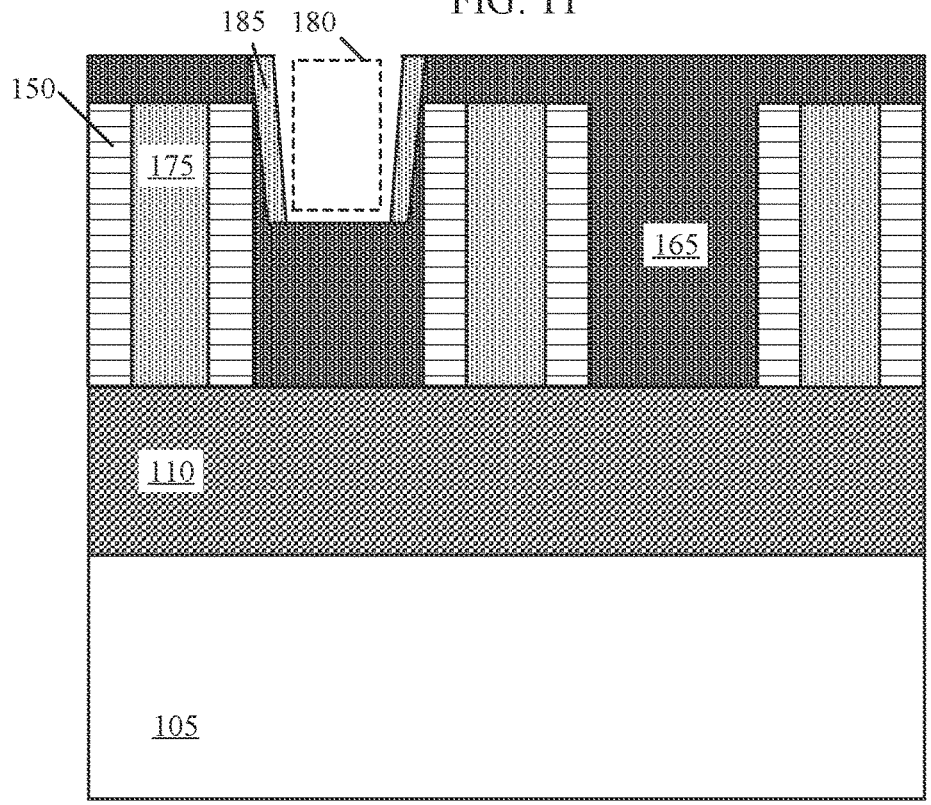
Figure 13:
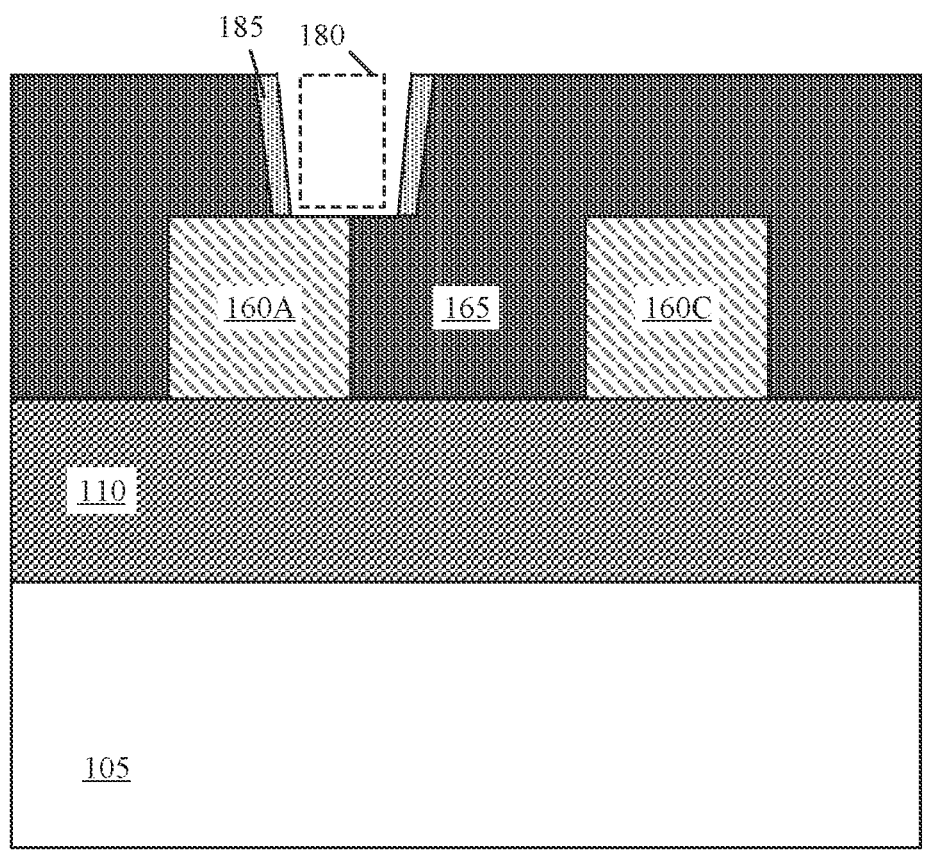

FIGS. 11-13 illustrate cross sections $X_1$, $X_2$, and Y, respectively, of the plurality of nanodevices ND1, ND2 after the formation of the trench liner 185, in accordance with the embodiment of the present invention. A liner material is deposited on the exposed surfaces of the ILD 165 and the first trench 180. The liner material is etched back to form the trench liner 185 located on the sidewalls of the first trench 180.

Figure 14:
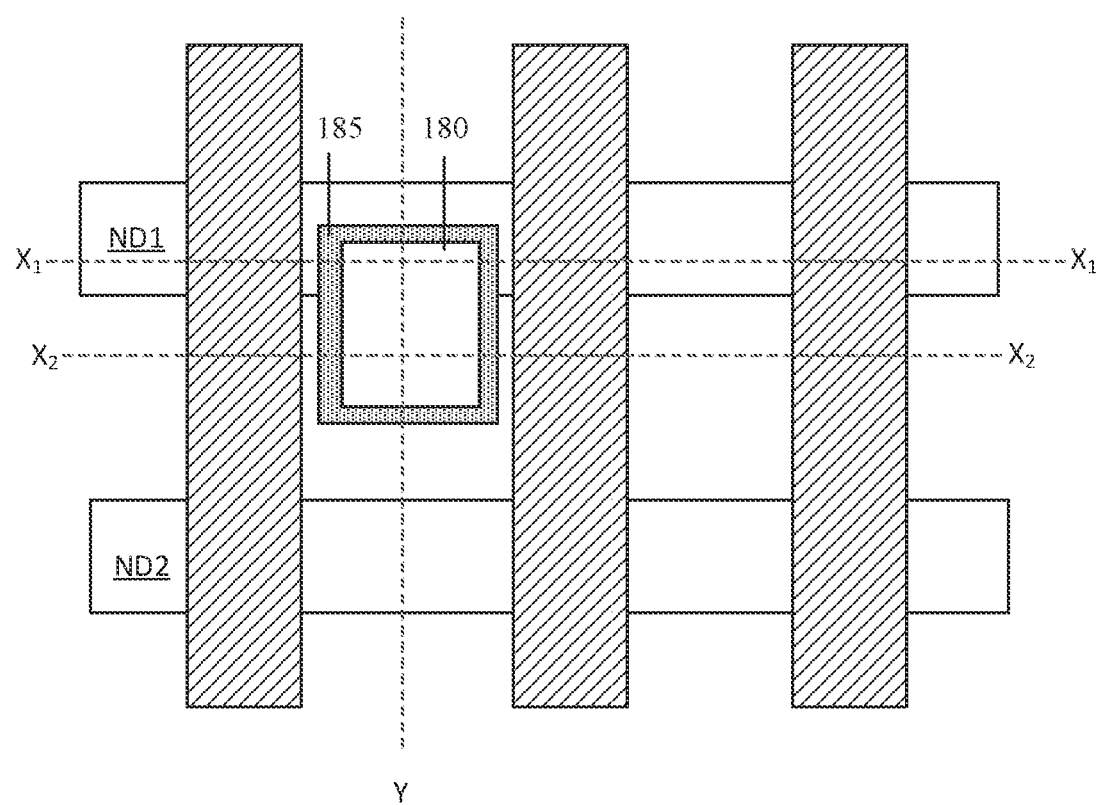
FIG. 14 illustrates a top-down view of a plurality of nanodevices after the formation of a second trench, in accordance with the embodiment of the present invention.

FIG. 14 illustrates a top-down view of a plurality of nanodevices ND1, ND2 after the formation of the first trench 180, in accordance with the embodiment of the present invention. FIG. 14 is meant to illustrate the placement of the first trench 180 in the source/drain region. A portion of the first trench 180 and a portion of the trench liner 185 are located above a portion of the first source/drain 160A. FIG. 14 illustrates that the first trench 180 and the trench liner 185 do not completely cover the first source/drain 160A.

Figure 15:
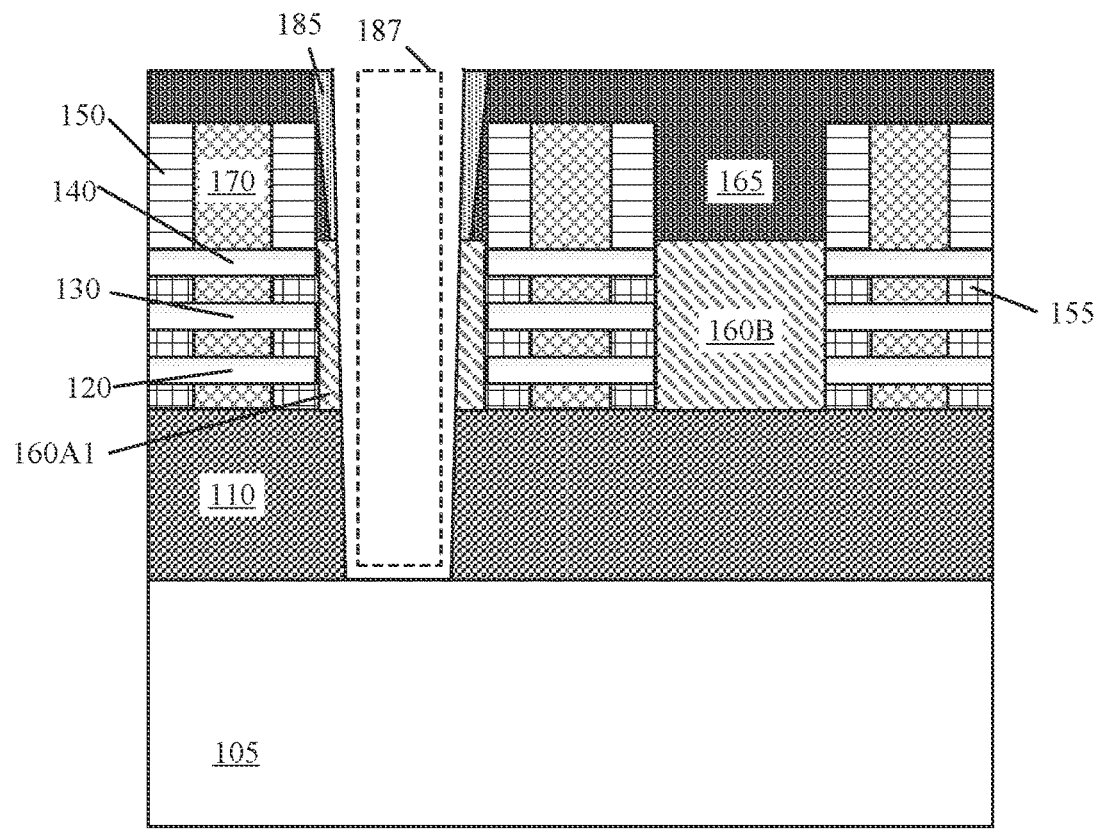
FIGS. 15-17 illustrate cross sections $X_1$, $X_2$, and Y, respectively, of the plurality of nanodevices after the formation of the second trench, in accordance with the embodiment of the present invention.
Figure 16:
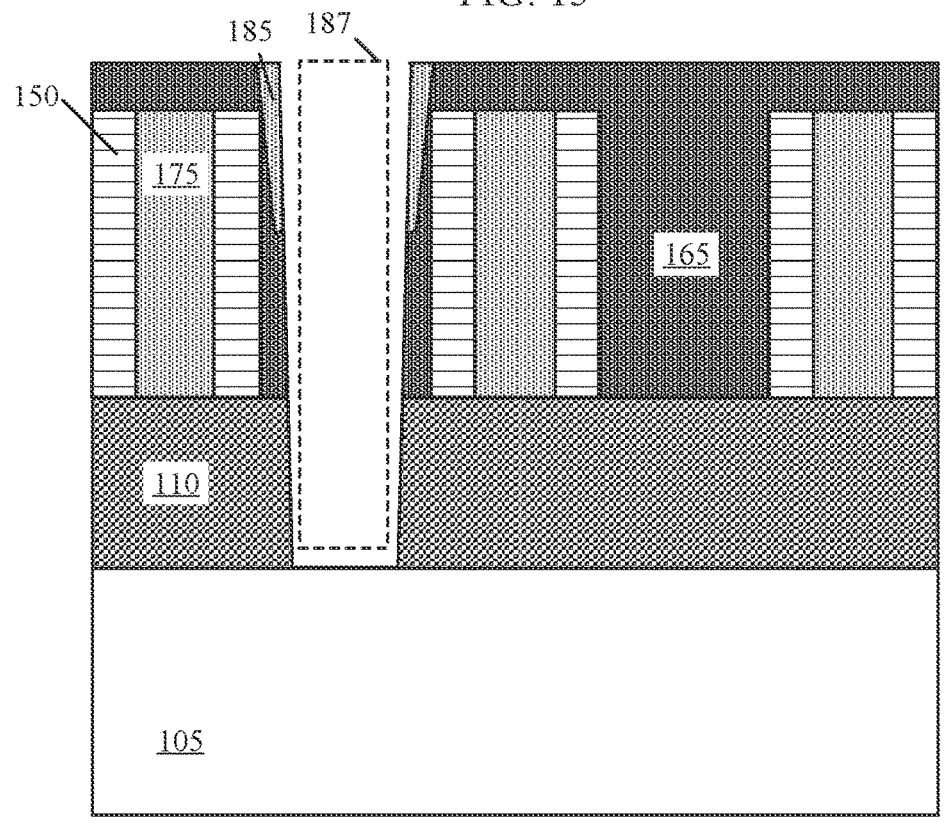
Figure 17:
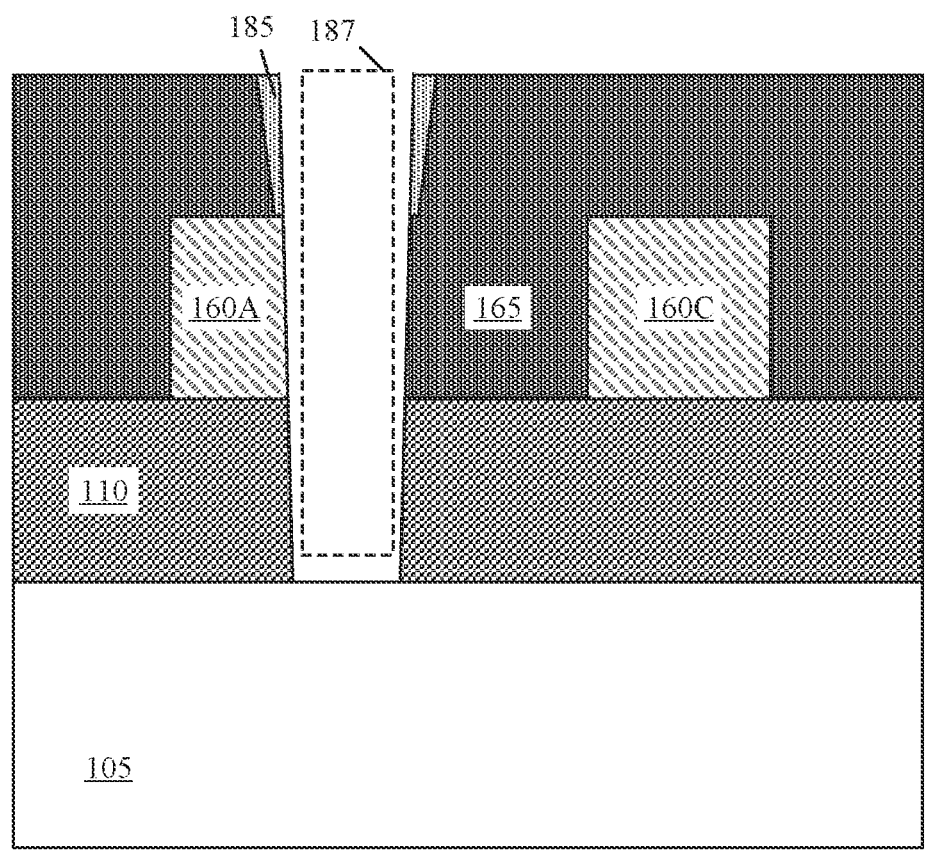

FIGS. 15-17 illustrate cross sections $X_1$, $X_2$, and Y, respectively, of the plurality of nanodevices ND1, ND2 after the formation of the second trench 187, in accordance with the embodiment of the present invention. In FIG. 15, the second trench 187 is formed by extending the first trench 180 downwards by etching a portion of the first source/drain 160A and the buried oxide layer 110. A bottom surface of the second trench 187 exposes a portion of a top surface of the substrate 105. A first portion of the sidewalls of the second trench 187 is defined by the buried oxide layer 110. A second portion of the sidewalls of the second trench 187 is defined by the remaining first source/drain 160A1. A third portion of the sidewalls of the second trench 187 is defined by the trench liner 185. When viewed from a top-down perspective, the first source/drain 160A has a shape similar to a lower case "n" such that the vertical elements of the n-shape relate to the remaining first source/drain 160A1.

In FIG. 16, the second trench 187 is formed by extending the first trench 180 downwards by etching a portion of the ILD 165 and the buried oxide layer 110. The bottom surface of the second trench 187 exposes a portion of the top surface of the substrate 105. A first portion of the sidewalls of the second trench 187 is defined by the buried oxide layer 110. A second portion of the sidewalls of the second trench 187 is defined by the ILD 165. A third portion of the sidewalls of the second trench 187 is defined by the trench liner 185.

In FIG. 17, the second trench 187 is formed by extending the first trench 180 downwards by etching a portion of the first source/drain 160A, the ILD 165, and the buried oxide layer 110. The bottom surface of the second trench 187 exposes a portion of the top surface of the substrate 105. A first portion of the sidewalls of the second trench 187 is defined by the buried oxide layer 110. A second portion of the sidewalls of the second trench 187 is defined by the ILD 165 and the first source/drain 160A. A third portion of the sidewalls of the second trench 187 is defined by the trench liner 185.

Figure 18:
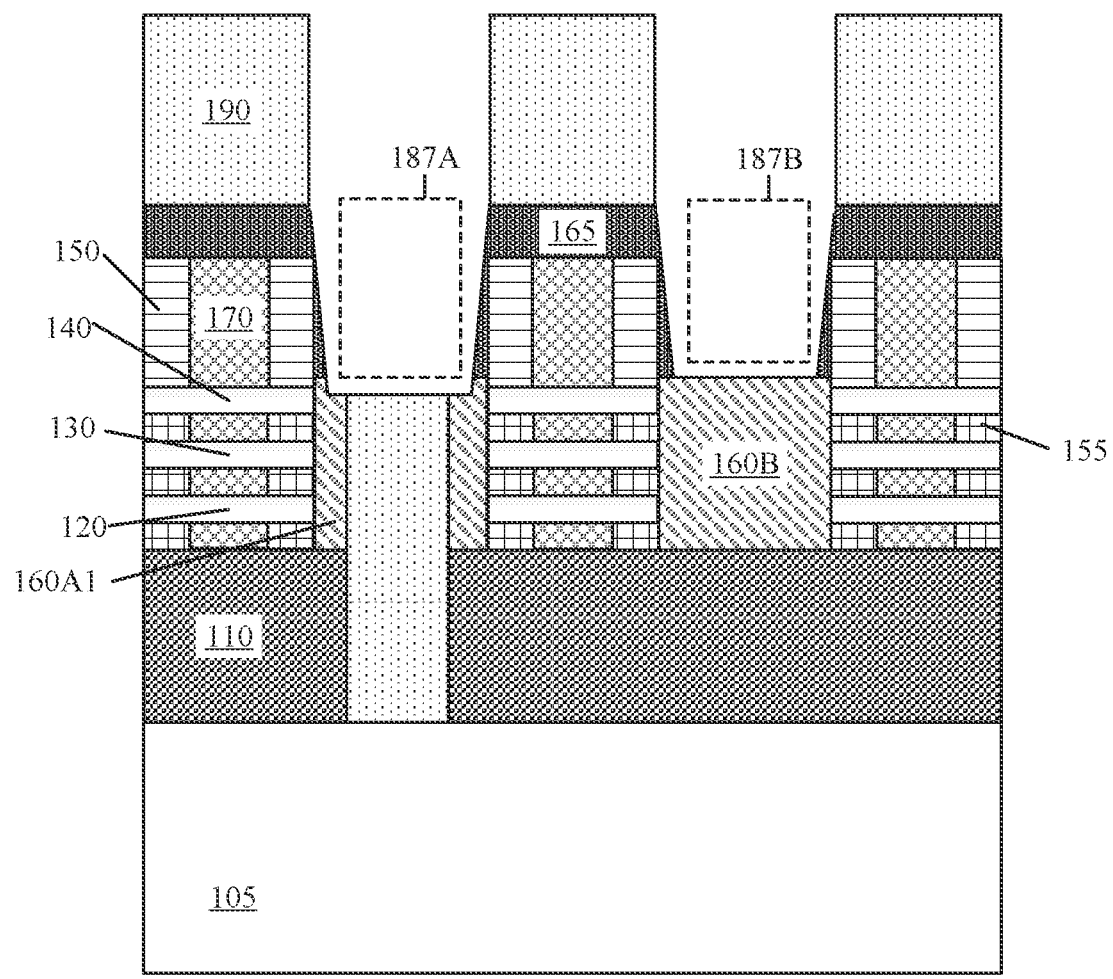
FIGS. 18-20 illustrate cross sections $X_1$, $X_2$, and Y, respectively, of the plurality of nanodevices after the formation of a third trench, a fourth trench, a fifth trench, and a lithography layer, in accordance with the embodiment of the present invention.
Figure 19:
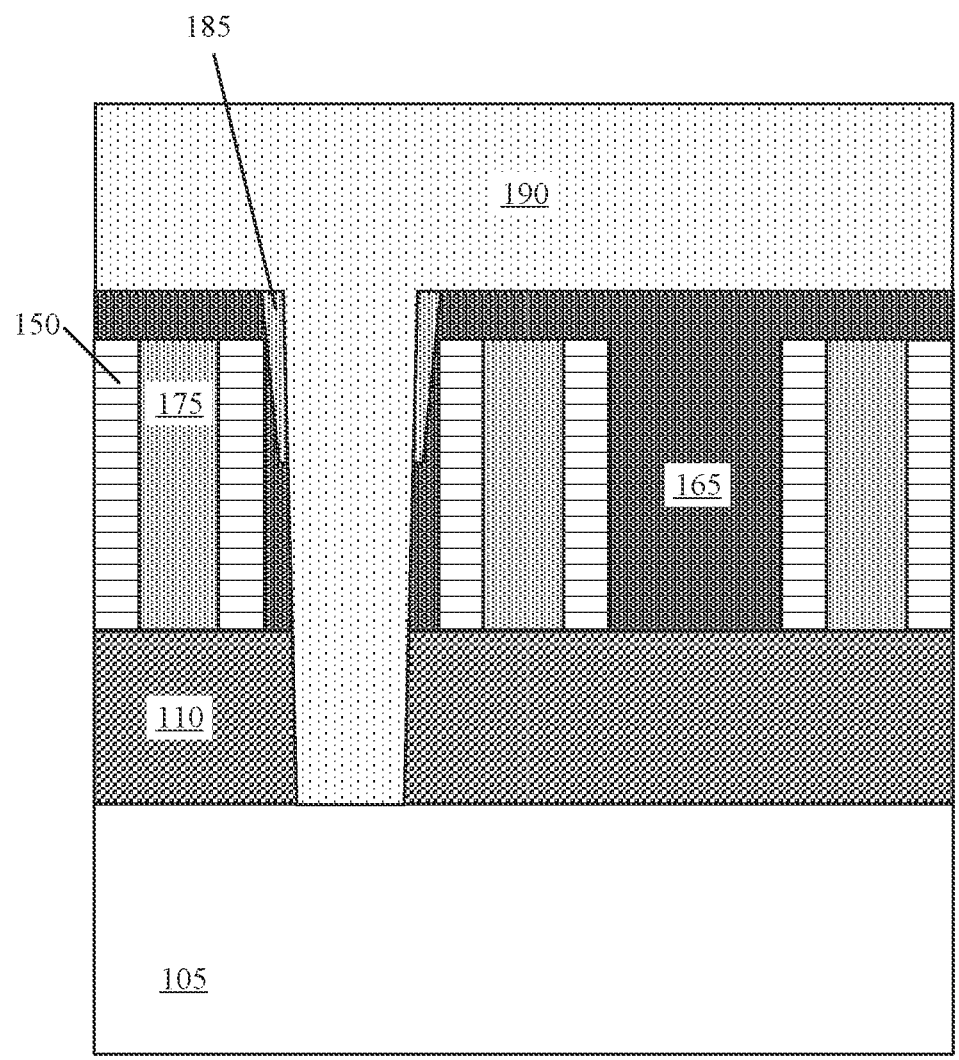
Figure 20:
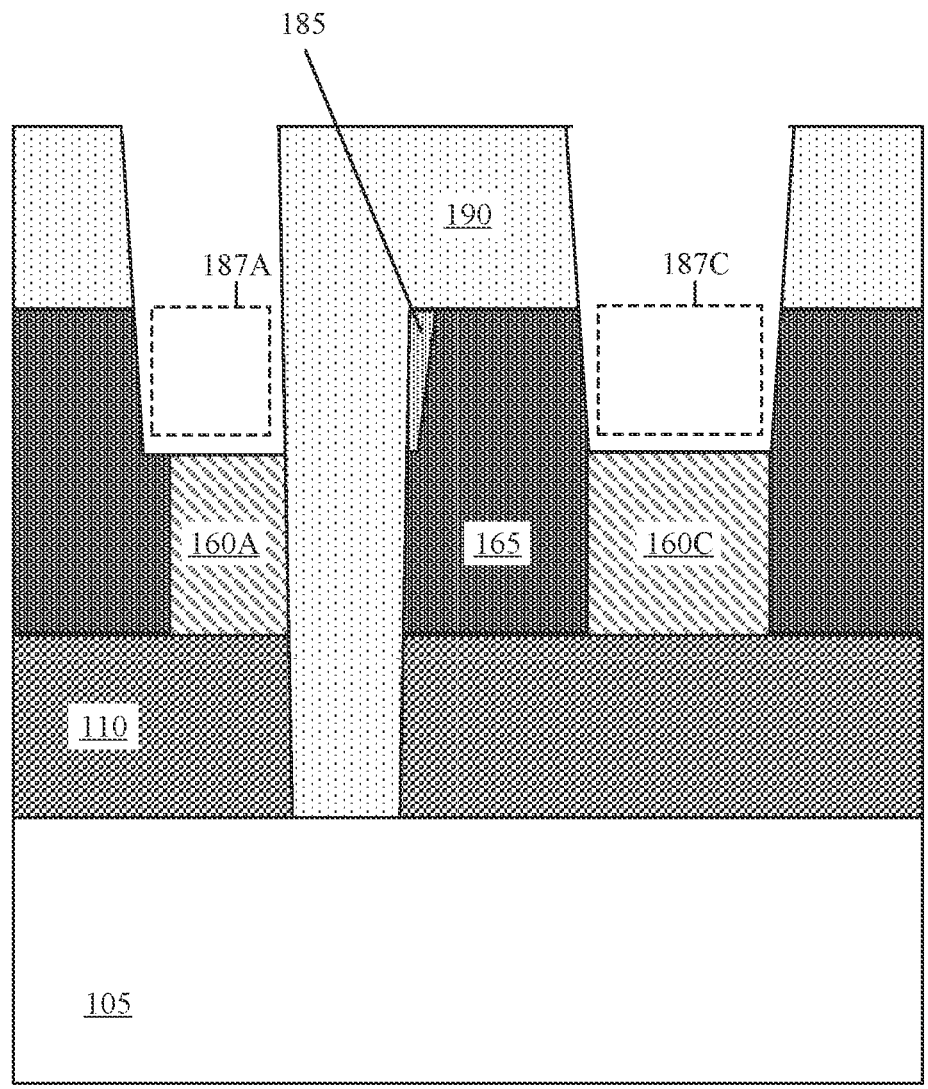

FIGS. 18-20 illustrate cross sections $X_1$, $X_2$, and Y, respectively, of the plurality of nanodevices ND1, ND2 after the formation of the third trench 187A, a fourth trench 187B, a fifth trench 187C, and a lithography mask layer 190, in accordance with the embodiment of the present invention.

In FIG. 18, a lithography mask layer 190, for example, an organic planarization layer (OPL), is deposited and patterned directly atop the ILD 165, and fills the second trench 187. The lithography mask layer 190 is formed by depositing, for example, an OPL material in a spin-on coating process. The lithography mask layer 190 is then patterned to expose a portion of the underlying ILD 165 and a portion of the trench liner 185. The exposed portion of the ILD 165 and the exposed trench liner 185 are etched to form the third trench 187A and the fourth trench 187B. The third trench 187A is located over the remaining first source/drain 160A1, such that, the third trench 187A is adjacent/connected to the first trench 180. The fourth trench 187B is located over the second source/drain 160B, such that, a bottom surface of the fourth trench 187B exposes a top surface of the second source/drain 160B.

In FIGS. 19 and 20, the lithography mask layer 190 is formed directly atop the ILD 165, atop and adjacent to a portion of the trench liner 185, and fills the second trench 187. The lithography mask layer 190 protects these elements during the etching process to form the third trench 187A, the fourth trench 187B, and the fifth trench 187C.

In FIG. 20, the exposed portion of the ILD 165 and the exposed trench liner 185 are etched to form the third trench 187A and the fifth trench 187C. The third trench 187A is located over the first source/drain 160A, such that the third trench 187A is adjacent/connected to the first trench 180. The first trench 180 and the third trench 187A are connected, so when the lithography mask layer 190 is removed, a combined trench is created from the first trench 180 and the third trench 187A. The fifth trench 187C is located over the third source/drain 160C, such that a bottom surface of the fifth trench 187C exposes a top surface of the third source/drain 160C.

Figure 21:
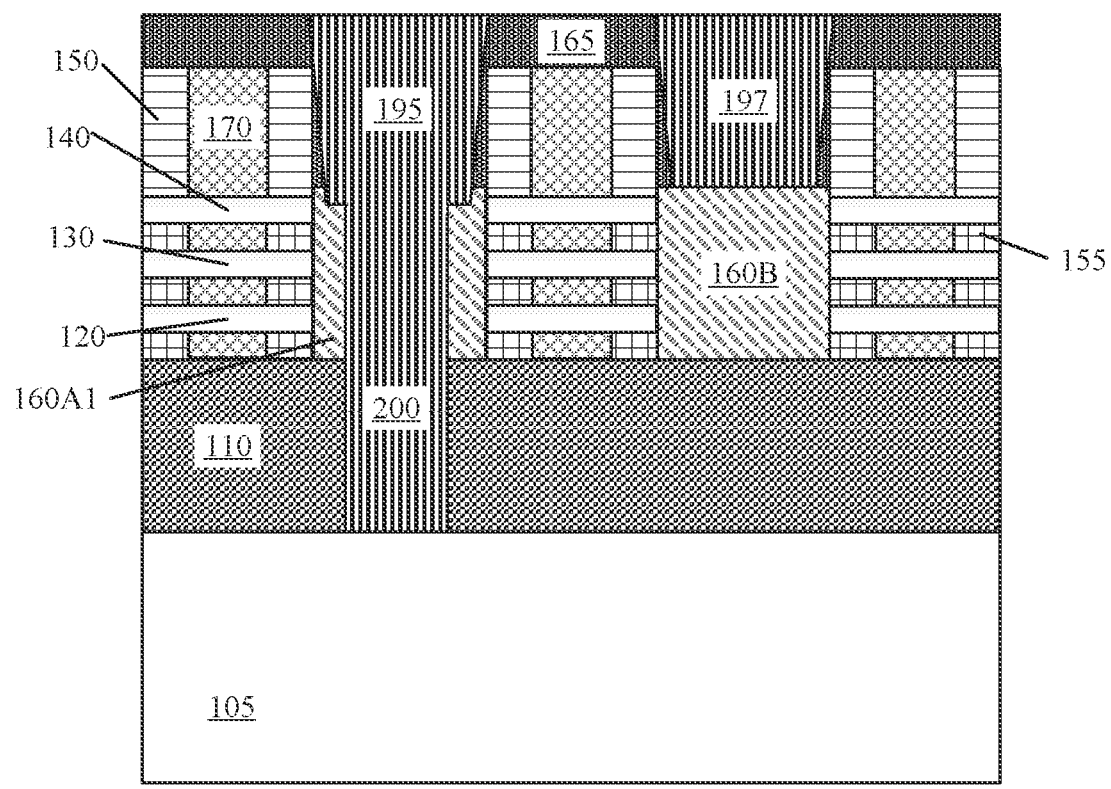
FIGS. 21-23 illustrate cross sections $X_1$, $X_2$, and Y, respectively, of the plurality of nanodevices after the formation of a via to the backside power rail (VBPR), a first source/drain contact, and a second source/drain contact, in accordance with the embodiment of the present invention.
Figure 22:
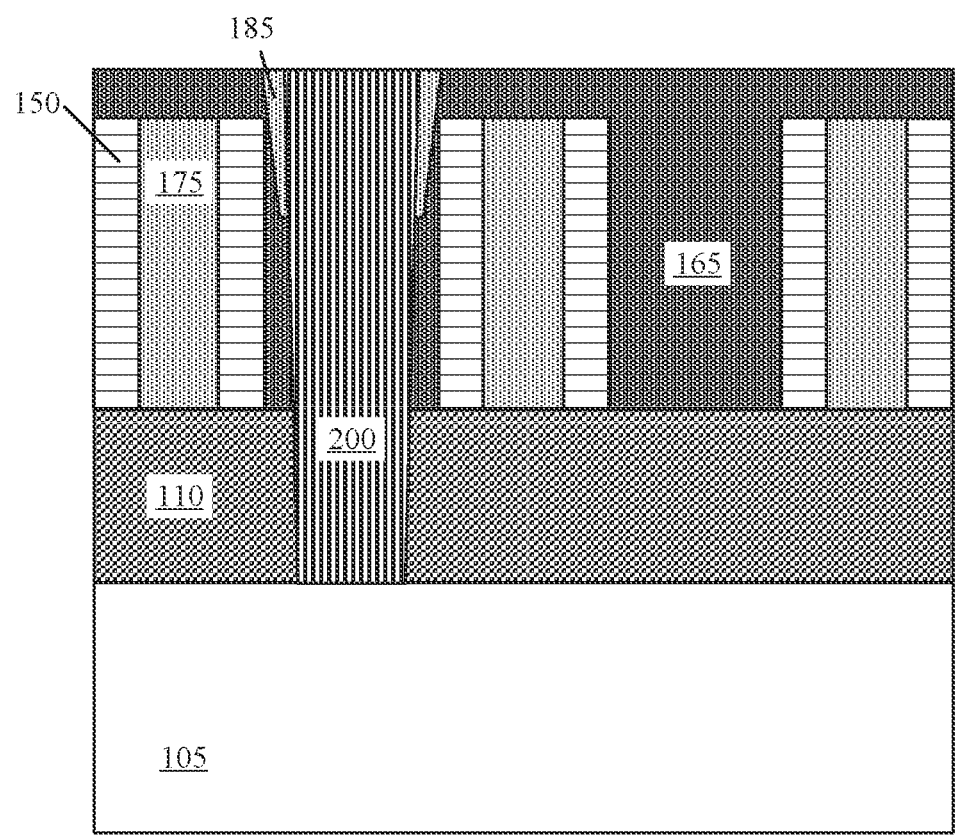
Figure 23:
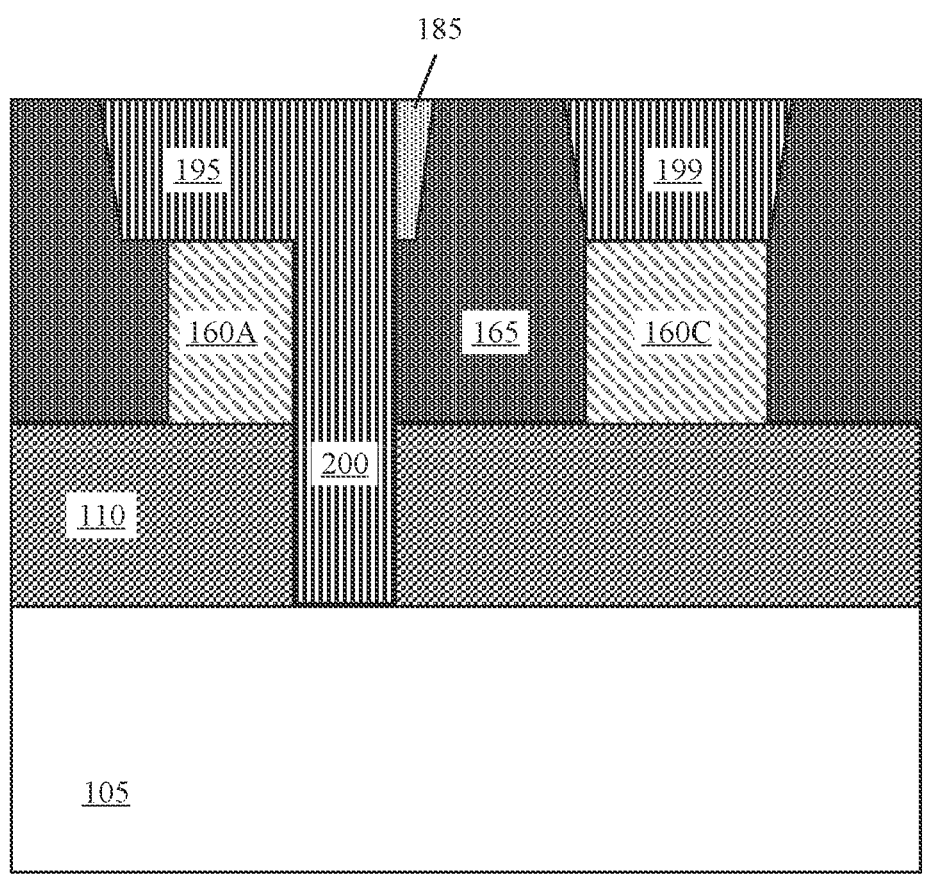

FIGS. 21-23 illustrate cross sections $X_1$, $X_2$, and Y, respectively, of the plurality of nanodevices ND1, ND2 after the formation of a via to the backside power rail (VBPR) 200, a first source/drain contact 195, and a second source/drain contact 197, in accordance with the embodiment of the present invention. The lithography mask layer 190 is removed. The combined trench (i.e., the first trench 180, the second trench 187 and the third trench 187A), the fourth trench 187B, and the fifth trench 187C are filled with a conductive metal (e.g., including a silicide liner, such as Ni, Ti, NiPt, an adhesion metal liner, such as TiN and conductive metal fill, such as W, Co, or Ru) to form the contacts 195, 197, 199 for the source/drains 160A, 160B, 160C. The first source/drain contact 195 includes a first portion and a second portion, where a critical dimension of the second portion of the first source/drain contact 195 is smaller than a critical dimension of the first portion of the first source/drain contact 195. In FIG. 21, the first portion of the first source/drain contact 195 is located directly over the remaining first source/drain 160A1 and a bottom surface of the first portion of the first source/drain contact 195 is in contact with the remaining first source/drain 160A1. In FIGS. 21-23, the VBPR 200 is the downwards extending via of the first source/drain contact 195 extending vertically past the remaining first source/drain 160A1. As used herein, the VBPR 200 is the second portion of the first source/drain contact 195. A bottom surface of the VBPR 200 is in contact with a top surface of the substrate 105. In FIG. 21, a portion of the sidewalls of the VBPR 200 is in contact with the buried oxide layer 110, or the remaining first source/drain 160A1, respectively. In FIG. 22, a portion of the sidewalls of the VBPR 200 is in contact with the buried oxide layer 110, the ILD 165, or the trench liner 185, respectively. In FIG. 23, a portion of the sidewalls of the VBPR 200 is in contact with the buried oxide layer 110, the first source/drain 160A and the ILD 165, or the first source/drain contact 195 and a portion of the trench liner 185, respectively. In FIG. 21, a section of the VBPR 200 is in contact with an interior sidewall of the remaining first source/drain 160A1. Therefore, the remaining first source/drain 160A1 wraps around a portion of the VBPR 200, such that, the remaining first source/drain 160A1 is in in contact with a plurality of sidewalls of the VBPR 200. The second source/drain contact 197 is located directly over the second source/drain 160B and a bottom surface of the second source/drain contact 197 is in contact with a top surface of the second source/drain 160B. The remaining first source drain 160A1 is smaller than the second source/drain 160B.

In FIG. 22, the trench liner 185 wraps around the upper section of the VBPR 200 to be connected on three sides.

In FIG. 23, the first portion of the first source/drain contact 195 is located directly over the first source/drain 160A and a portion of the ILD 165. The bottom surface of the first portion of the first source/drain contact 195 is in contact with the first source/drain 160A and the ILD 165. The third source/drain contact 199 is located directly over the third source/drain 160C and a bottom surface of the third source/drain contact 199 is in contact with the third source/drain 160C.

Figure 24:
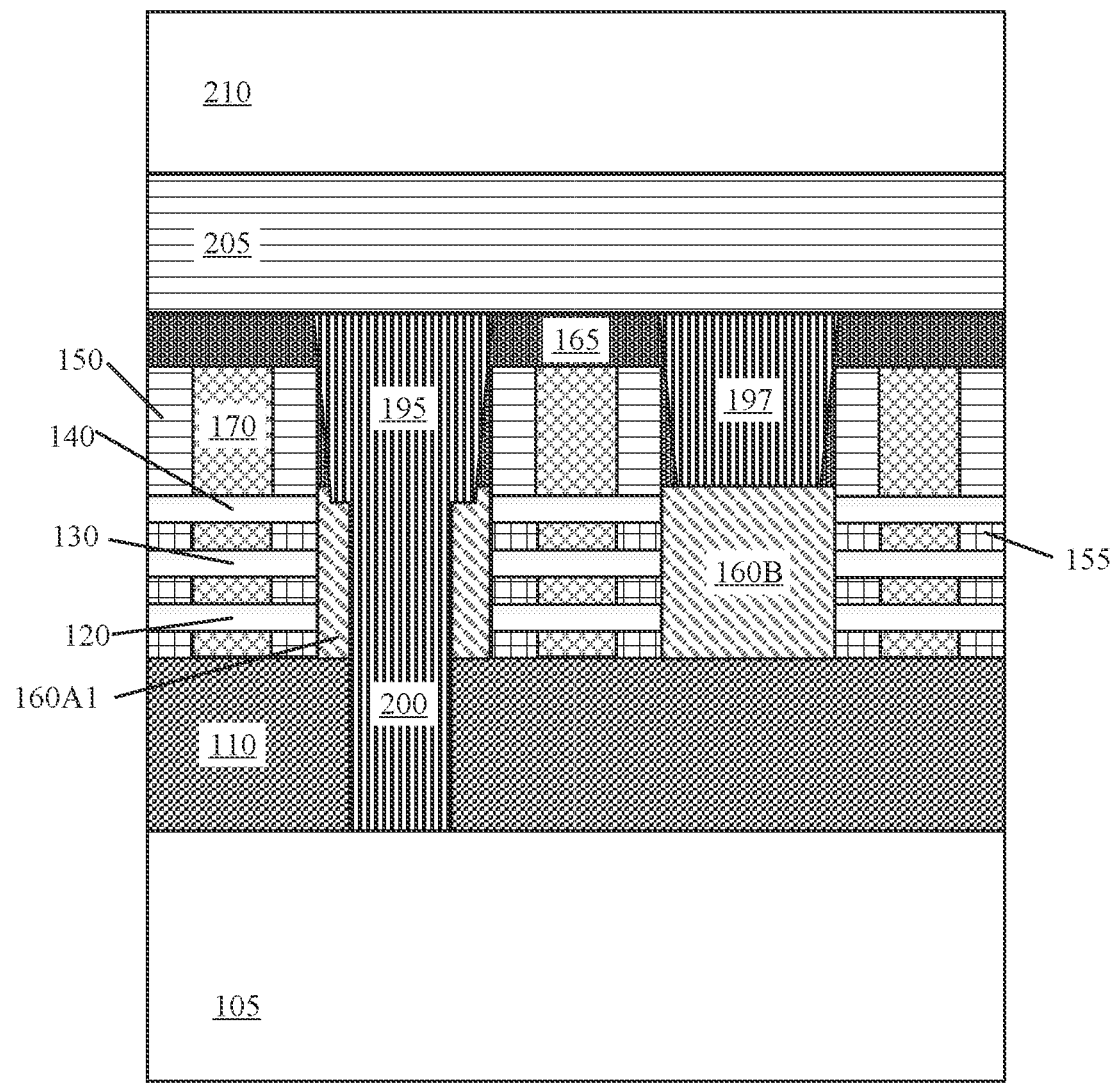
FIGS. 24-26 illustrate cross sections $X_1$, $X_2$, and Y, respectively, of the plurality of nanodevices after the formation of a back-end-of-line (BEOL) layer and bonding to a carrier wafer, in accordance with the embodiment of the present invention.
Figure 25:
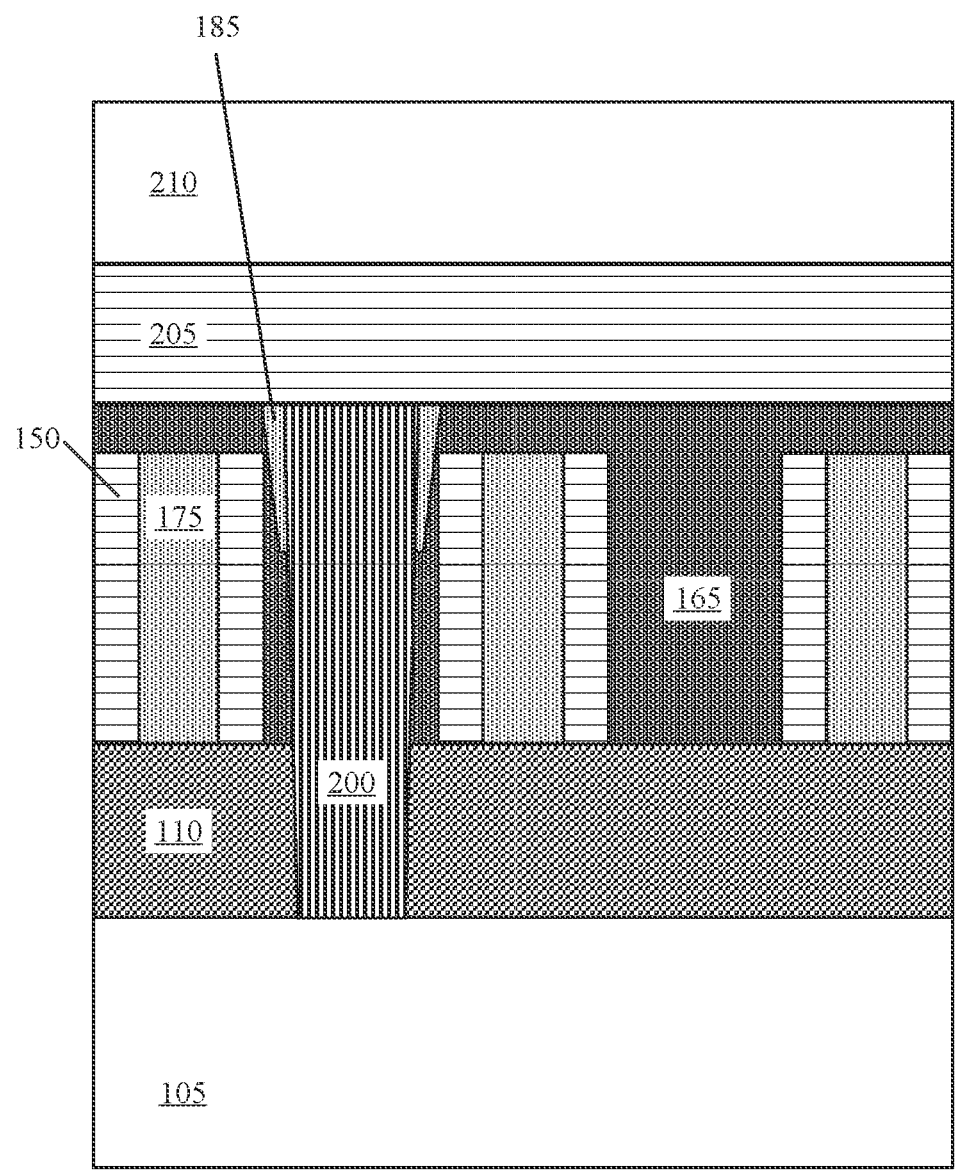
Figure 26:
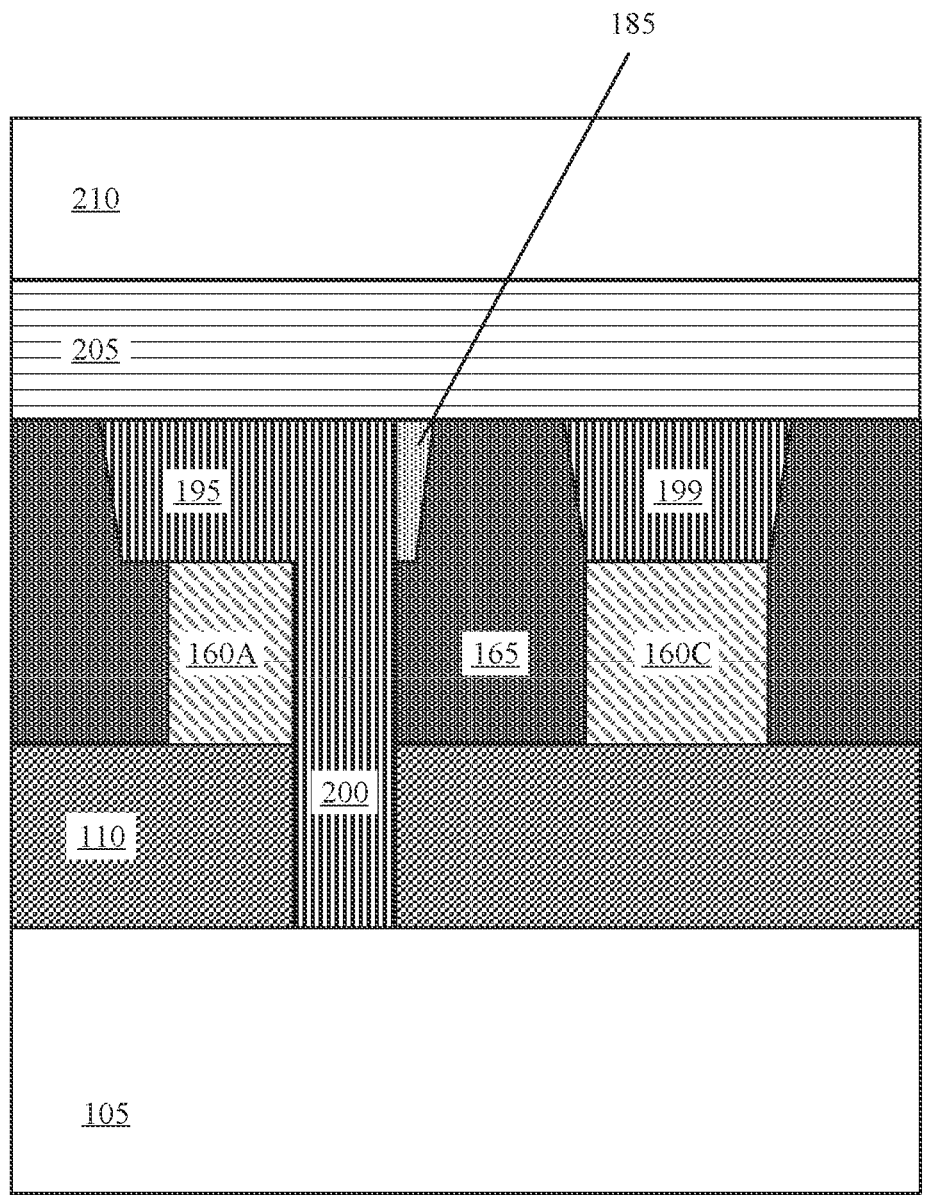

FIGS. 24-26 illustrate cross sections $X_1$, $X_2$, and Y, respectively, of the plurality of nanodevices ND1, ND2 after the formation of a back-end-of-line (BEOL) layer 205 and bonding to a carrier wafer 210, in accordance with the embodiment of the present invention. The BEOL layer 205 may contain multiple metal layers and vias in between. In FIG. 24, the BEOL layer 205 is formed directly atop the ILD 165, the first source/drain contact 195, and the second source/drain contact 197. In FIG. 25, the BEOL layer 205 is formed directly atop the ILD 165, the trench liner 185, and the VBPR 200. In FIG. 26, the BEOL layer 205 is formed directly atop the ILD 165, a portion of the trench liner 185, the first source/drain contact 195, the VBPR 200, and the third source/drain contact 199. In FIGS. 24-26, the carrier wafer 210 is formed directly atop the BEOL layer 205 by depositing a wafer material on the BEOL layer 205.

Figure 27:
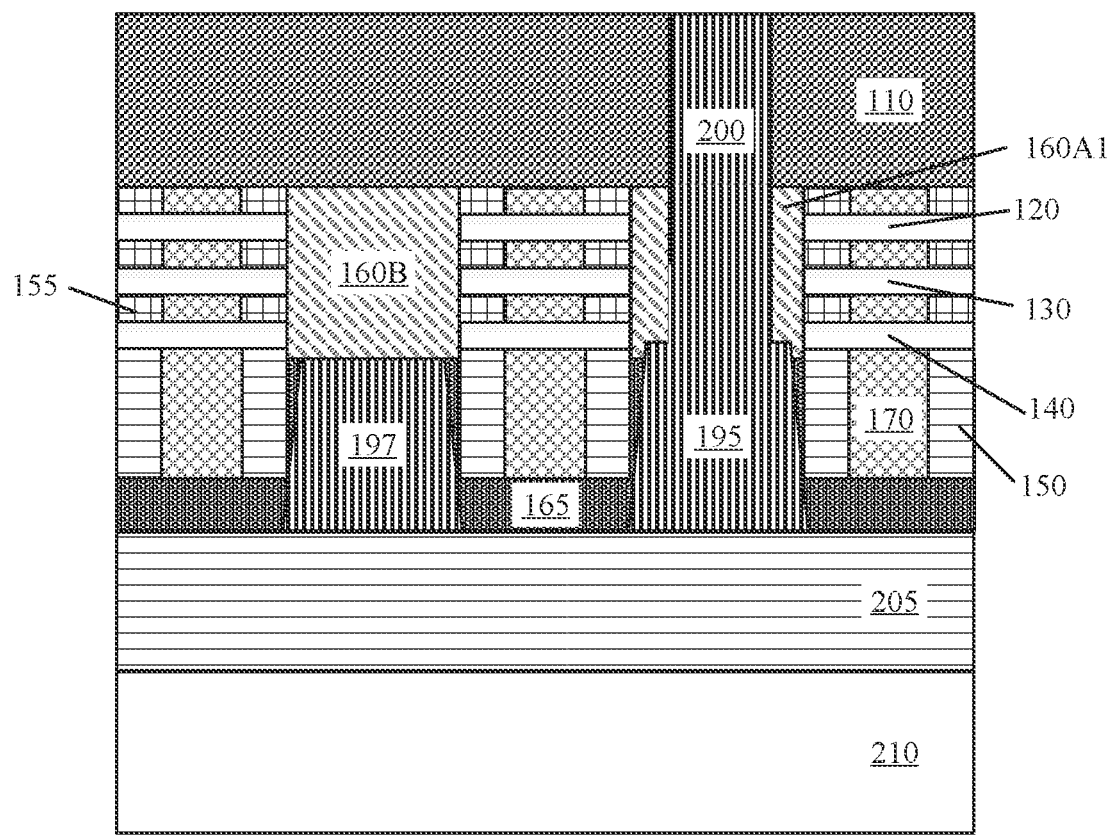
FIGS. 27-29 illustrate cross sections $X_1$, $X_2$, and Y, respectively, of the plurality of nanodevices after the carrier wafer is flipped and the substrate is removed, in accordance with the embodiment of the present invention.
Figure 28:
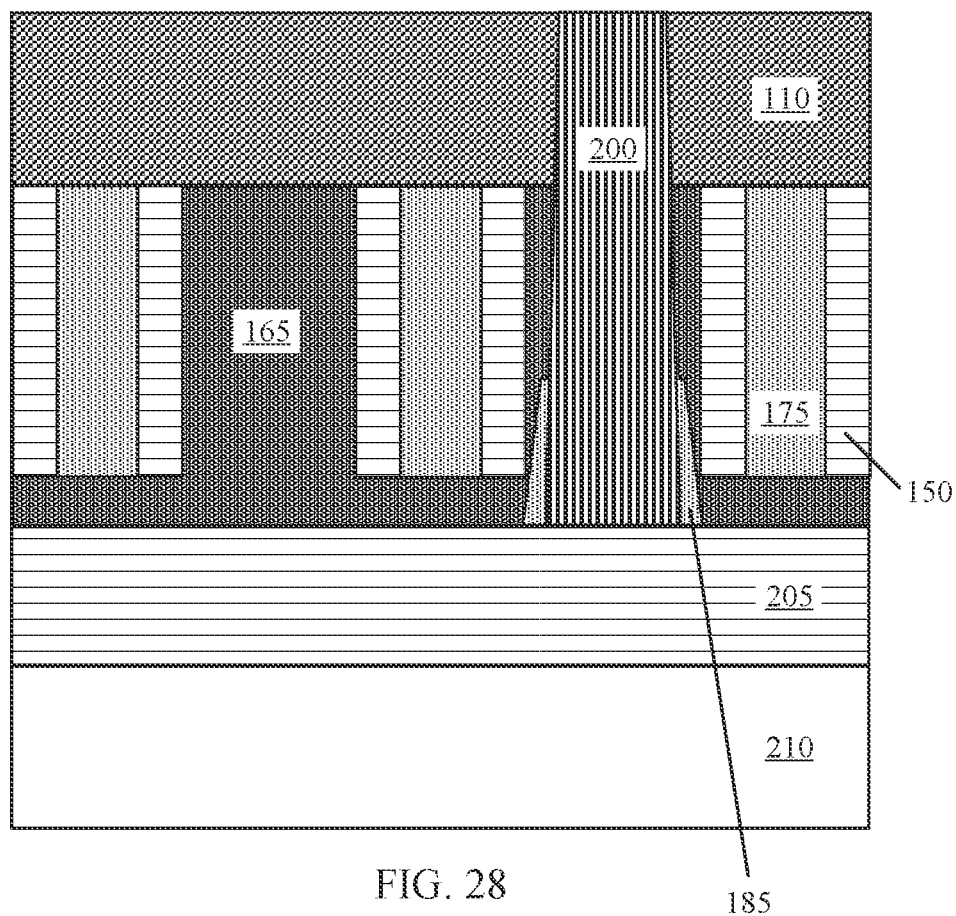
Figure 29:
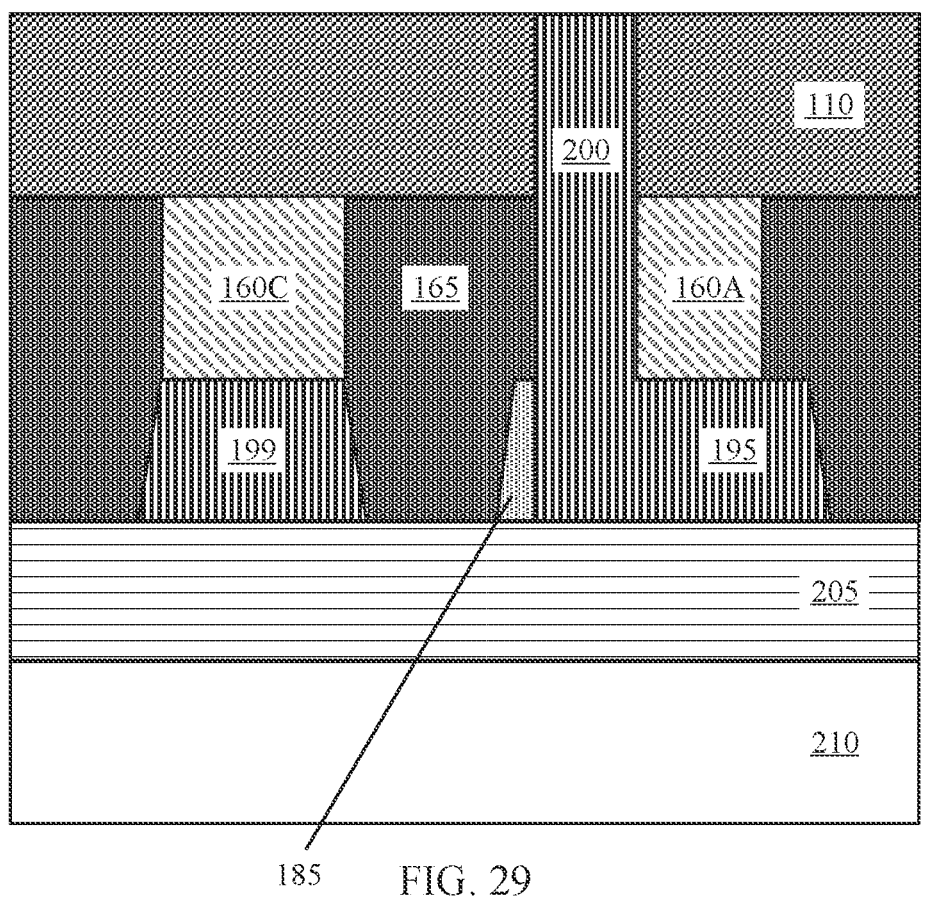

FIGS. 2-26 illustrate the processing of the frontside of the substrate 105, while FIGS. 27-32 illustrate the processing of the backside of the substrate 105. FIGS. 27-29 illustrate cross sections X$_1$, X$_2$, and Y, respectively, of the plurality of nanodevices ND1, ND2 after the carrier wafer 210 is flipped and the substrate 105 is removed, in accordance with the embodiment of the present invention. The carrier wafer 210 is flipped and the carrier wafer 210 becomes a handler wafer. Then, the substrate 105 is removed by, for example, a combination of processes such as wafer grinding, chemical-mechanical processing (CMP), selective dry/wet etch, stopping on the buried oxide layer 110 and VBPR 200.

Figure 30:
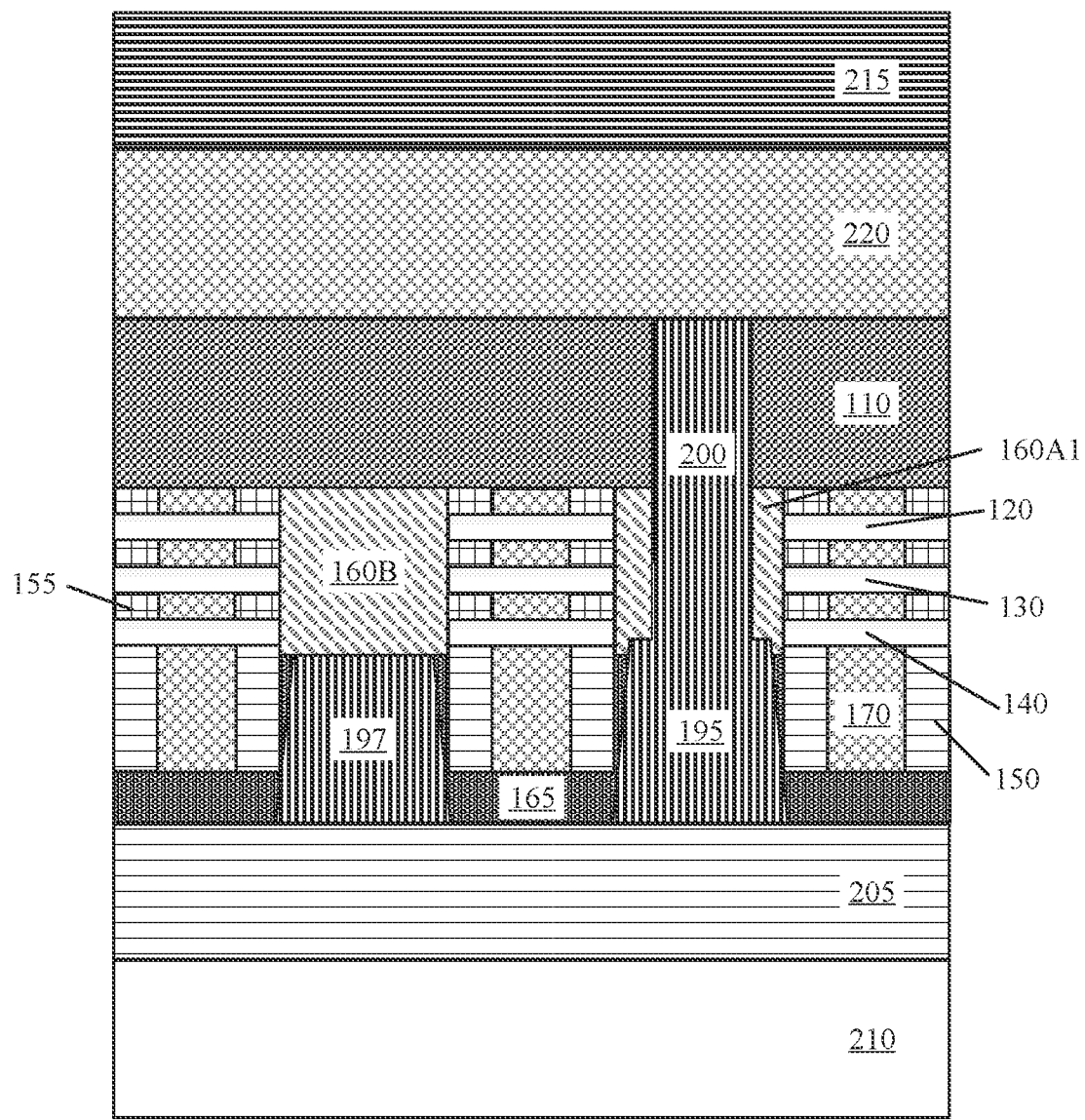
FIGS. 30-32 illustrate cross sections $X_1$, $X_2$, and Y, respectively, of the plurality of nanodevices after the formation of a backside power rail (BPR) and a backside power distribution network (BSPDN), in accordance with the embodiment of the present invention.
Figure 31:
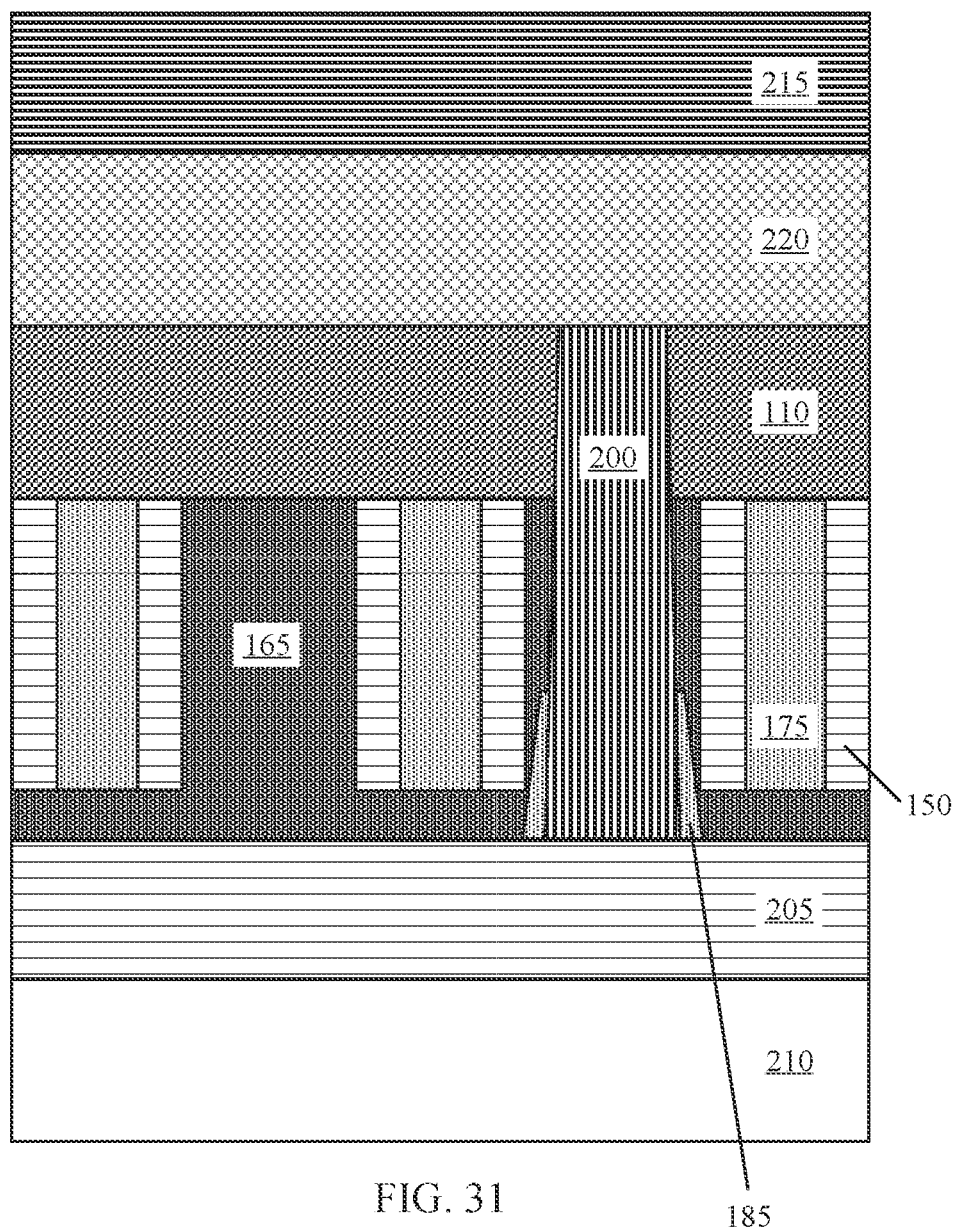
Figure 32:
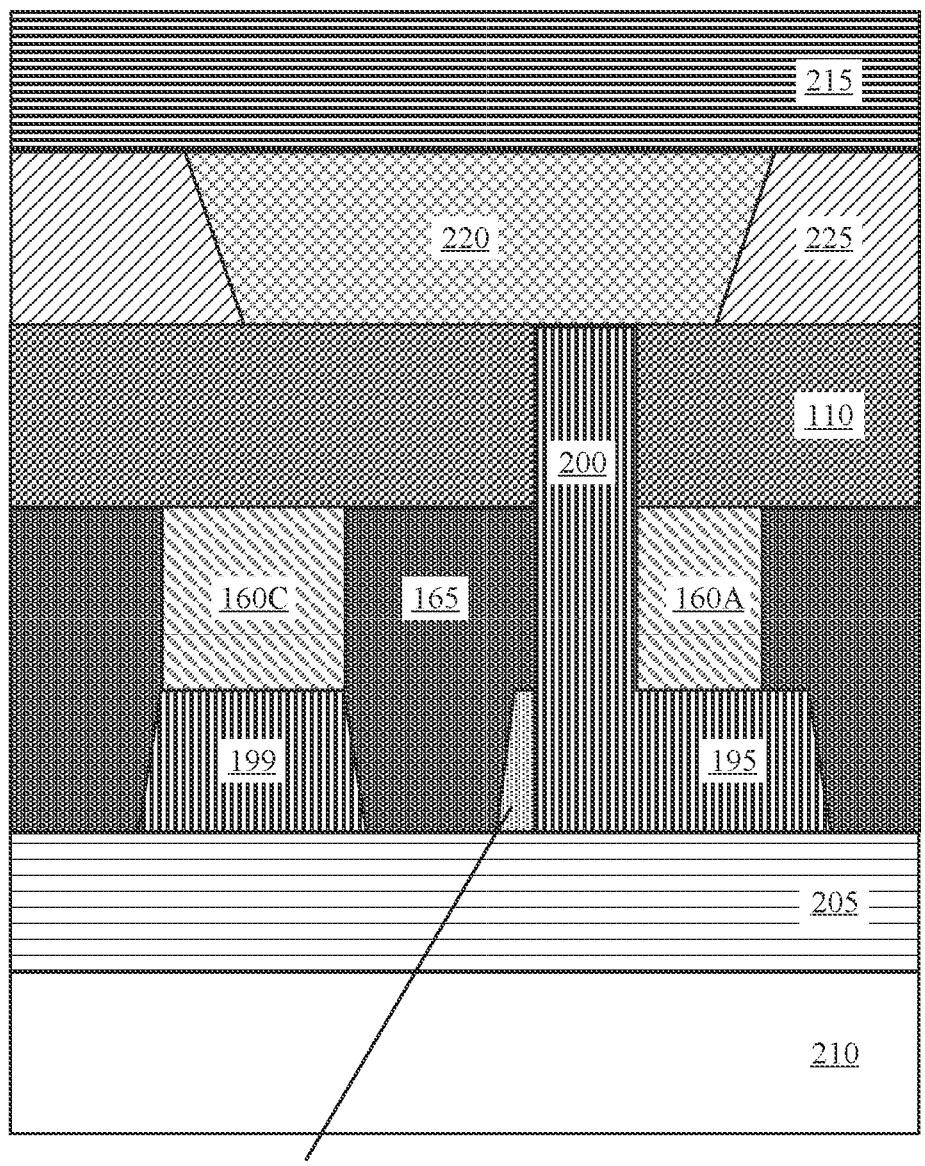

FIGS. 30-32 illustrate cross sections X$_1$, X$_2$, and Y, respectively, of the plurality of nanodevices ND1, ND2 after the formation of a backside power rail (BPR) 220 and a backside power distribution network (BSPDN) 215, in accordance with the embodiment of the present invention. A backside ILD (BILD) layer 225 is deposited over the buried oxide layer 110 and the VBPR 200. Then, the BPR 220 is patterned using conventional lithography and etching processes, followed by metallization (e.g., Cu, Co or Ru fill with adhesion liner such as TiN). The BPR 220 is formed directly atop the buried oxide layer 110 and the VBPR 200. Then, the BSPDN 215 is formed directly atop the BPR 220 and the BILD 225. In FIGS. 30-32, a top surface of the VBPR 200 is connected to the BPR 220 (i.e., the surface of the VBPR 200 that extends towards the backside of the substrate 105). The bottom surface of the BPR 220 is larger than a top surface of the VBPR 200. In FIG. 30, the ILD 165 is located around the first source/drain contact 195 such that the ILD 165 is in contact with two side surfaces of the first portion of the first source/drain contact 195. In FIG. 31, the ILD 165 is in contact with a plurality of side surfaces of the VBPR 200. The trench liner 185 is located around the first source/drain contact 195 such that the trench liner 185 is in contact with a plurality of second side surfaces of the VBPR 200. In FIG. 32, the trench liner 185 is in contact with a second side surface of the first portion of the first source/drain contact 195. The first portion of the first source/drain contact 195 and the VBPR 200 have an "L-shape", such that the first source drain 160A is located in a seat of the "L."

Figure 33:
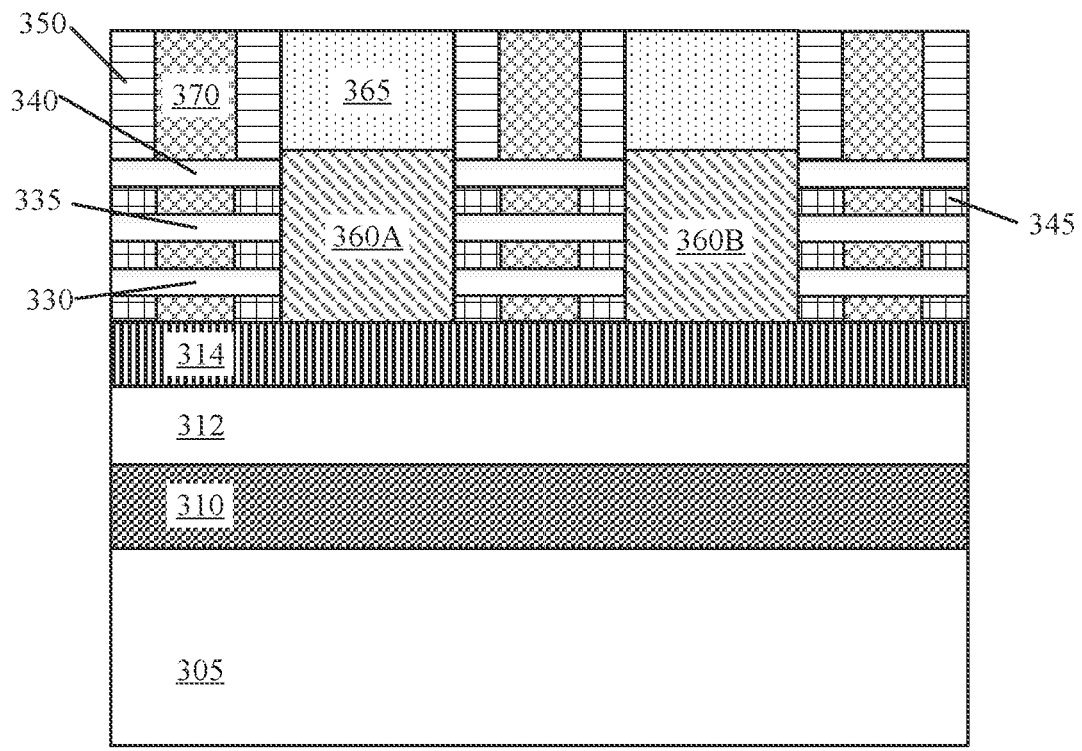
FIGS. 33-35 illustrate cross sections $X_1$, $X_2$, and Y, respectively, of the plurality of nanodevices after the formation of a shallow trench isolation (STI) region and a bottom dielectric isolation (BDI) layer, in accordance with the embodiment of the present invention.
Figure 34:
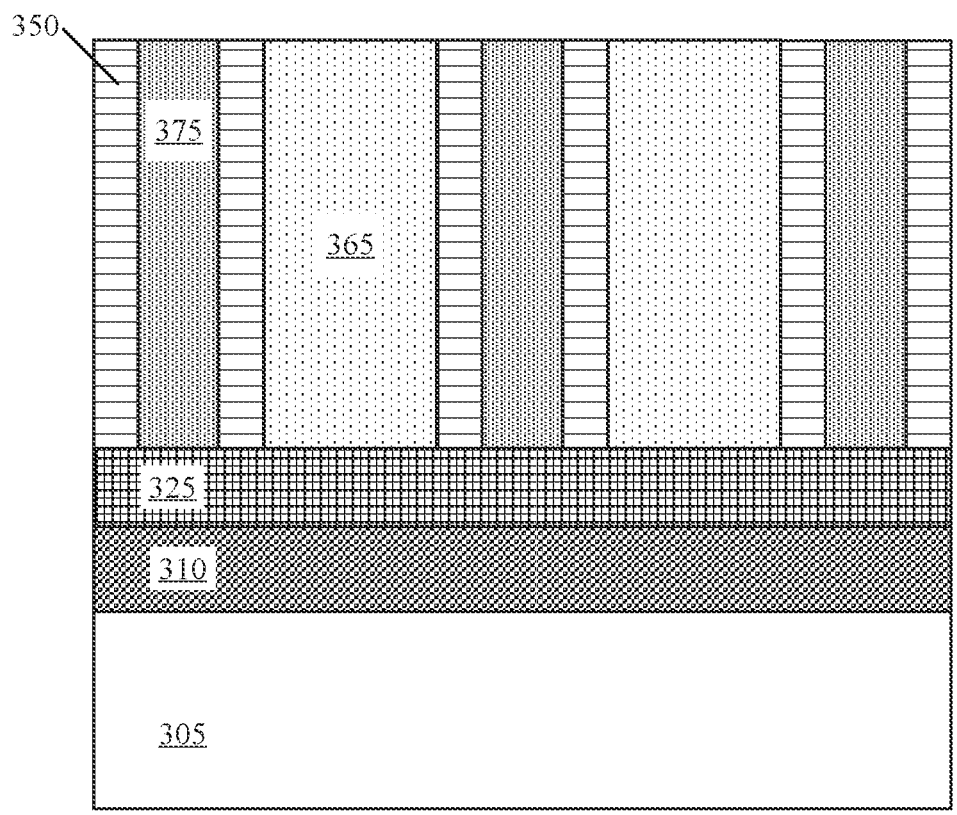
Figure 35:
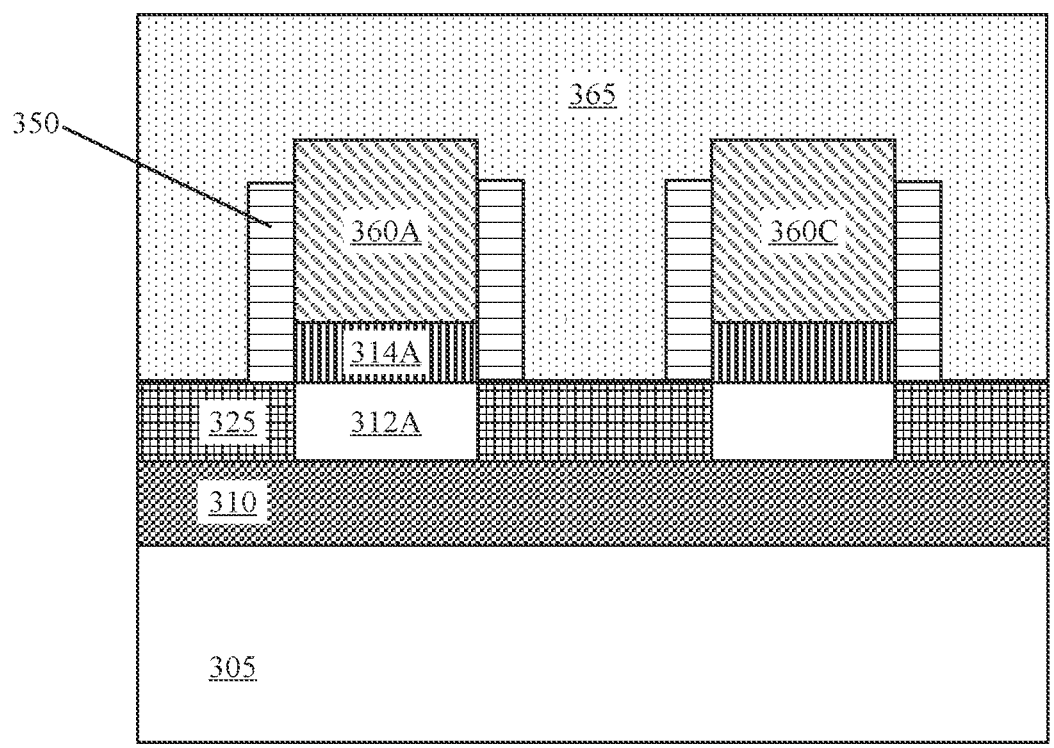

FIGS. 33-35 illustrate cross sections X$_1$, X$_2$, and Y, respectively, of the plurality of nanodevices ND1, ND2 after the formation of a shallow trench isolation (STI) region 325 and a bottom dielectric isolation (BDI) layer 314, in accordance with the embodiment of the present invention. In FIG. 33, the nanosheets 330, 335, 340 are formed over an initial substrate. The initial substrate comprises a second Si layer 312 formed over an etch stop layer 310, which is formed over the substrate 305. If the starting wafer is a silicon-on-insulator (SOI) wafer, the etch stop layer 310 is the buried oxide (BOX) layer (e.g., BOX layer 110). If the starting wafer is a bulk Si substrate, then the etch stop layer 310 may be an epitaxial SiGe layer over the substrate 305, and the second Si layer 312 further epitaxially grows over the SiGe layer. After nanosheet stack (comprising alternative Si and SiGe layers over a bottom most high Ge% SiGe layer) formation and patterning, the STI region 325 is formed. The bottom most high Ge % SiGe layer is selectively removed, followed by gate spacer 350 and BDI layer 314 formation by a conformal dielectric liner deposition followed by anisotropic etch. Then, the nanosheet stack at the S/D region is recessed, followed by indentation of sacrificial SiGe and inner spacer 345 formation. Then, the first source/drain 360A, the second source/drain 360B, and the third source/drain 360C are epitaxially grown over exposed sidewalls of the nanosheets 330, 335 and 340, followed by ILD 365 deposition and CMP. Then the dummy gate and sacrificial SiGe are removed, followed by gate 370 formation.

In FIG. 34, a portion of the gate 370 is being cut and filled with the dielectric pillar 375 to form the gate cut region.

In FIG. 35, the BDI layer 314A is located directly atop the exposed portion of the second Si layer 312A and between two gate spacers 350. The two gate spacers 350 and the BDI layer 314A form a contiguous unitary structure made of the same or a different dielectric material. The first source/drain 360A and the third source/drain 360C are surrounded on three sides by the contiguous unitary structure.

Figure 36:
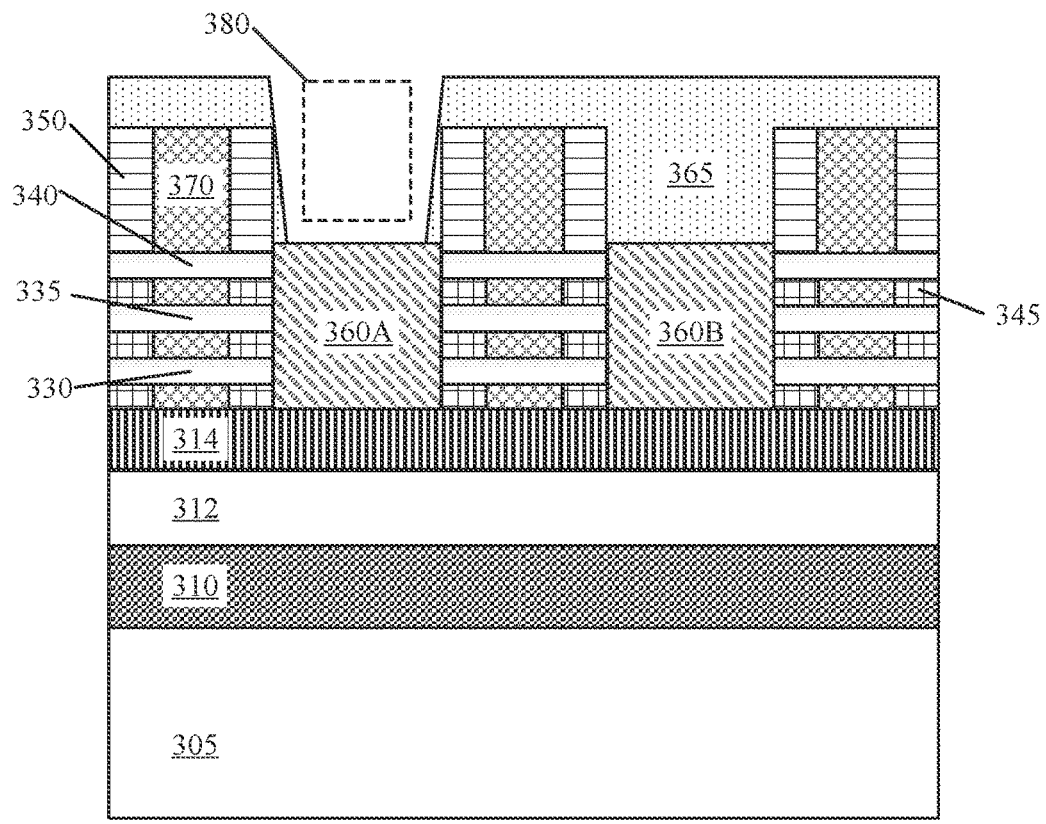
FIGS. 36-38 illustrate cross sections $X_1$, $X_2$, and Y, respectively, of the plurality of nanodevices after the formation of the first trench, in accordance with the embodiment of the present invention.
Figure 37:
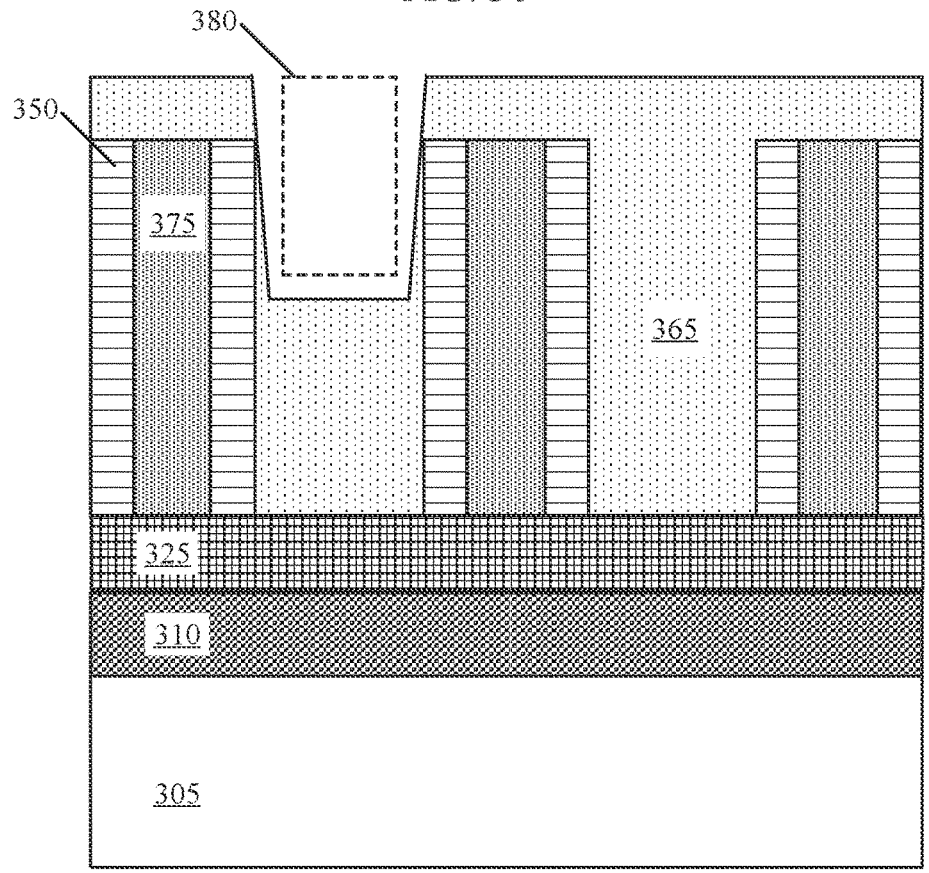
Figure 38:
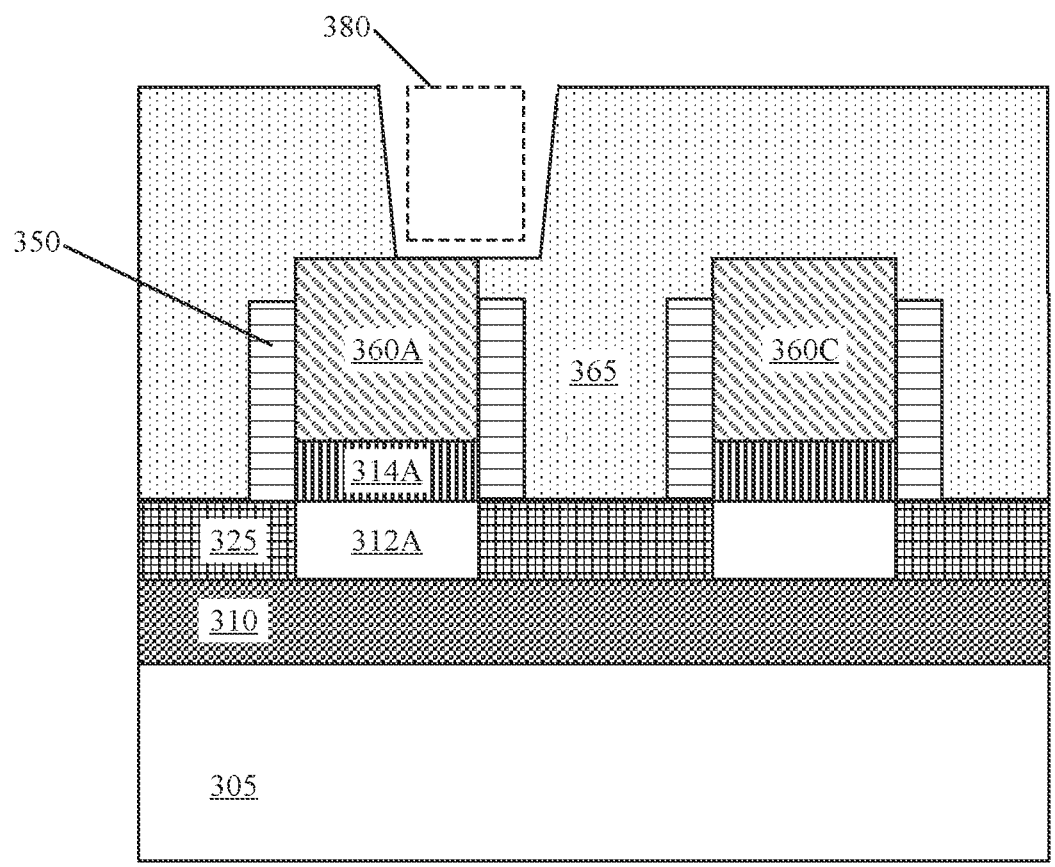

FIGS. 36-38 illustrate cross sections X$_1$, X$_2$, and Y, respectively, of the plurality of nanodevices ND1, ND2 after the formation of the first trench 380, in accordance with the embodiment of the present invention. In FIG. 36, a portion of the ILD 365 is etched by, for example, reactive ion etch (RIE) to form the first trench 380. The bottom surface of the first trench 380 exposes a portion of a top surface of the first source/drain 360A. In FIG. 37, the bottom surface of the first trench 380 is comprised of a surface of the ILD 365. The first trench 380 is located adjacent to and between two upper spacers 350. A portion of the top surface of the first source/drain 360A is not exposed by the first trench 380. In FIG. 38, the bottom surface of the first trench 380 exposes a portion of the first source drain 360A and is comprised of a surface of the ILD 365.

Figure 39:
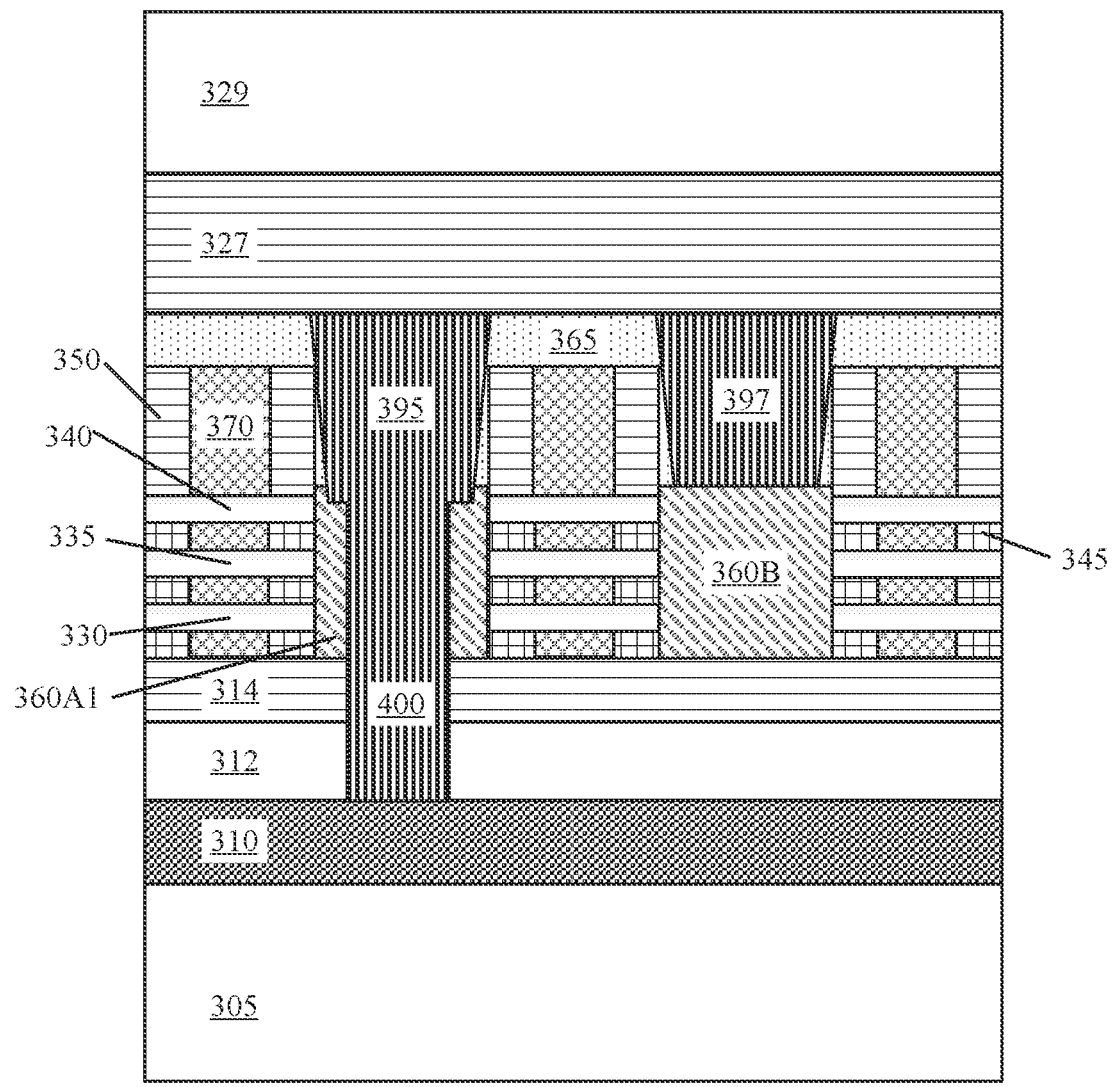
FIGS. 39-41 illustrate cross sections $X_1$, $X_2$, and Y, respectively, of the plurality of nanodevices after the formation of the BEOL layer and bonding to the carrier wafer, in accordance with the embodiment of the present invention.
Figure 40:
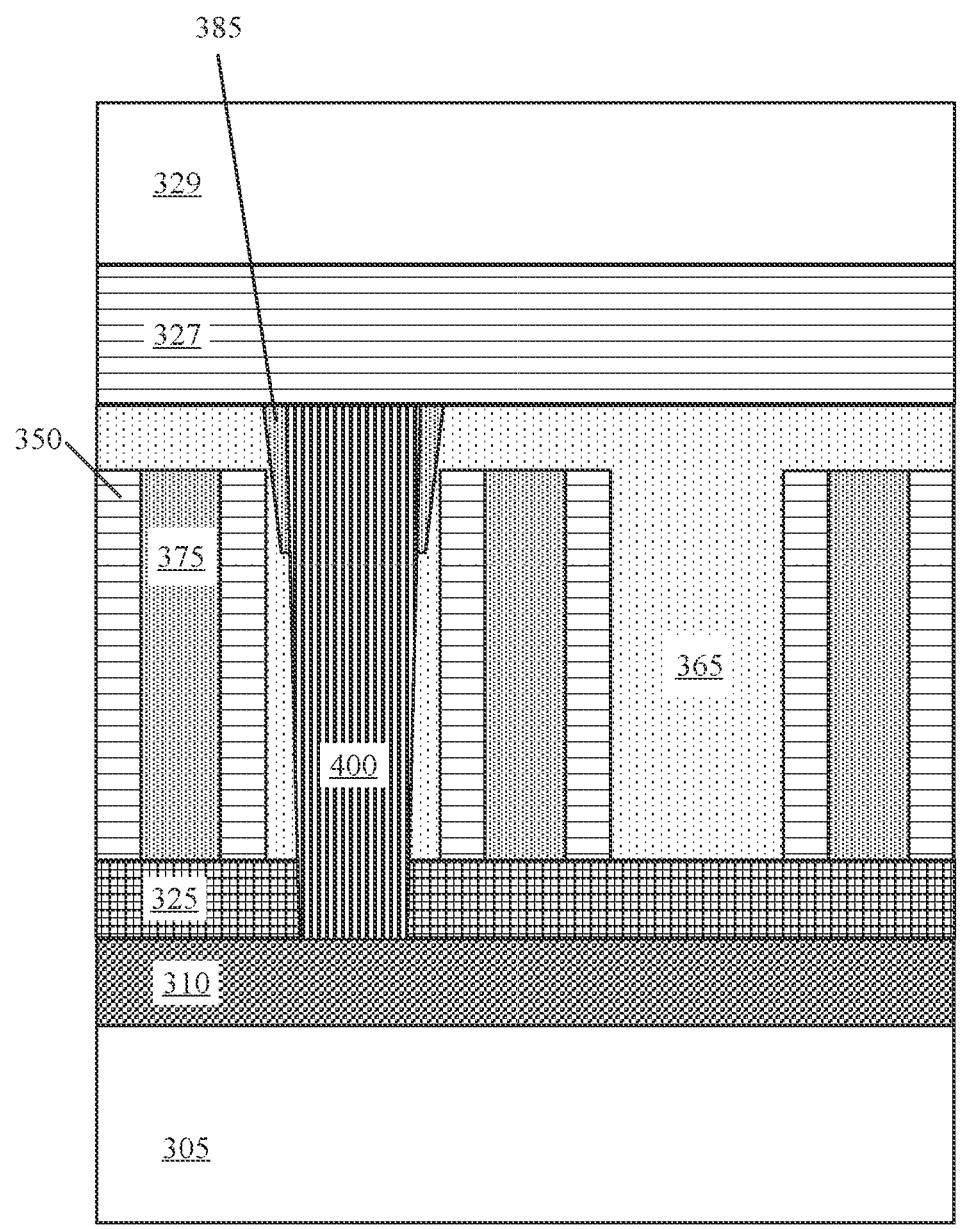
Figure 41:
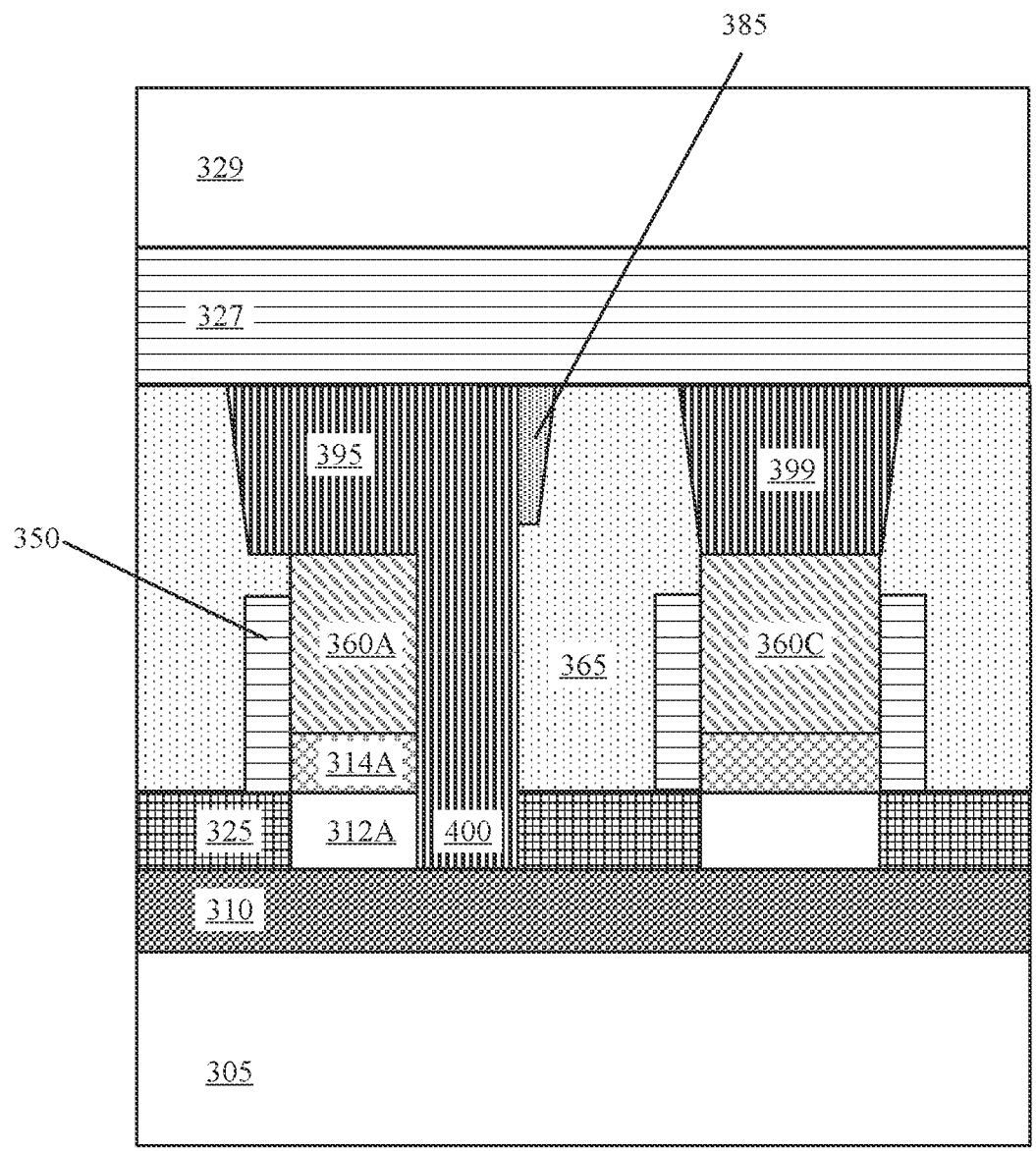

FIGS. 39-41 illustrate cross sections X$_1$, X$_2$, and Y, respectively, of the plurality of nanodevices ND1, ND2 after the formation of the BEOL layer 327 and bonding to the carrier wafer 329, in accordance with the embodiment of the present invention. The contacts 395, 397, 399 for the source/drains 360A, 360B, 360C are formed as described above in FIGS. 21-23. In FIG. 39, the first portion of the first source/drain contact 395 is located directly over the remaining first source/drain 360A1 and a bottom surface of the first portion of the first source/drain contact 395 is in contact with the remaining first source/drain 360A1. In FIGS. 39-41, the VBPR 400 is the downwards extending via of the first source/drain contact 395 extending vertically past the remaining first source/drain 360A1. A bottom surface of the VBPR 400 is in contact with a top surface of the etch stop layer 310. In FIG. 39, a portion of the sidewalls of the VBPR 400 is in contact with the second Si layer 312, the BDI layer 314, or the remaining first source/drain 360A1, respectively. In FIG. 40, a portion of the sidewalls of the VBPR 400 is in contact with the STI region 325, the ILD 365, or the trench liner 385, respectively. In FIG. 41, a portion of the sidewalls of the VBPR 400 is in contact with the remaining second Si layer 312A and the STI region 325, the BDI layer 314 and the ILD 365, the first source/drain 360A and the ILD 365, or the first source/drain contact 395 and a portion of the trench liner 385. In FIG. 39, a section of the VBPR 400 is in contact with an interior sidewall of the remaining first source/drain 360A1. Therefore, the remaining first source/drain 360A1 wraps around a portion of the VBPR 400, such that, the remaining first source/drain 360A1 is in in contact with a plurality of sidewalls of the VBPR 400. The second source/drain contact 397 is located directly over the second source/drain 360B and a bottom surface of the second source/drain contact 397 is in contact with a top surface of the second source/drain 360B.

In FIG. 40, the trench liner 385 wraps around the upper section of the VBPR 400 to be connected on three sides.

In FIG. 41, the first source/drain contact 395 is located directly over the first source/drain 360A and a portion of the ILD 365. The bottom surface of the first source/drain contact 395 is in contact with the first source/drain 360A and the ILD 365. The third source/drain contact 399 is located directly over the third source/drain 360C and a bottom surface of the third source/drain contact 399 is in contact with the third source/drain 360C.

In FIG. 39, the BEOL layer 327 is formed directly atop the ILD 365, the first source/drain contact 395, and the second source/drain contact 397. In FIG. 40, the BEOL layer 327 is formed directly atop the ILD 365, the trench liner 385, and the VBPR 400. In FIG. 41, the BEOL layer 327 is formed directly atop the ILD 365, a portion of the trench liner 385, the first source/drain contact 395, the VBPR 400, and the third source/drain contact 399. In FIGS. 39-41, the carrier wafer 329 is formed directly atop the BEOL layer 327 by a conventional wafer bonding process.

FIGS. 33-41 illustrate the processing of the frontside of the substrate 305, while FIGS. 42-57 illustrate the processing of the backside of the substrate 305.

Figure 42:
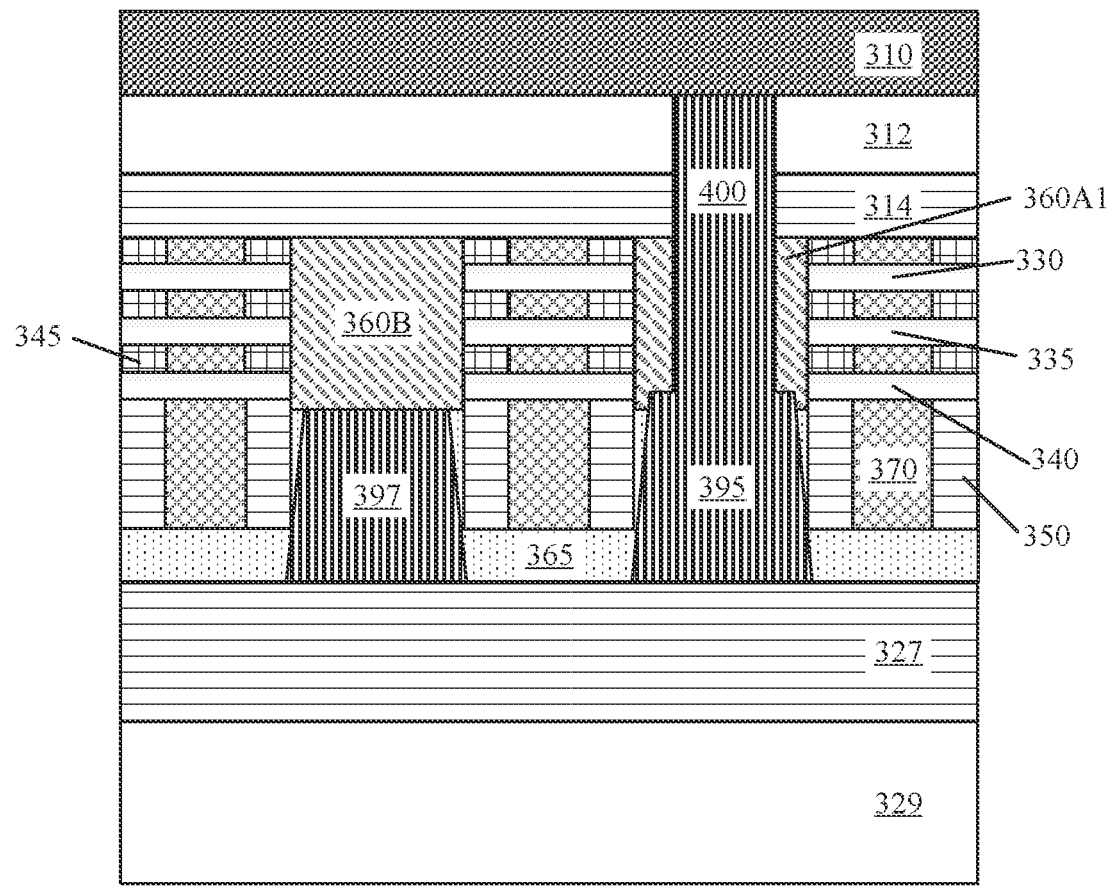
FIGS. 42-44 illustrate cross sections $X_1$, $X_2$, and Y, respectively, of the plurality of nanodevices after the removal of the substrate, in accordance with the embodiment of the present invention.
Figure 43:
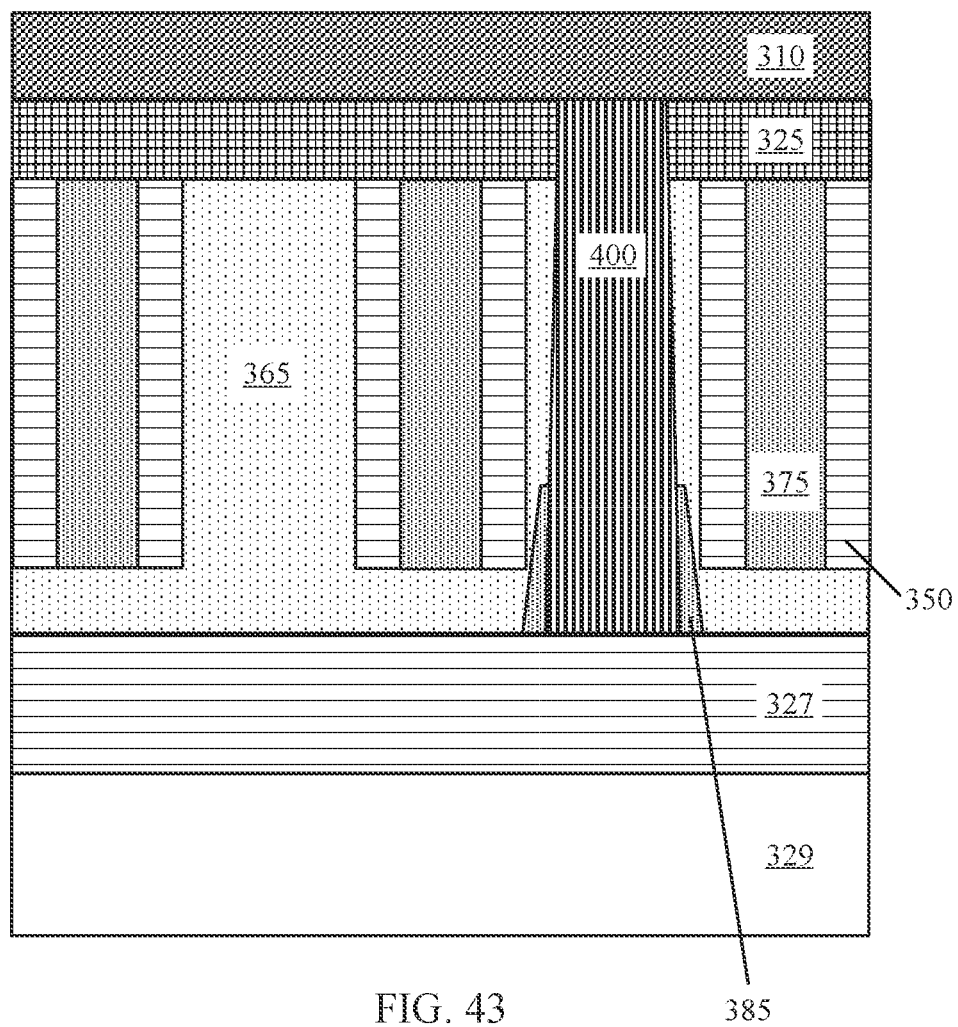
Figure 44:
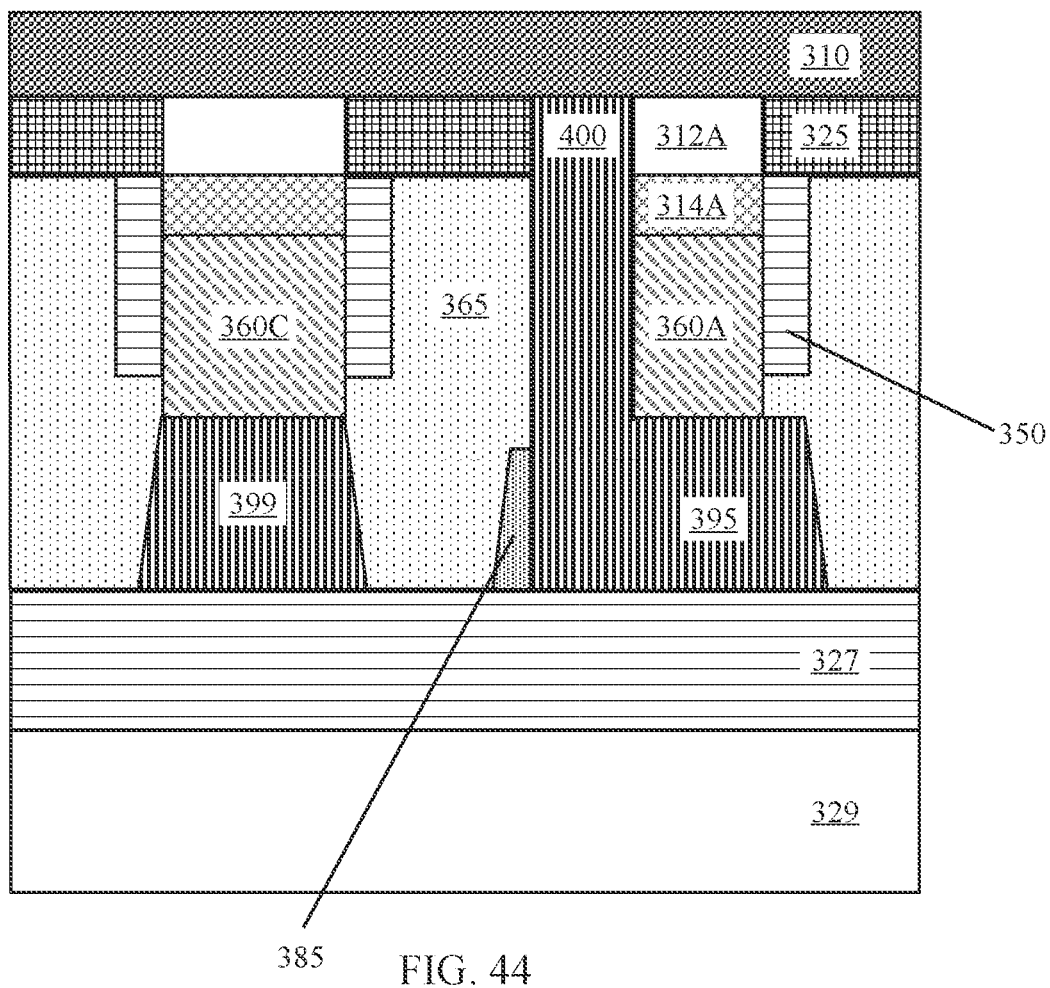

FIGS. 42-44 illustrate cross sections $X_1$, $X_2$, and Y, respectively, of the plurality of nanodevices ND1, ND2 after the removal of the substrate 305, in accordance with the embodiment of the present invention. The carrier wafer 329 is flipped and the substrate 305 is removed by, for example, a combination of wafer grinding, CMP, and selective dry/wet etch, stopping on the etch stop layer 310.

Figure 45:
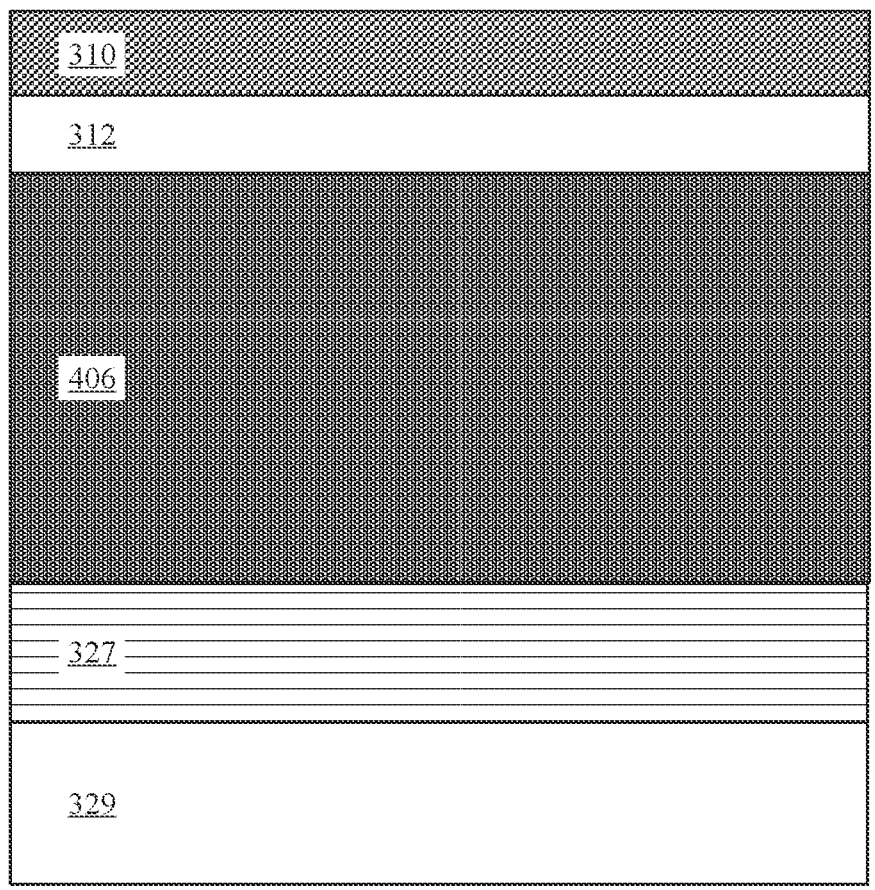
FIG. 45 illustrates a cross section of a different region of the plurality of nanodevices where a device is built over silicon (Si) after the removal of the substrate, in accordance with the embodiment of the present invention.

FIG. 45 illustrates a cross section of a different region (i.e., a region other than the source/drain region and the gate region) of the plurality of nanodevices ND1, ND2 where a device 406 is built over the second Si layer 312, in accordance with the embodiment of the present invention. The BEOL layer 327 is formed directly atop the device 406. The device 406 can be any type of device that is formed over Si. The device 406 may include a passive device such as, for example, an electrostatic discharge (ESD) diode (not shown). The carrier wafer 329 is bonded to the BEOL layer 327. The substrate 305 is removed, stopping on the etch stop layer 310. When the carrier wafer 329 is flipped, the device 406 is located directly atop the BEOL layer 327, and the second Si layer 312 is located directly atop the device 406.

Figure 46:
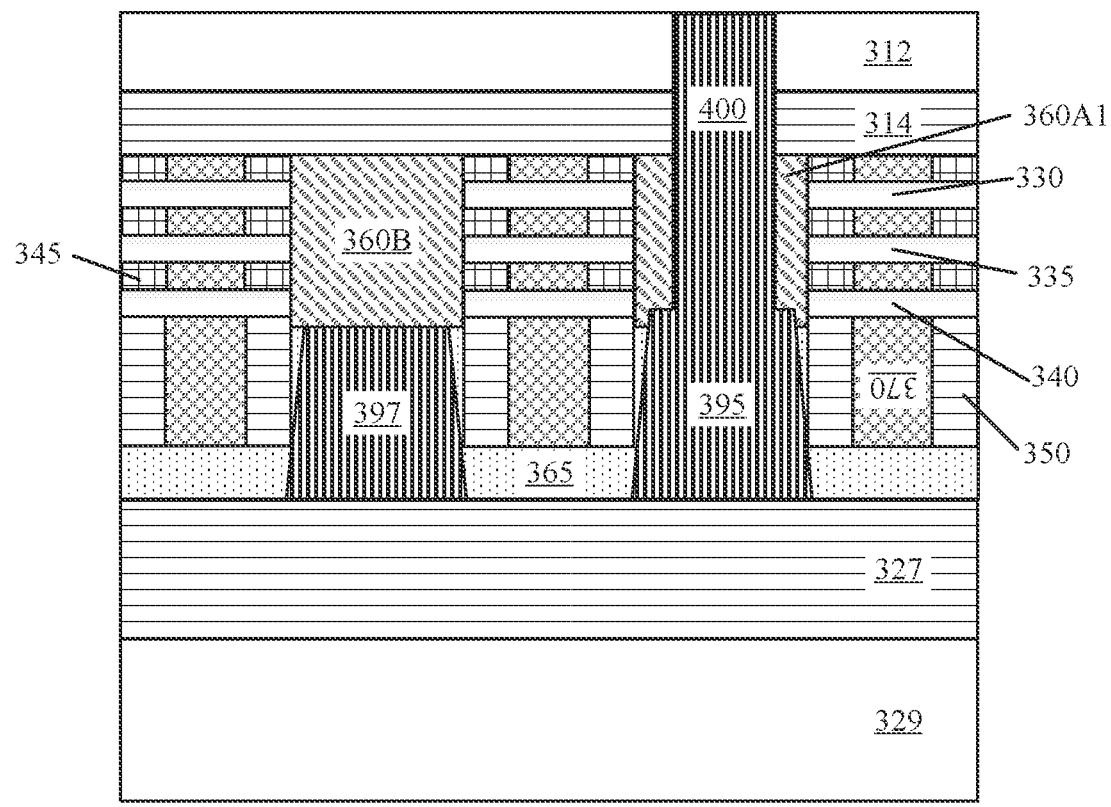
FIGS. 46-48 illustrate cross sections $X_1$, $X_2$, and Y, respectively, of the plurality of nanodevices after the removal of the etch stop layer.
Figure 47:
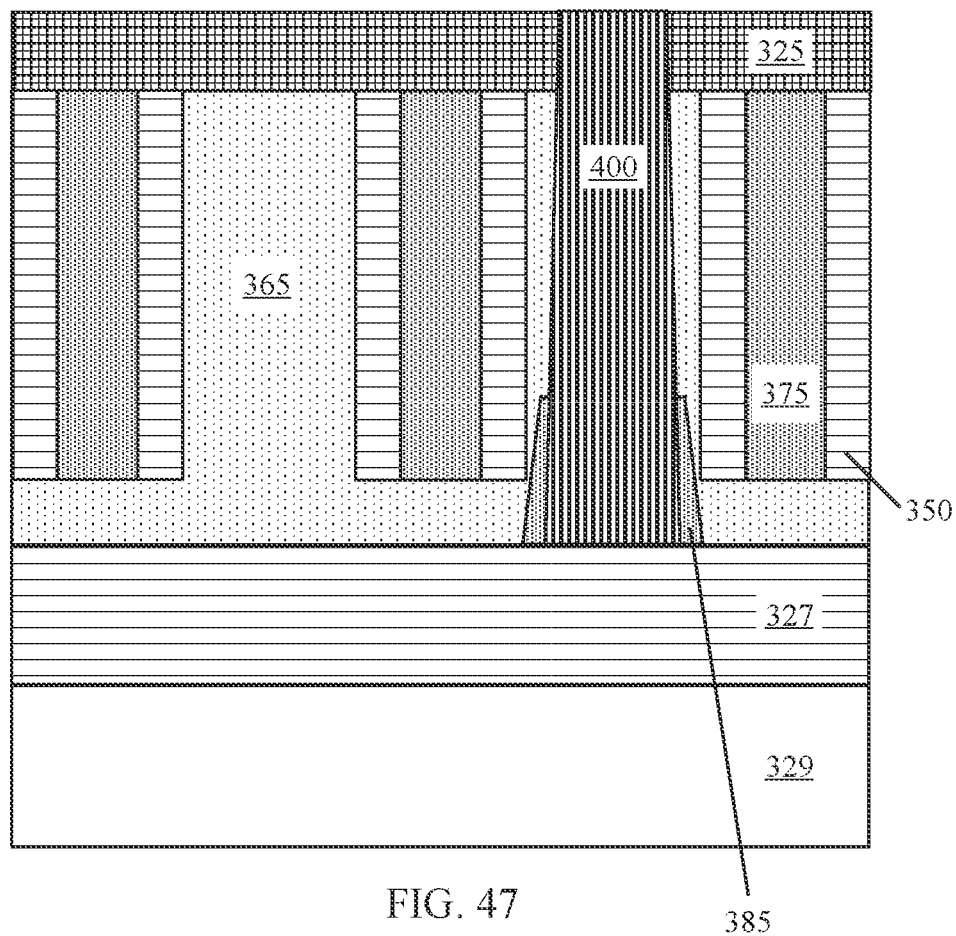
Figure 48:
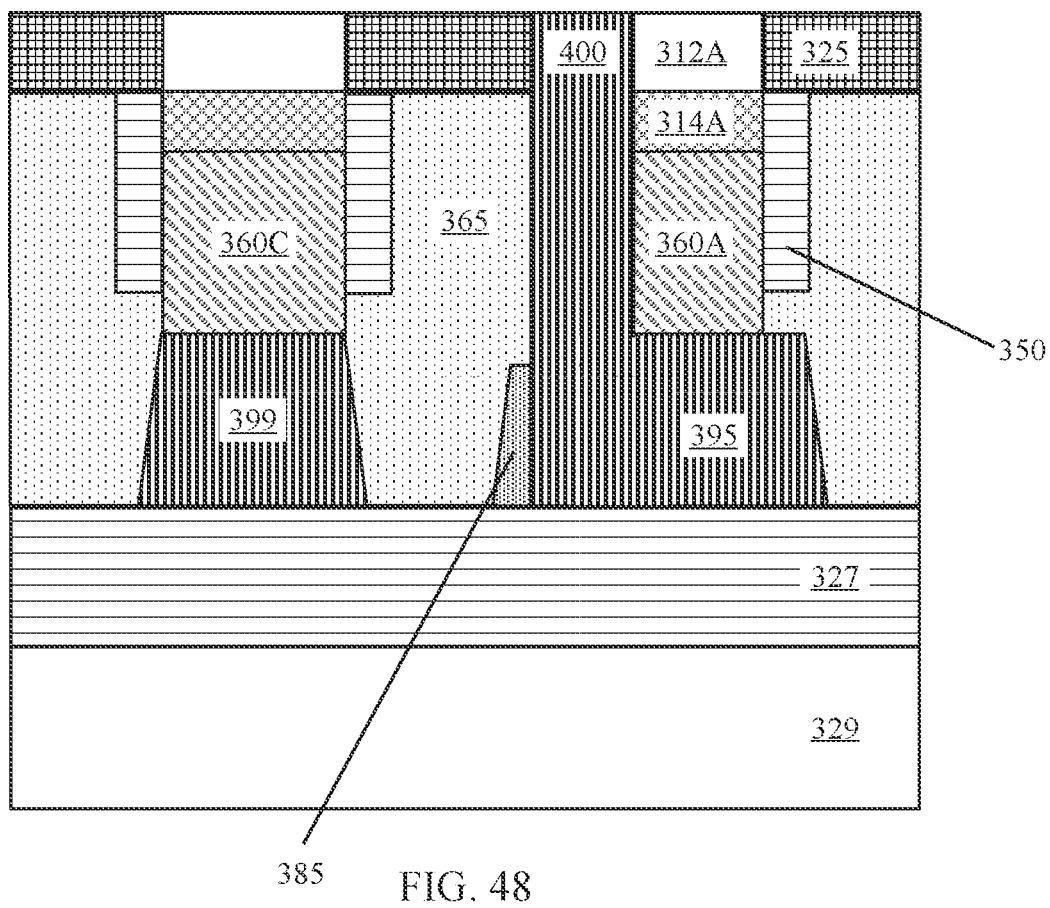

FIGS. 46-48 illustrate cross sections $X_1$, $X_2$, and Y, respectively, of the plurality of nanodevices ND1, ND2 after the removal of the etch stop layer 310. The etch stop layer 310 is removed by, for example, a selective wet or dry etch. In FIG. 46, a surface of the VBPR 400 (i.e., the surface of the VBPR 400 that extends towards the backside of the substrate 305) is in contact with a top surface of the second Si layer 312. In FIG. 47, the surface of the VBPR 400 is in contact with a top surface of the STI layer 325. In FIG. 48, the surface of the VBPR 400 is in contact with a top surface of the STI layer 325 and the remaining second Si layer 312A.

Figure 49:
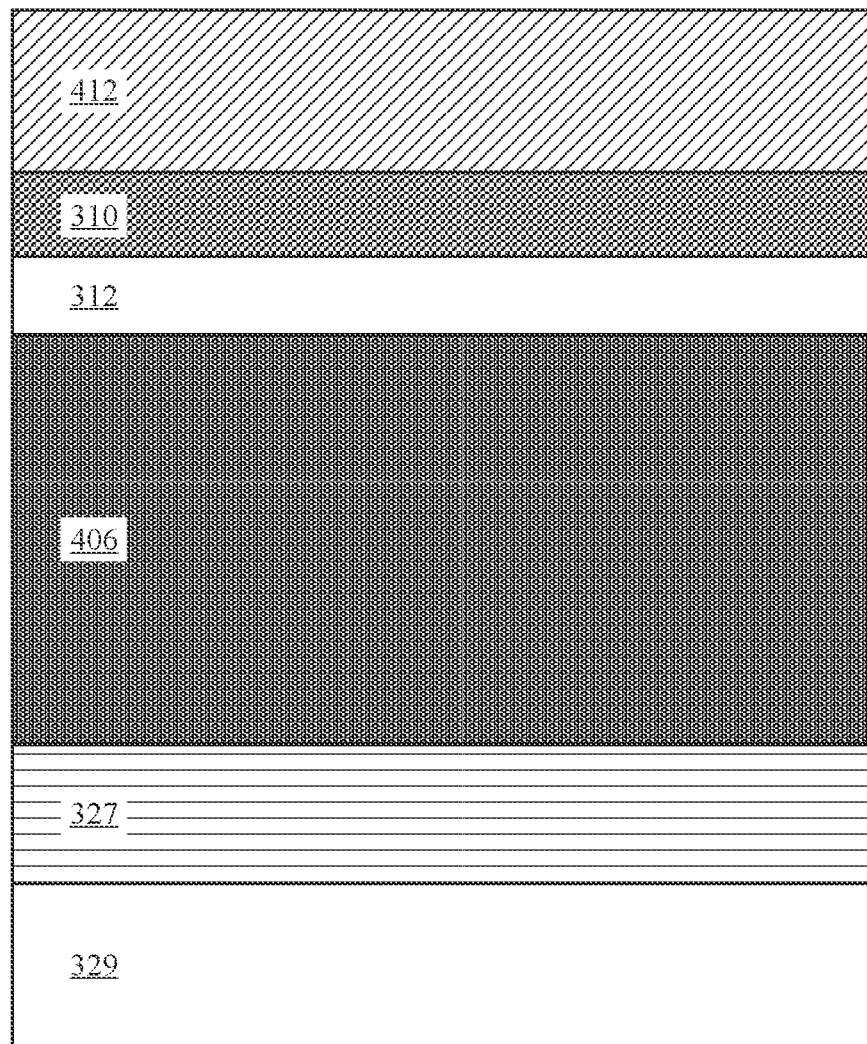
FIG. 49 illustrates the cross section of the different region of the plurality of nanodevices where the device is built over Si after the removal of the buried oxide layer in the logic region, in accordance with the embodiment of the present invention.

FIG. 49 illustrates the cross section of the different region of the plurality of nanodevices ND1, ND2 where the device 406 is built over the second Si layer 312, where a lithography mask layer 412 is patterned to protect the etch stop layer 310 from being removed during the process described in FIGS. 46-48 above.

Figure 50:
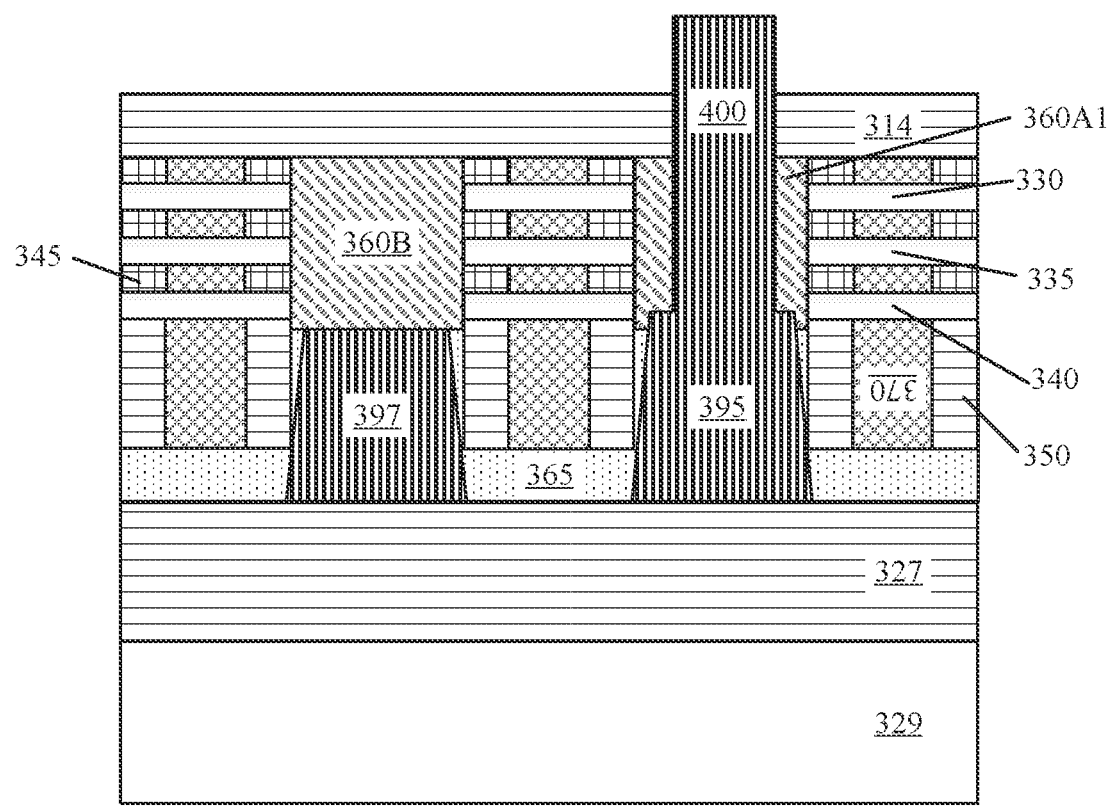
FIGS. 50-52 illustrate cross sections $X_1$, $X_2$, and Y, respectively, of the plurality of nanodevices after the removal of the second Si layer.
Figure 51:
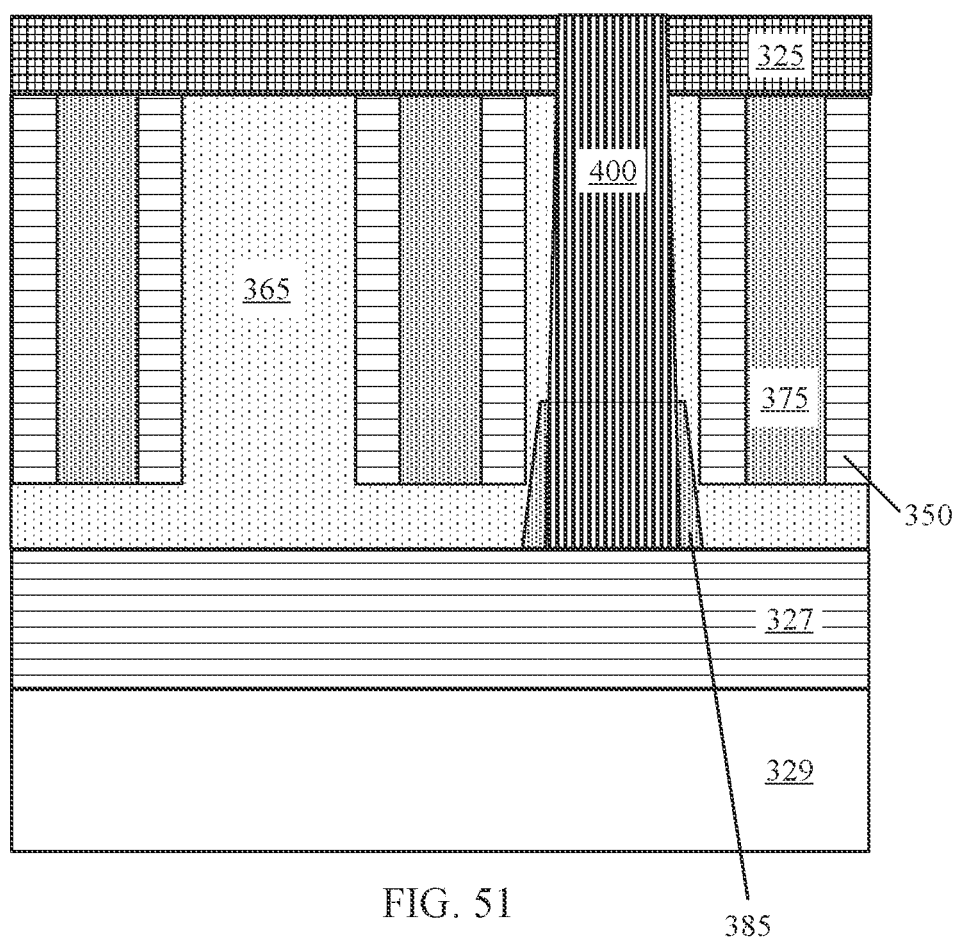
Figure 52:
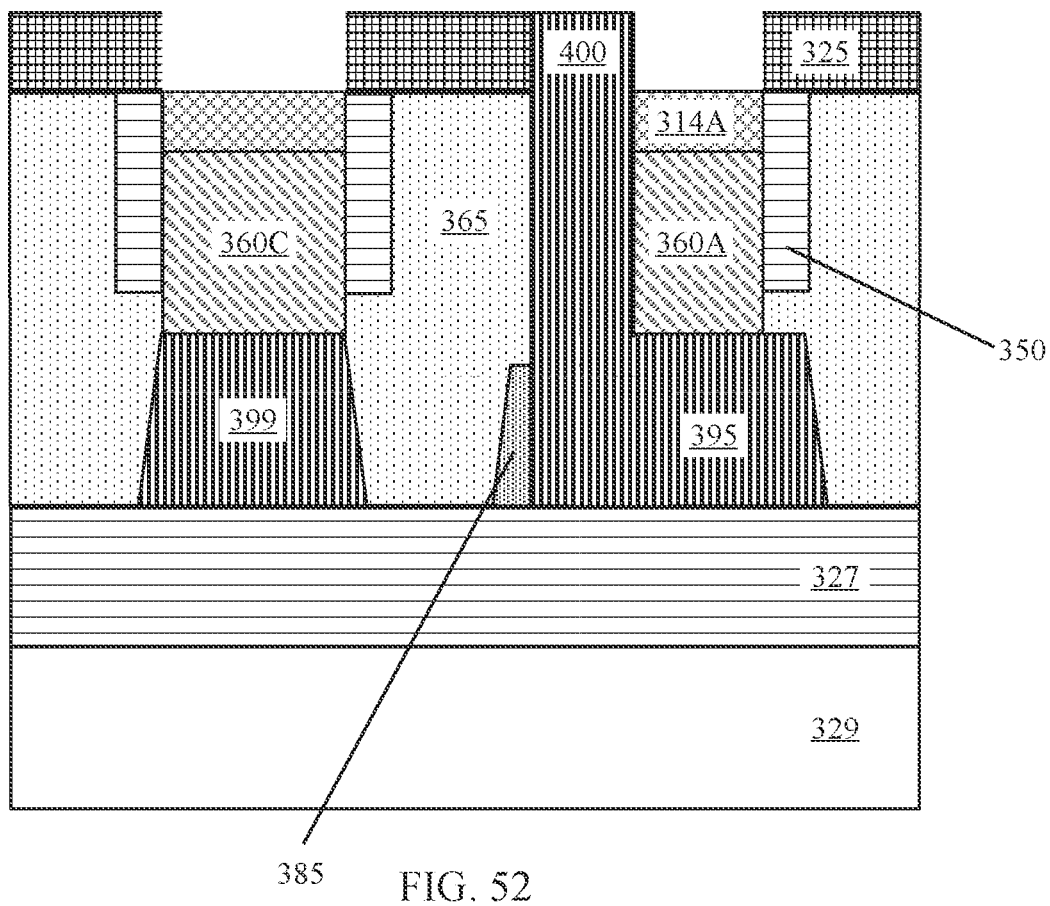

FIGS. 50-52 illustrate cross sections $X_1$, $X_2$, and Y, respectively, of the plurality of nanodevices ND1, ND2 after the removal of the second Si layer 312. The second Si layer 312 is removed by, for example, a selective wet or dry etch process. In FIG. 50, the surface of the VBPR 400 is no longer in contact with the top surface of the second Si layer 312. In FIG. 52, the surface of the VBPR 400 is no longer in contact with the top surface of the remaining second Si layer 312A.

Figure 53:
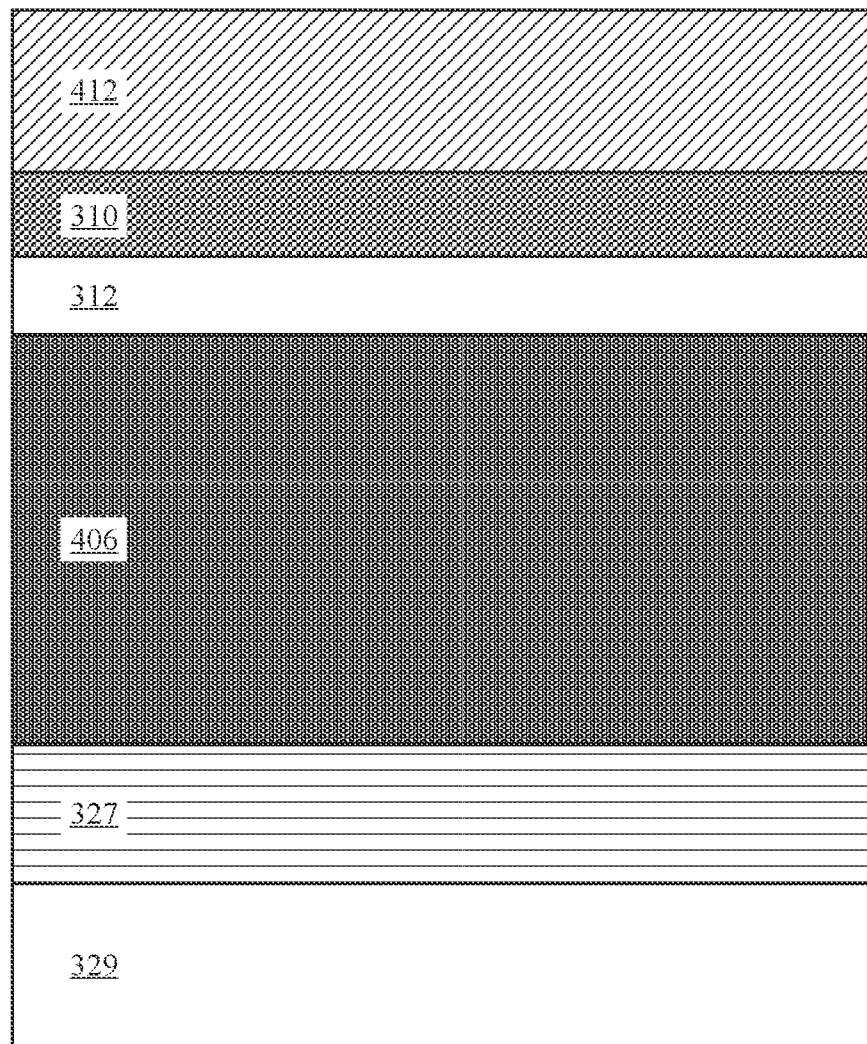
FIG. 53 illustrates the cross section of the different region of the plurality of nanodevices where the device is built over Si after the removal of the second Si layer and the remaining second Si layer in the logic region, in accordance with the embodiment of the present invention.

FIG. 53 illustrates the cross section of the different region of the plurality of nanodevices ND1, ND2 where the device 406 is built over the second Si layer 312. Due to the presence of the lithography mask layer 412, the second Si layer 312 is preserved for the devices 406 (e.g., the ESD diode).

Figure 54:
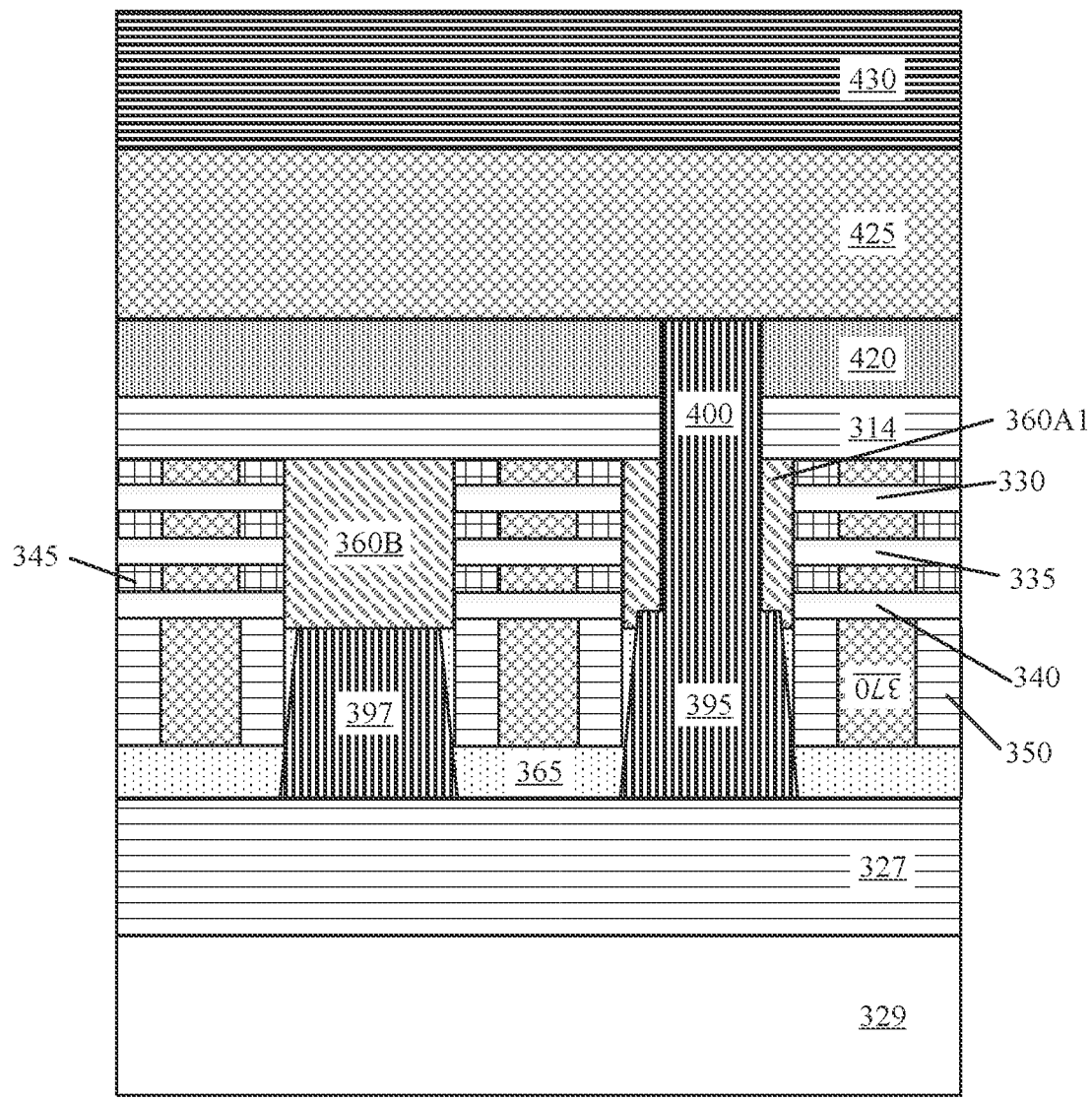
FIGS. 54-56 illustrate cross sections $X_1$, $X_2$, and Y, respectively, of the plurality of nanodevices after the formation of the BPR and the BSPDN.
Figure 55:
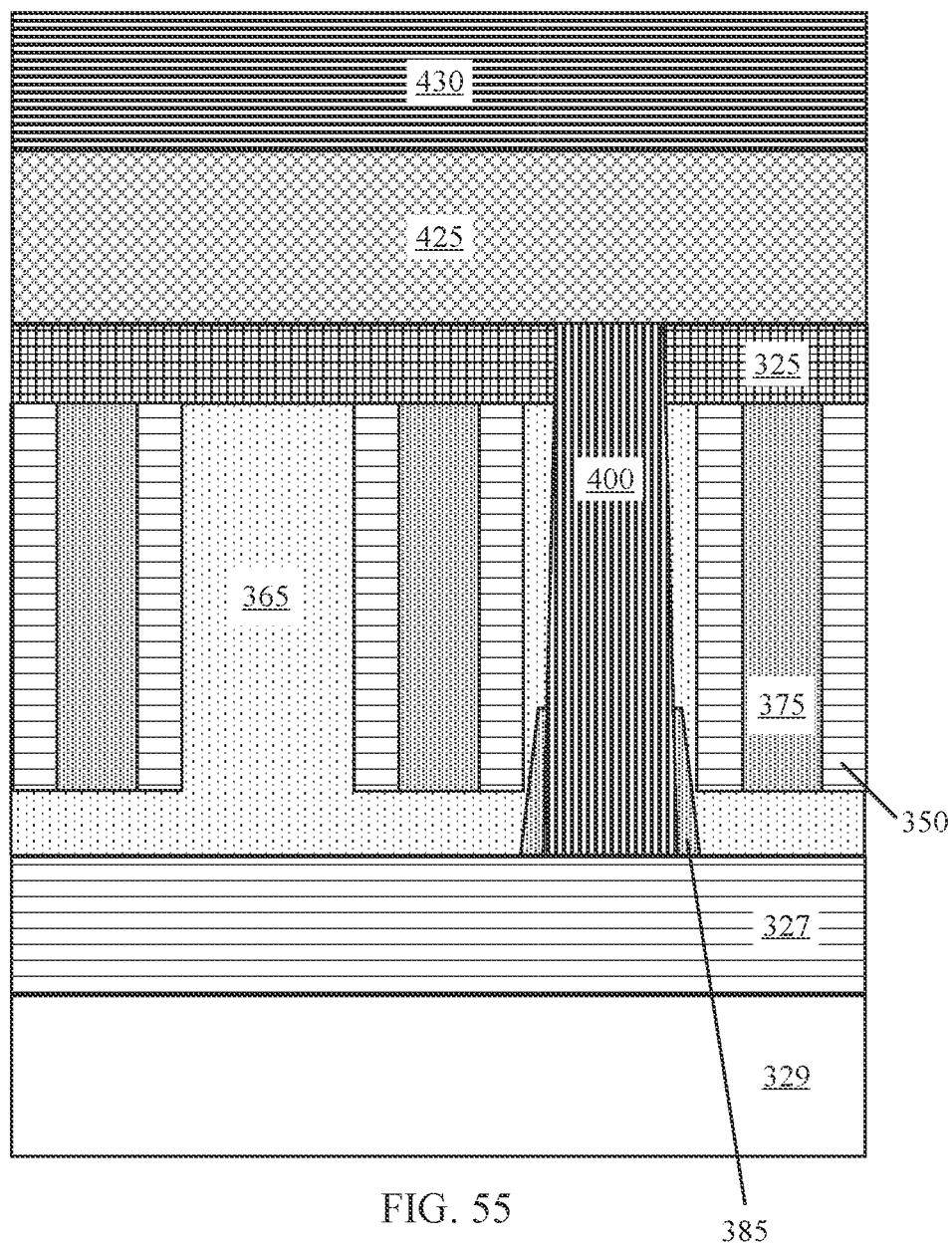
Figure 56:
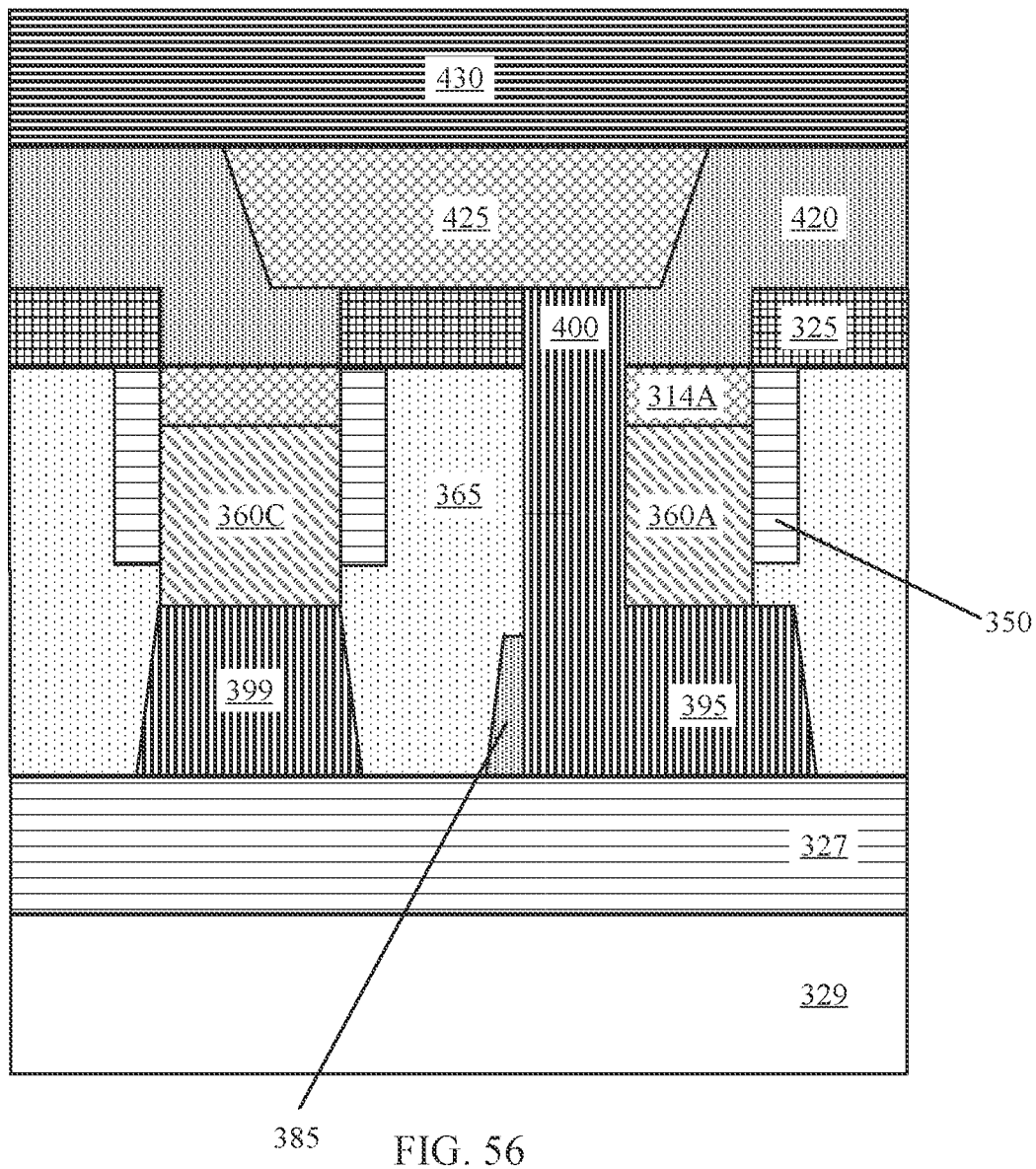

FIGS. 54-56 illustrate cross sections $X_1$, $X_2$, and Y, respectively, of the plurality of nanodevices ND1, ND2 after the formation of the BPR 425 and the BSPDN 430. In FIG. 54, a dielectric material is deposited in the space created by the removal of the second Si layer 312 to form the BILD 420. The BPR 425 is formed within the BILD 420 using conventional patterning and metallization processes. The BSPDN 430 is formed directly atop the BILD 420 and the BPR 425. In FIG. 56, the trench liner 385 is in contact with a second side surface of the first portion of the first source/drain contact 395. The first portion of the first source/drain contact 395 and the VBPR 400 have an "L-shape", such that the first source drain 360A is located in a seat of the "L."

Figure 57:
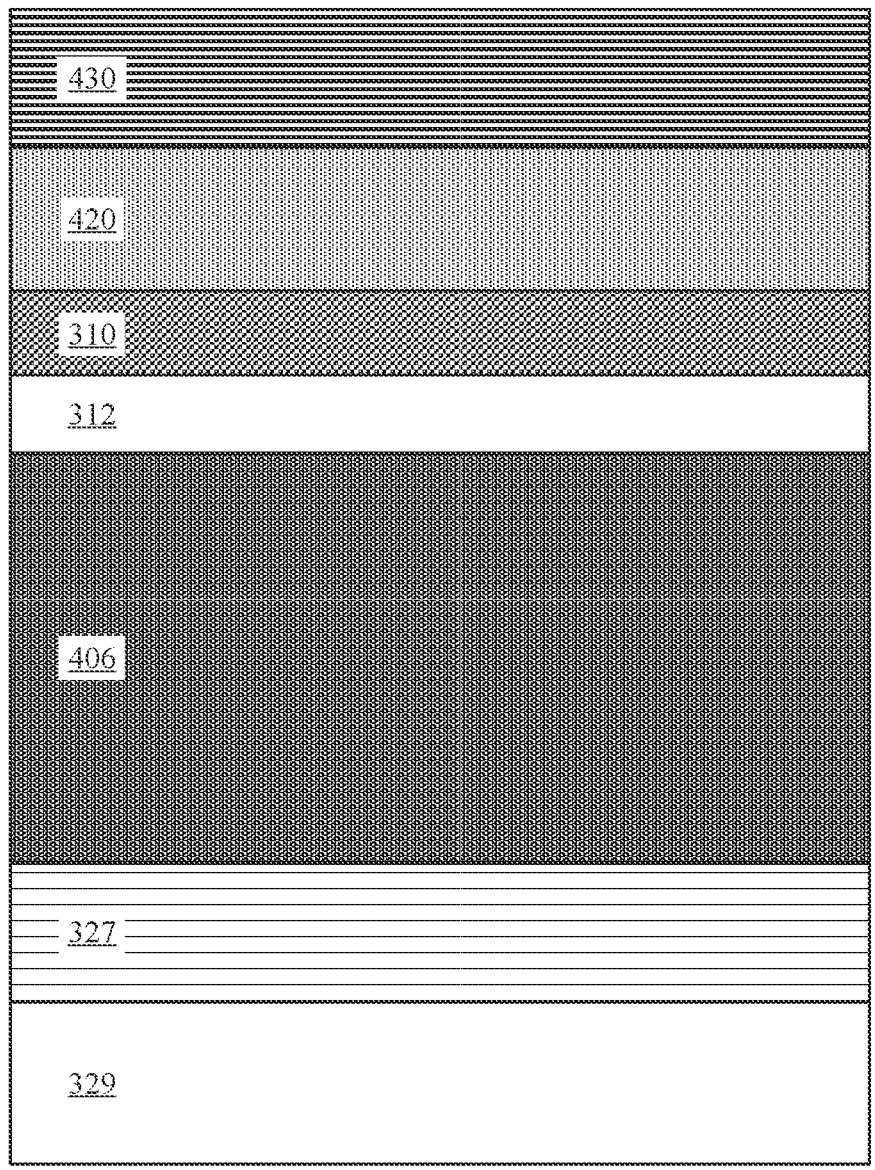
FIG. 57 illustrates the cross section of the different region of the plurality of nanodevices where the device is built over Si after the formation of the BPR and the BSPDN, in accordance with the embodiment of the present invention.

FIG. 57 illustrates the cross section of the different region of the plurality of nanodevices ND1, ND2 where the device 406 is built over the second Si layer 312 after the formation of the BPR 425 and the BSPDN 430, in accordance with the embodiment of the present invention. The lithography mask layer 412 is removed and the BILD 420 is formed directly atop the etch stop layer 310. The BSPDN 430 is formed directly atop the BILD 420.

Figure 58:
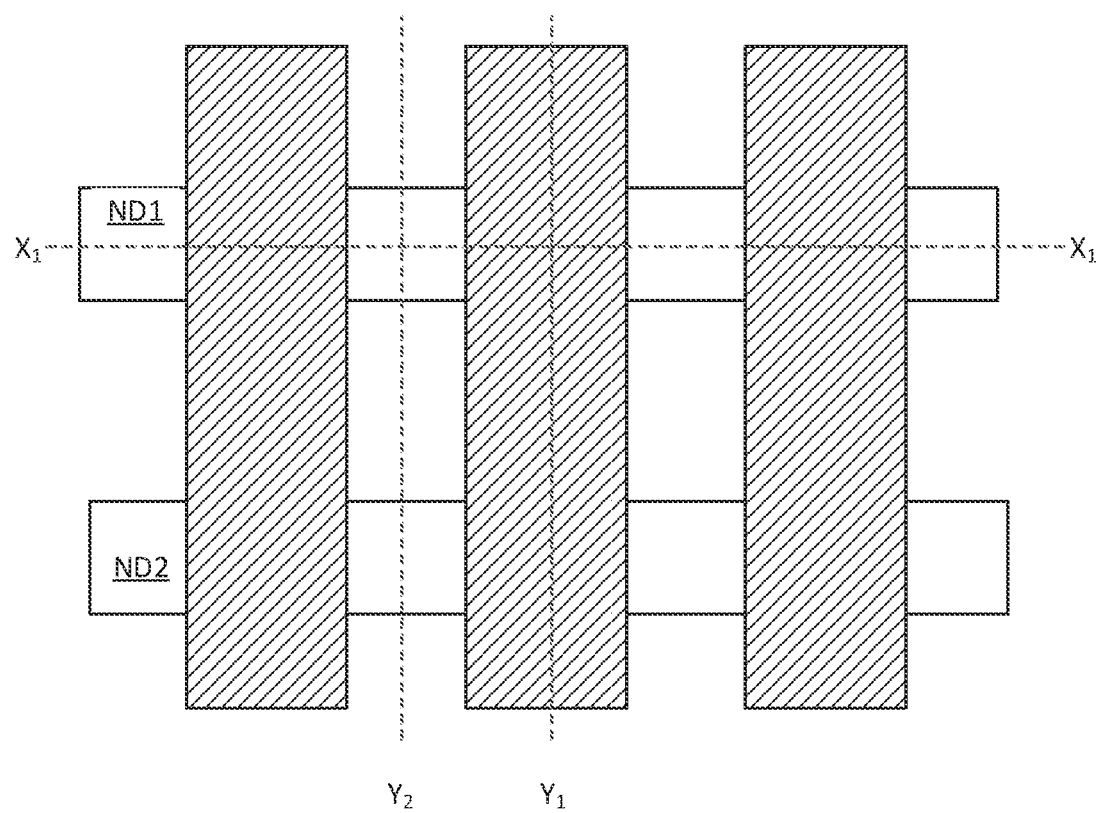
FIG. 58 illustrates a top-down view of the plurality of nanodevices, in accordance with the embodiment of the present invention.

FIG. 58 illustrates a top-down view of the plurality of nanodevices ND1, ND2, in accordance with the embodiment of the present invention. The adjacent devices include a first nanodevice ND1 and a second nanodevice ND2. Cross-section $X_1$ is a cross section perpendicular to the gates along the horizontal axis of the first nanodevice ND1 and cross-section $Y_1$ is a cross section parallel to the gates in the gate region across both nanodevices ND1, ND2. Cross-section $Y_2$ is a cross section parallel to the gates in the source/drain region across both nanodevices ND1, ND2.

Figure 59:
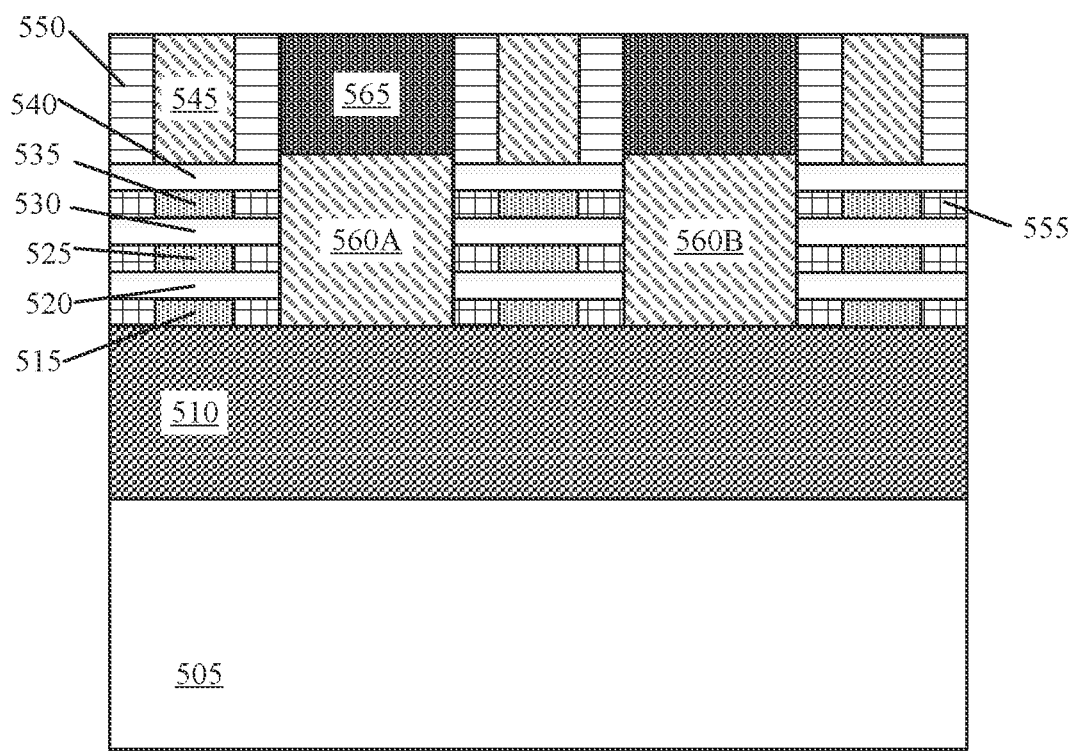
FIGS. 59-61 illustrate cross sections $X_1$, $Y_1$, and $Y_2$, respectively, of the plurality of nanodevices after the formation of the nanosheets, the dummy gate, the gate spacer and the inner spacer, the source/drain contacts, and ILD deposition, in accordance with the embodiment of the present invention.
Figure 60:
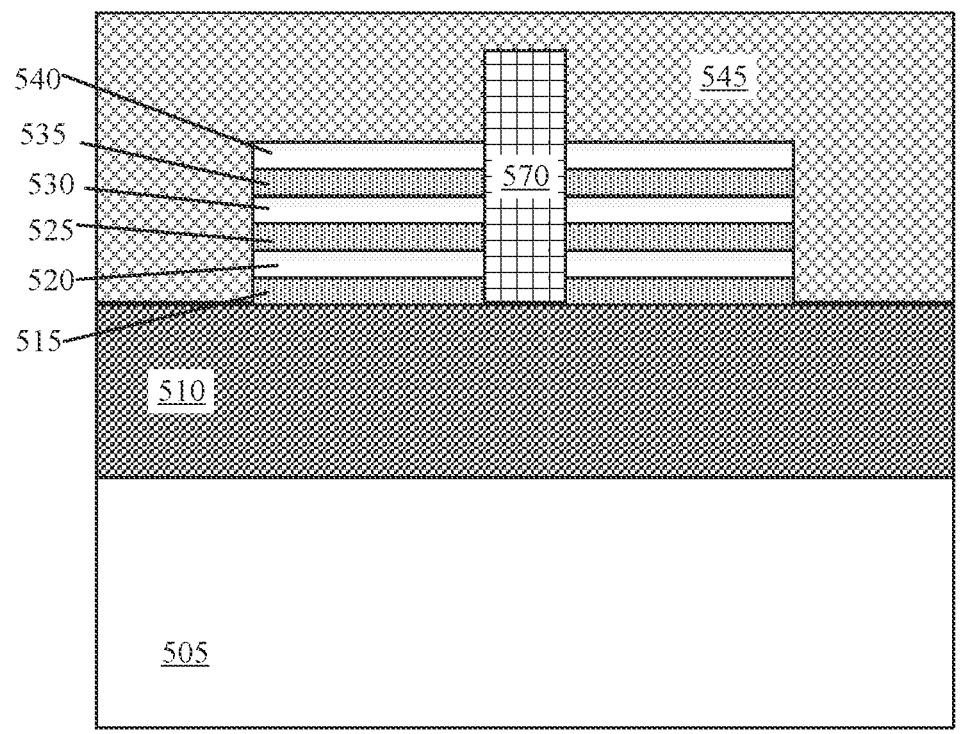
Figure 61:
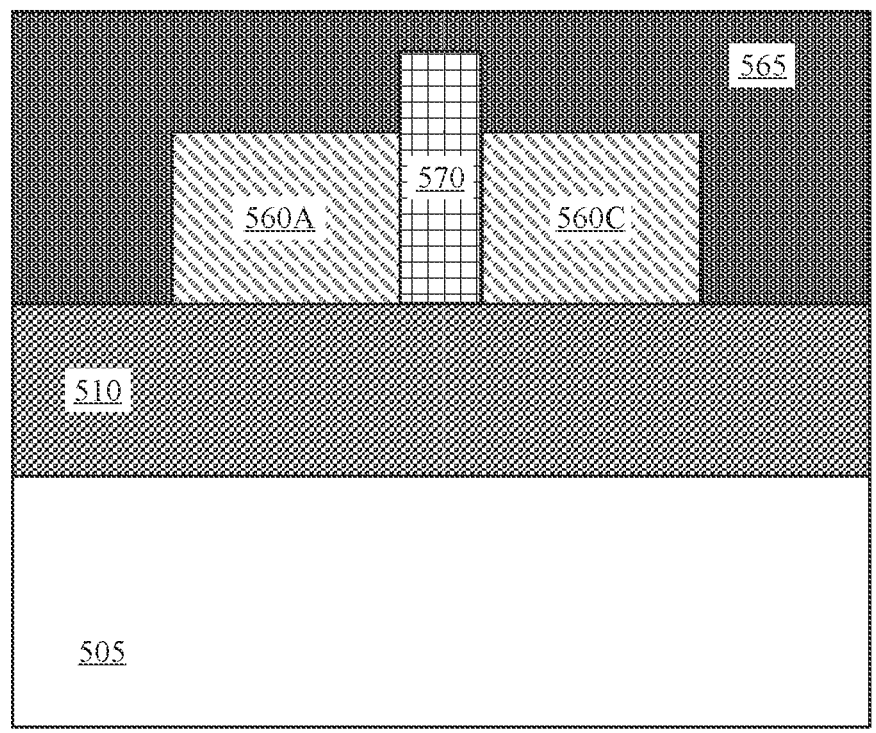

FIGS. 59-61 illustrate cross sections $X_1$, $Y_1$, and $Y_2$, respectively, of the plurality of nanodevices ND1, ND2 after the formation of the nanosheets 520, 530, 540, the dummy gate 545, the gate spacer 550 and the inner spacer 555, the source/drain contacts 560A, 560B, 560C, and ILD 565 deposition, in accordance with the embodiment of the present invention. The substrate 505, the buried oxide layer 510, the plurality of nanosheets 520, 530, 540, the plurality of sacrificial layers 515, 525, 535, the dummy gate 545, the gate spacer 550, the inner spacer 555, the first source/drain 560A, the second source/drain 560B, and the ILD 565 are formed as described above in FIGS. 2-4. In FIG. 60, a portion of the plurality of nanosheets 520, 530, 540, the plurality of sacrificial layers 515, 525, 535 are etched and a dielectric material is filled in the space created by the removal of the portion of the plurality of nanosheets 520, 530, 540, the plurality of sacrificial layers 515, 525, 535 to form the dielectric pillar 570. The dielectric pillar 570 is located directly atop the buried oxide layer 510. A portion of the sidewalls of the dielectric pillar 570 is in contact with the plurality of nanosheets 520, 530, 540, the plurality of sacrificial layers 515, 525, 535, and the dummy gate 545. The dielectric pillar 570 may have a diameter of 10 to 20 nm. The diameter of the dielectric pillar 570 is not intended to be limiting, and it may be appreciated that in the embodiment of the present invention the diameter may vary.

In FIG. 61, the dielectric pillar 570 is also formed between the first source/drain 560A and the third source/drain 560C. The dielectric pillar 570 is located directly atop the buried oxide layer 510. A portion of the sidewalls of the dielectric pillar 570 is in contact with the first source/drain 560A and the third source/drain 560C, and the ILD 565. The dielectric pillar 570 may have a diameter of 10 to 20 nm.

Figure 62:
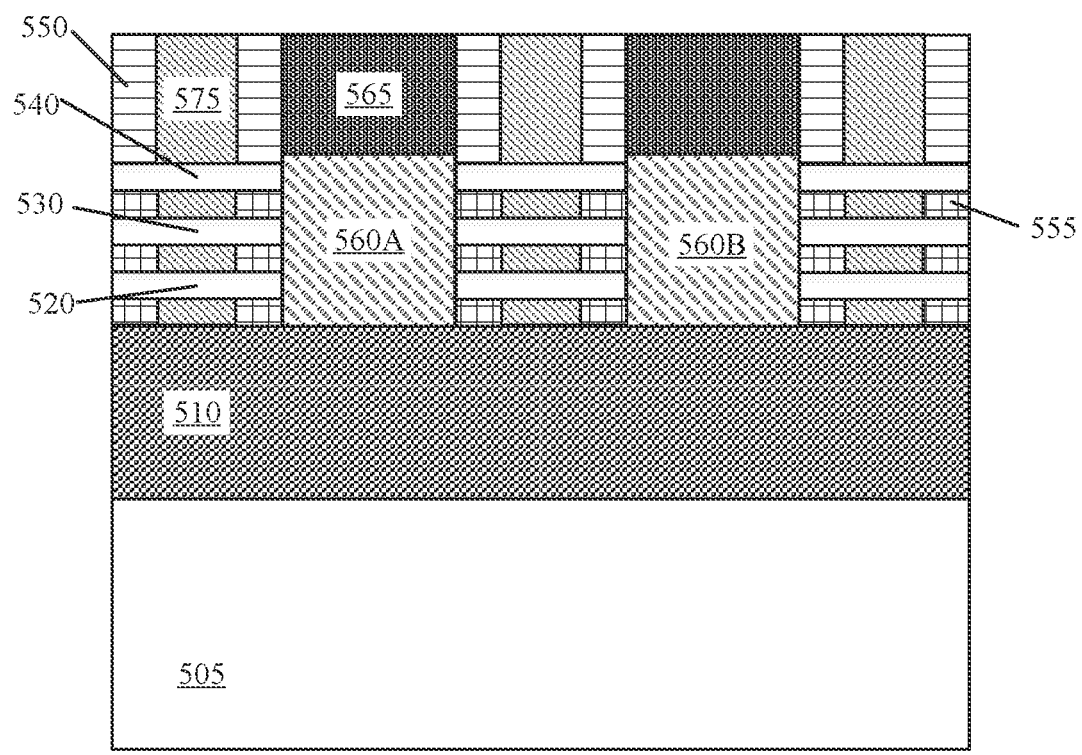
FIGS. 62-64 illustrate cross sections $X_1$, $Y_1$, and $Y_2$, respectively, of the plurality of nanodevices after the formation of the gate and the gate cut region, in accordance with the embodiment of the present invention.
Figure 63:
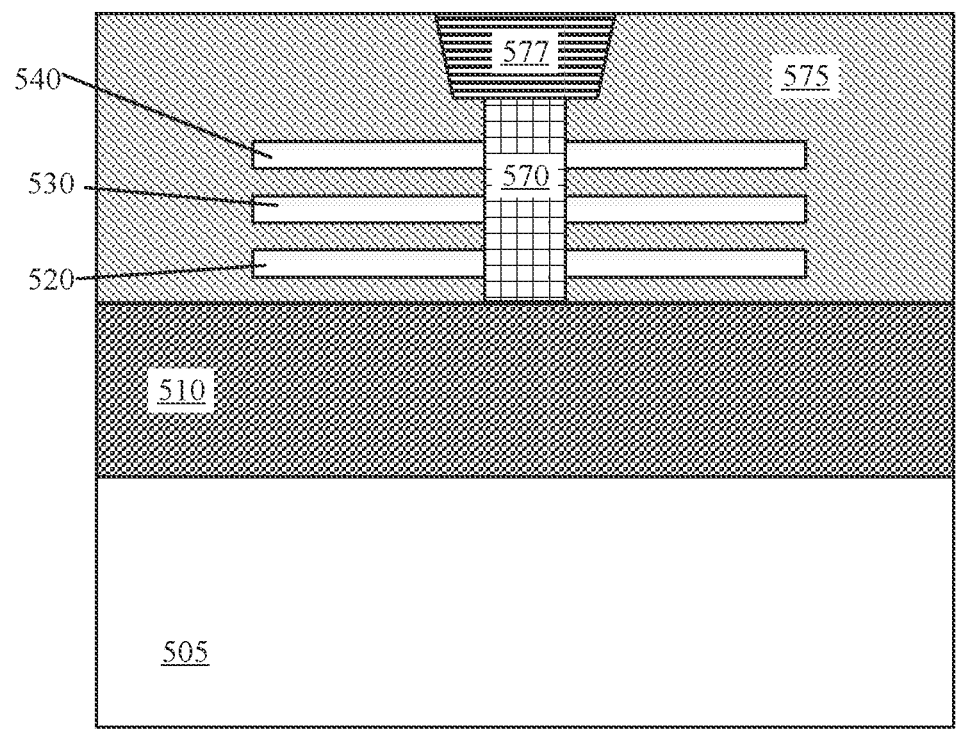
Figure 64:
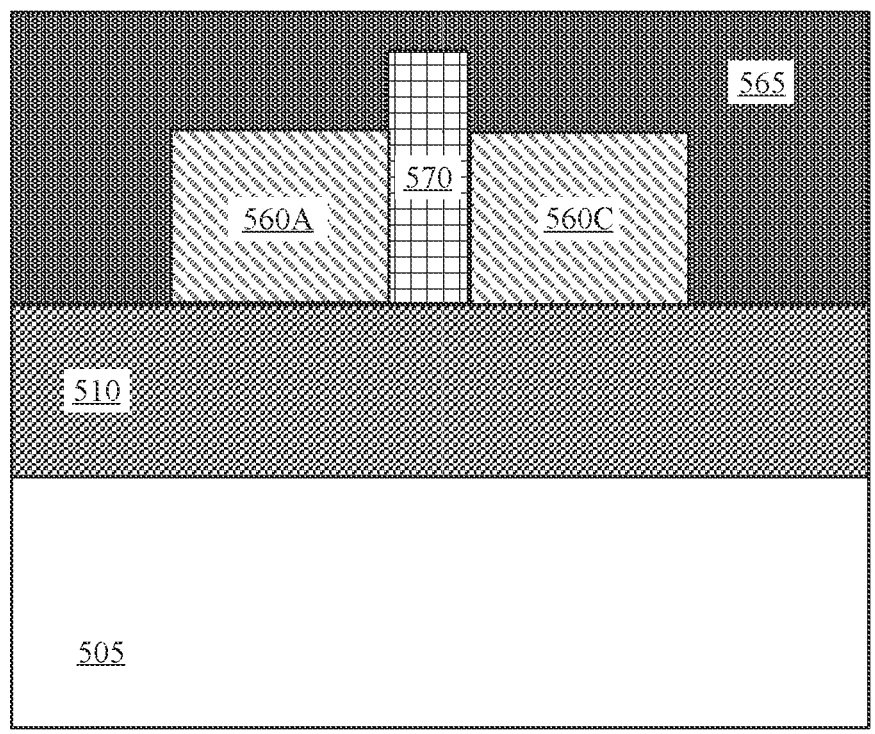

FIGS. 62-64 illustrate cross sections $X_1$, $Y_1$, and $Y_2$, respectively, of the plurality of nanodevices ND1, ND2 after the formation of the gate 575 and the gate cut region 577, in accordance with the embodiment of the present invention. In FIG. 62, the gate 575 is formed as described above in FIG. 5. In FIG. 63, the dummy gate 545 and the plurality of sacrificial layers 515, 525, 535 are removed and a gate material is deposited in the space established by the removal of the dummy gate 145 and the plurality of sacrificial layers 515, 525, 535 to form the gate 575. A portion of the gate 575 is etched and filled with dielectric material to form the gate cut region 577 located directly atop the dielectric pillar 570.

Figure 65:
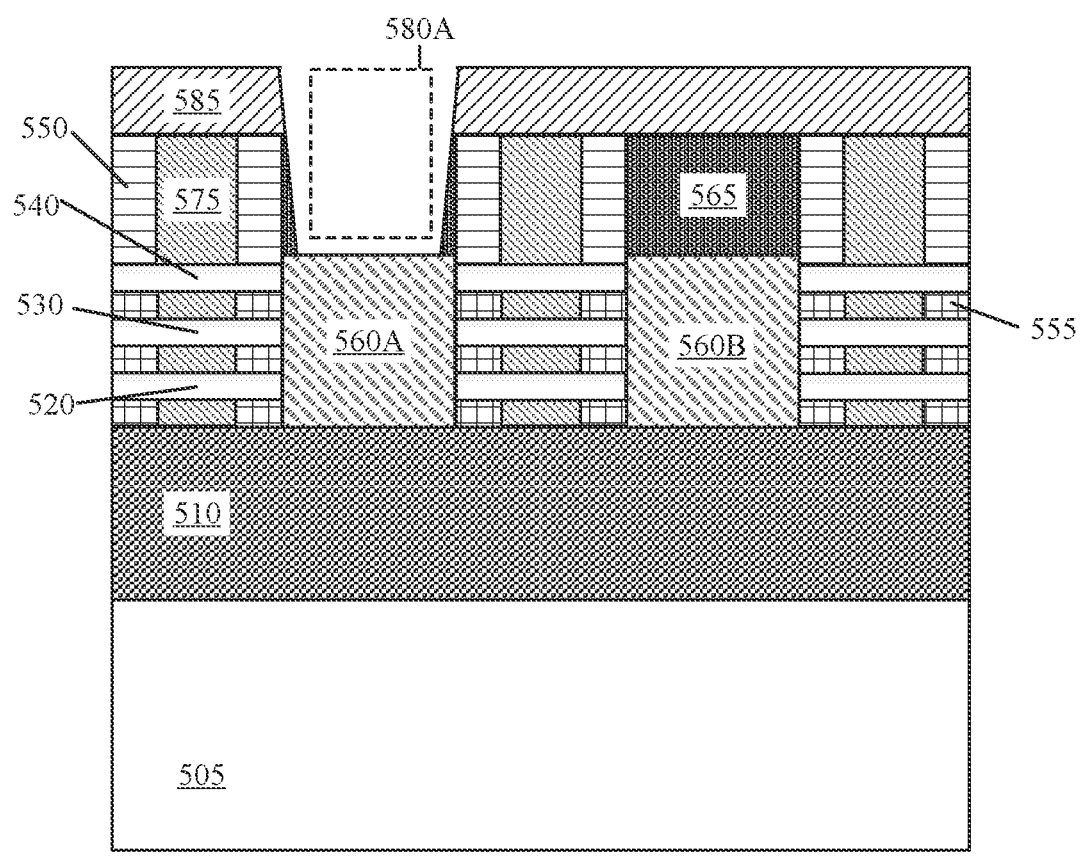
FIGS. 65-67 illustrate cross sections $X_1$, $Y_1$, and $Y_2$, respectively, of the plurality of nanodevices after the formation of the first trench, in accordance with the embodiment of the present invention.
Figure 66:
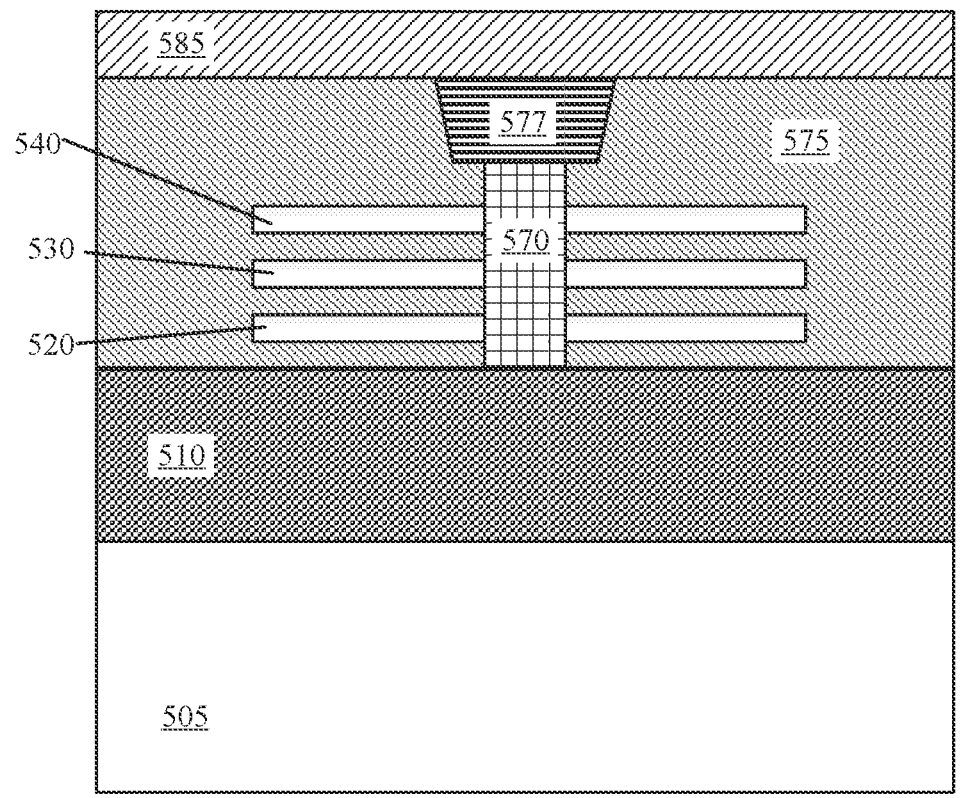
Figure 67:
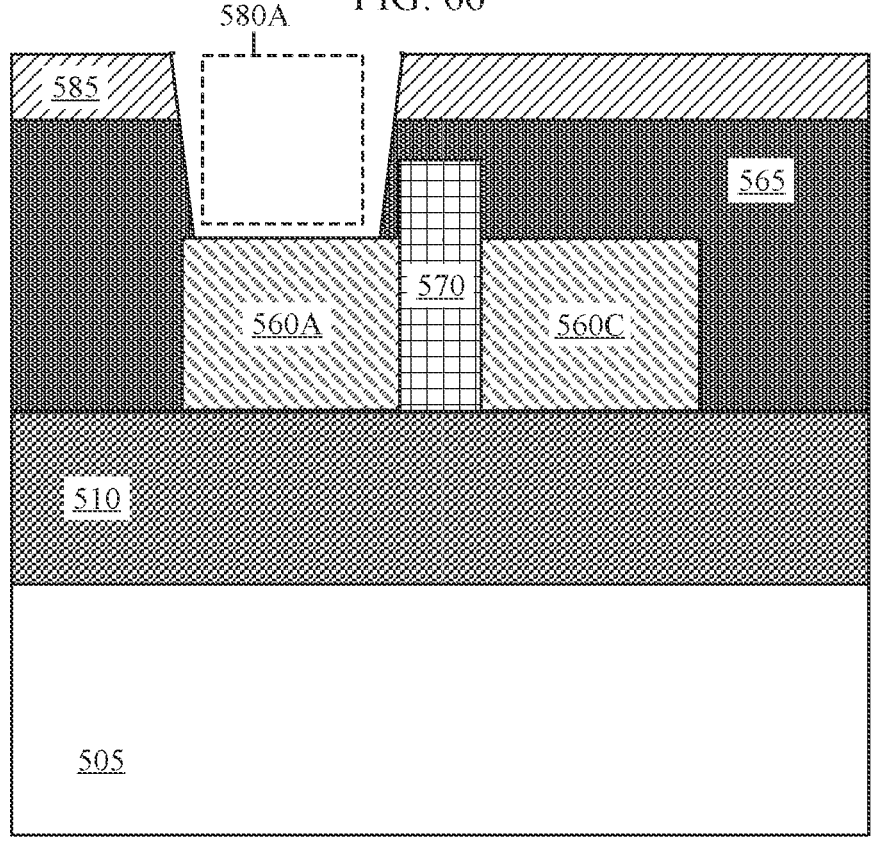

FIGS. 65-67 illustrate cross sections $X_1$, $Y_1$, and $Y_2$, respectively, of the plurality of nanodevices ND1, ND2 after the formation of the first trench 580A, in accordance with the embodiment of the present invention. In FIGS. 65 and 67, a portion of the ILD 565 is etched to form the first trench 580A. The bottom surface of the first trench 580A exposes a portion of the top surface of the first source/drain 560A. A portion of the top surface of the first source/drain 560A is not exposed by the first trench 580A.

In FIG. 65, the lithography mask layer 585, for example, an organic planarization layer (OPL), is formed directly atop the ILD 565, the gate spacer 550, and the gate 575. The lithography mask layer 585 is patterned to expose a portion of the underlying ILD 565 and a top surface of the first source/drain 560A. In FIG. 66, the lithography mask layer 585 is formed directly atop the gate 575 and the gate cut region 577. In FIG. 67, the lithography mask layer 585 is formed directly atop the ILD 565. The lithography mask layer 585 is patterned to expose a portion of the underlying ILD 565 and the top surface of the first source/drain 560A.

Figure 68:
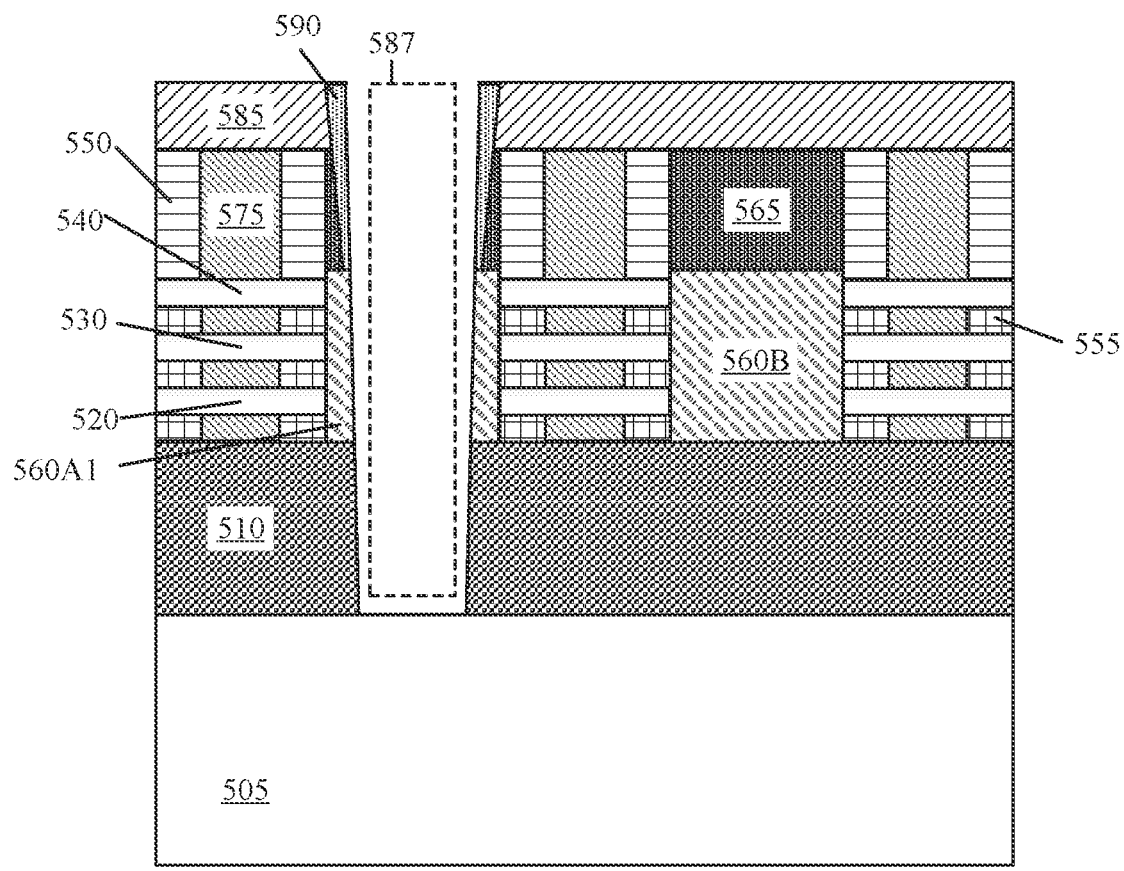
FIGS. 68-70 illustrate cross sections $X_1$, $Y_1$, and $Y_2$, respectively, of the plurality of nanodevices after the formation of a second trench, in accordance with the embodiment of the present invention.
Figure 69:
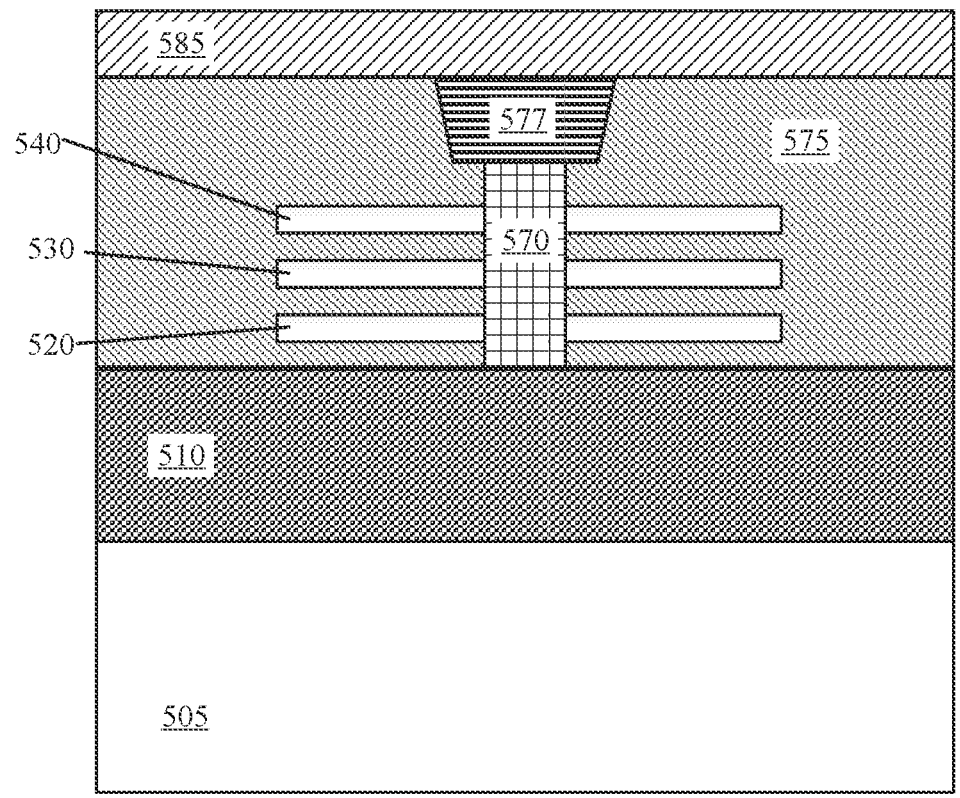
Figure 70:
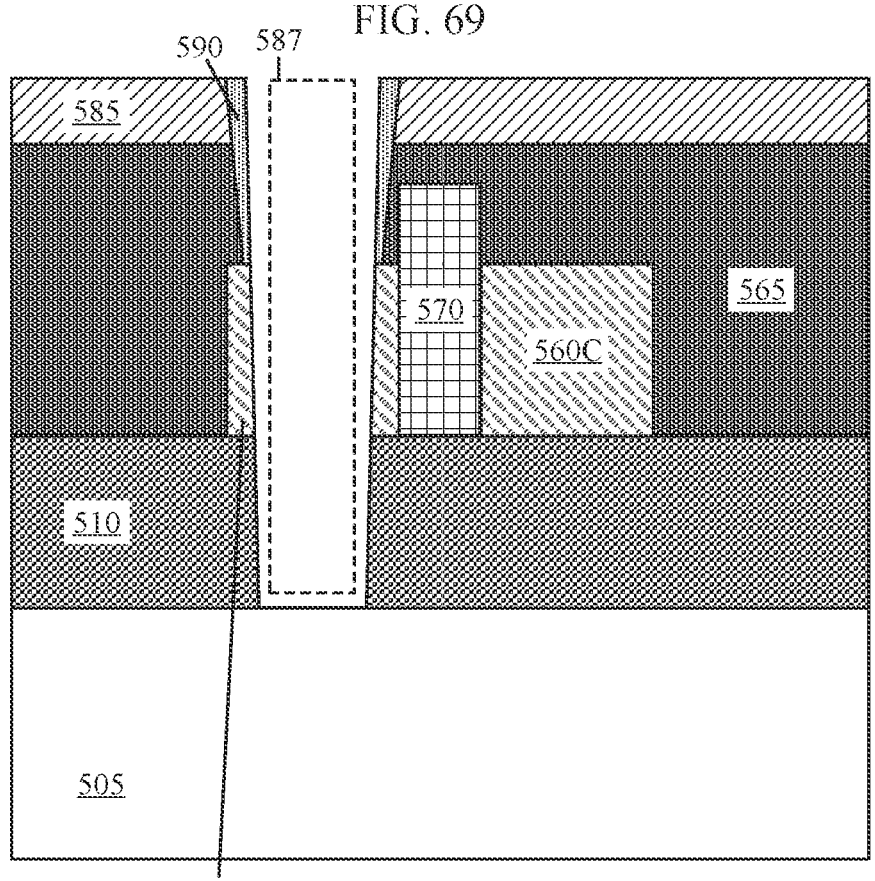

FIGS. 68-70 illustrate cross sections $X_1$, $Y_1$, and $Y_2$, respectively, of the plurality of nanodevices ND1, ND2 after the formation of a second trench 587, in accordance with the embodiment of the present invention. In FIGS. 68 and 70, a liner material is deposited on the exposed surfaces of the ILD 365 and the first trench 580A. The liner material is etched back to form the trench liner 590 located on the sidewalls of the first trench 580A. The second trench 587 is formed by extending the first trench 580A downwards by etching a portion of the first source/drain 560A and the buried oxide layer 510. A bottom surface of the second trench 587 exposes the top surface of the substrate 505. A first portion of the sidewalls of the second trench 587 is defined by the buried oxide layer 510. A second portion of the sidewalls of the second trench 587 is defined by the remaining first source/drain 560A1. A third portion of the sidewalls of the second trench 587 is defined by the trench liner 590.

Figure 71:
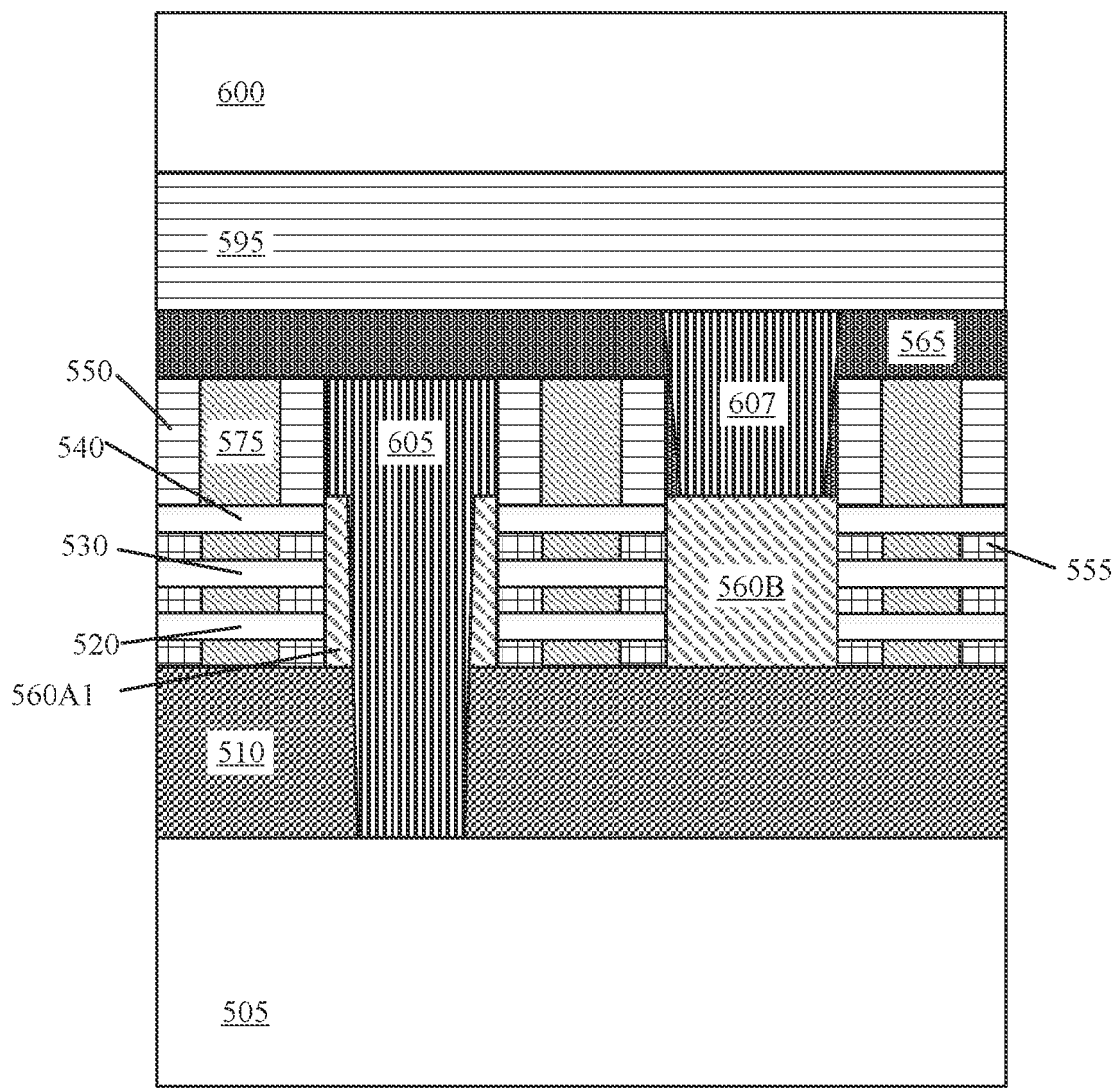
FIGS. 71-73 illustrate cross sections $X_1$, $Y_1$, and $Y_2$, respectively, of the plurality of nanodevices after the formation of gate contacts, the BEOL layer and the carrier wafer, in accordance with the embodiment of the present invention.
Figure 72:
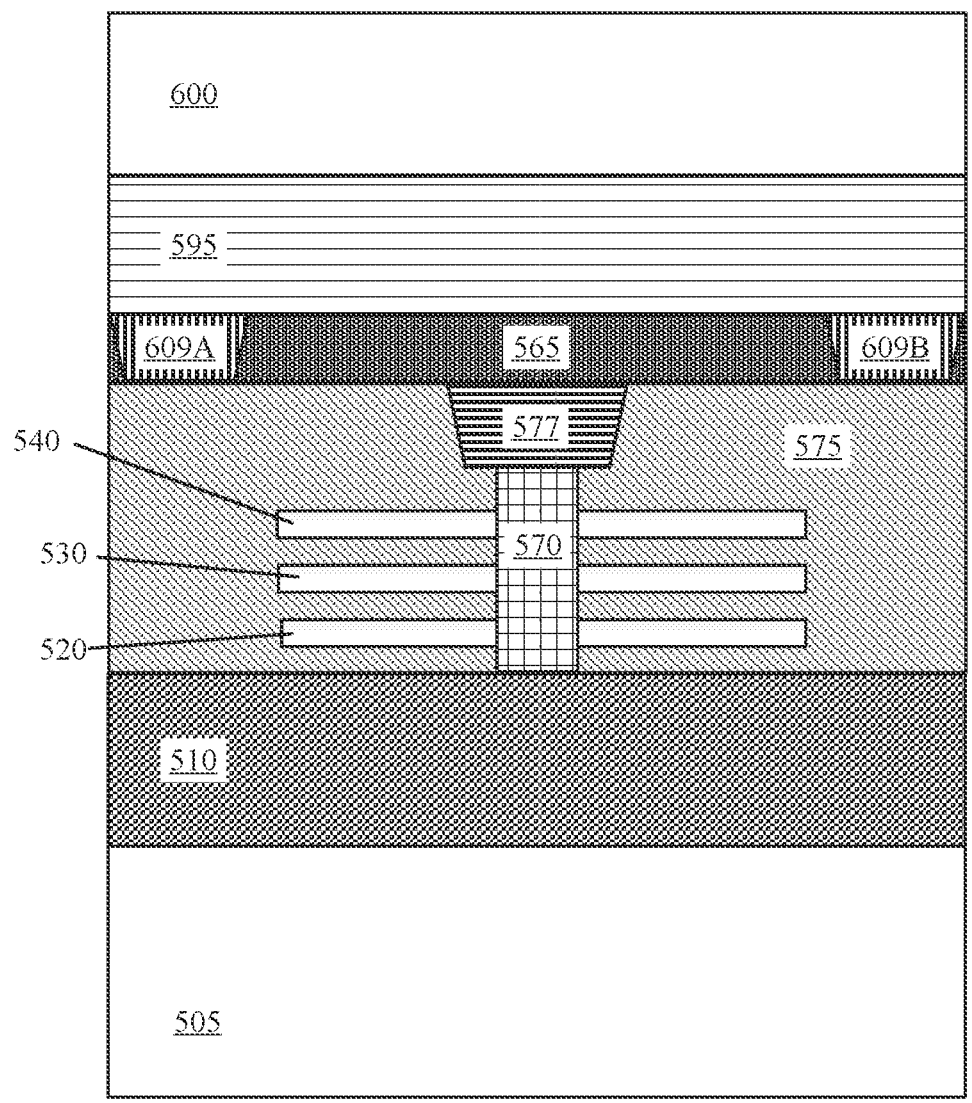
Figure 73:
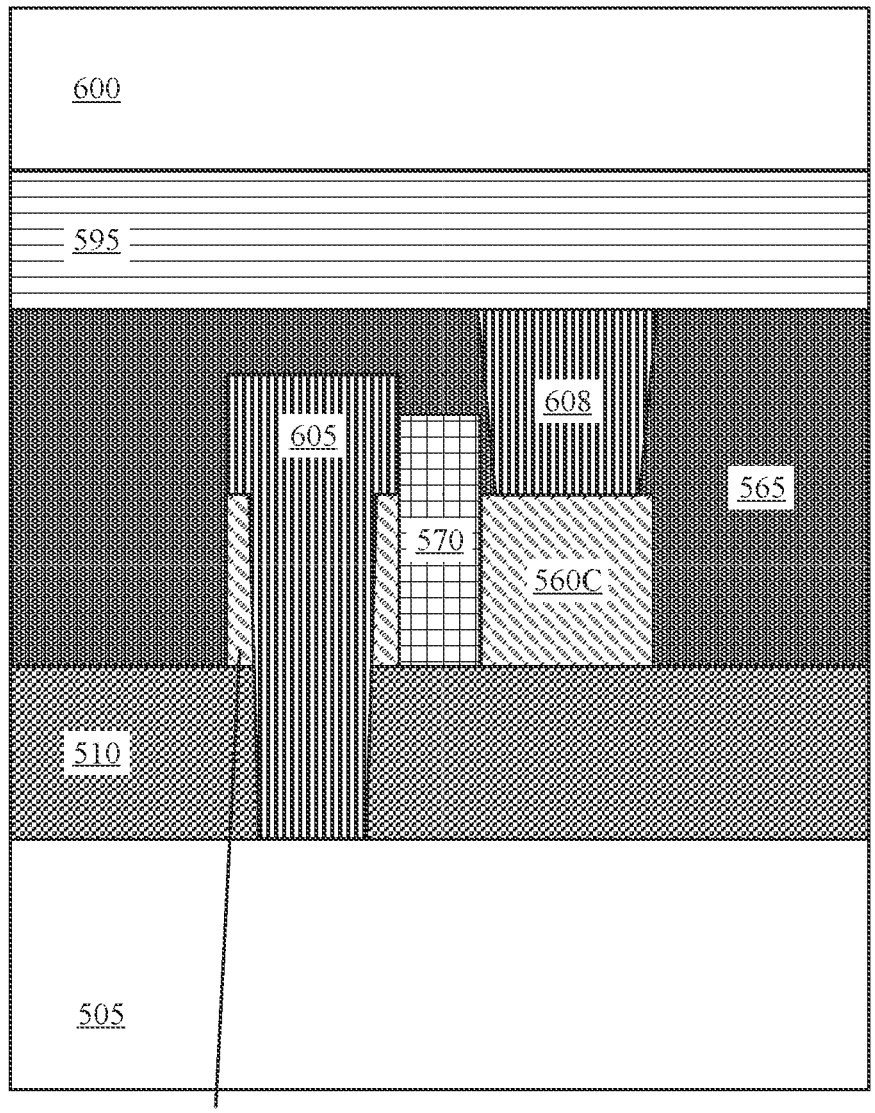

FIGS. 71-73 illustrate cross sections $X_1$, $Y_1$, and $Y_2$, respectively, of the plurality of nanodevices ND1, ND2 after the formation of gate contacts 609A, 609B, the BEOL layer 595 and the carrier wafer 600, in accordance with the embodiment of the present invention. The lithography mask layer 585 and the trench liner 590 are removed. In FIG. 71, a portion of the ILD 565 directly above the second source/drain 560B is etched and a conductive metal is filled in the space created by the removal of the portion of the ILD 565 directly above the second source/drain 560B to form the second source/drain contact 607. The second source/drain contact 607 is located directly over the second source/drain 560B and a bottom surface of the second source/drain contact 607 is in contact with the second source/drain 560B. In FIG. 71, the first trench 580A, the second trench 587, and the space created by the removal of the trench liner 590 are filled with a conductive metal to form the VBPR 605. A portion of the sidewalls of the VBPR 605 is in contact with the buried oxide layer 510, the remaining first source/drain 560A1, or the gate spacer 550, respectively. The BEOL layer 595 is formed directly atop the ILD 565 and the second source/drain contact 607. The carrier wafer 600 is formed directly atop the BEOL layer 595. It may be appreciated that in the embodiment of the present invention, the VBPR 605 is recessed such that the VBPR 605 has lower height than the second source/drain contact 607. Thus, the tip-to-tip shorting between VBPR 605 and the second source/drain contact 607 may be reduced, as shown in FIG. 73.

In FIG. 72, a first gate contact 609A and a second gate contact 609B are formed in the ILD 565. The first gate contact 609A and the second gate contact 609B are located directly over the gate 575 and a bottom surface of the first gate contact 609A and the second gate contact 609B is in contact with the gate 575. The BEOL layer 595 is formed directly atop the ILD 565, the first gate contact 609A, and the second gate contact 609B. The carrier wafer 600 is formed directly atop the BEOL layer 595.

In FIG. 73, a portion of the ILD 565 directly above the third source/drain 560C is etched and a conductive metal is filled in the space created by the removal of the portion of the ILD 565 directly above the third source/drain 560C to form the third source/drain contact 608. The third source/drain contact 608 is located directly over the third source/drain 560C and a bottom surface of the third source/drain contact 608 is in contact with the third source/drain 560C. The first trench 580A, the second trench 587, and the space created by the removal of the trench liner 590 are filled with a conductive metal to form the VBPR 605. A portion of the sidewalls of the VBPR 605 is in contact with the buried oxide layer 510, the remaining first source/drain 560A1, or the ILD 565 and the dielectric pillar 570, respectively. The BEOL layer 595 is formed directly atop the ILD 565 and the third source/drain contact 608. The carrier wafer 600 is formed directly atop the BEOL layer 595.

Figure 74:
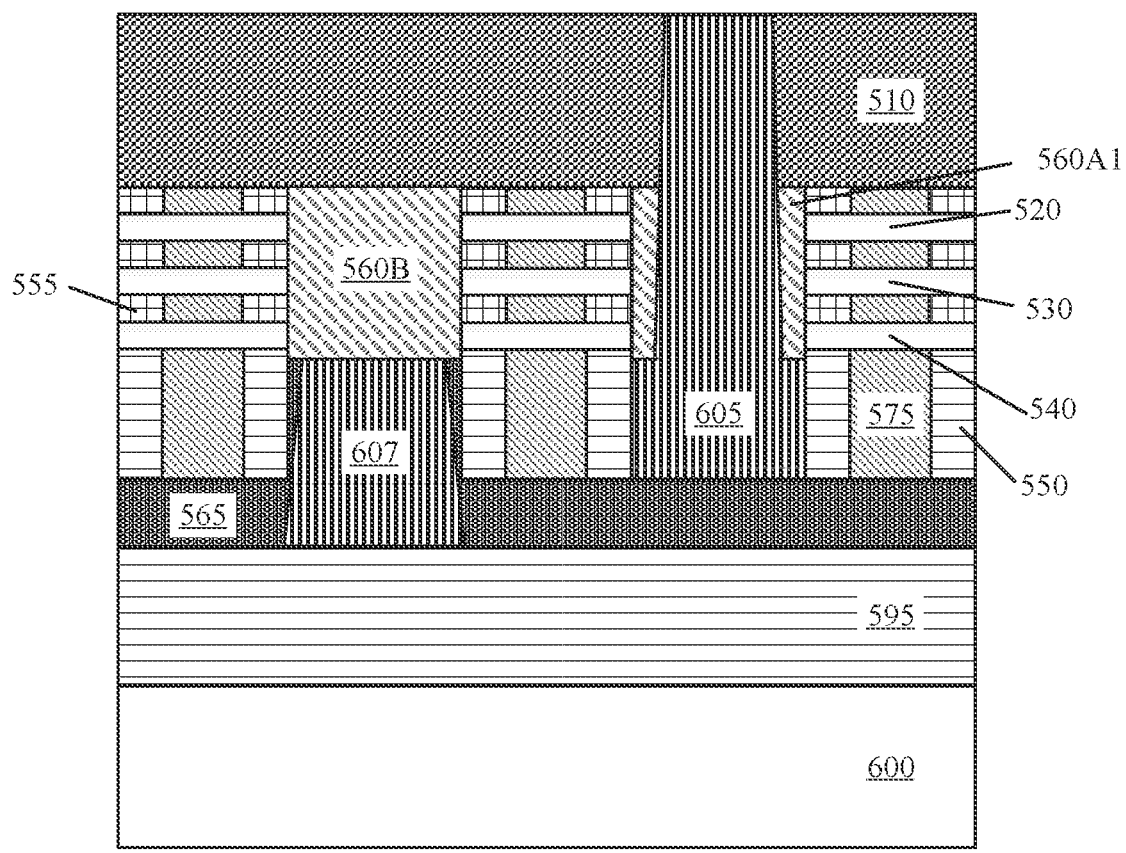
FIGS. 74-76 illustrate cross sections $X_1$, $Y_1$, and $Y_2$, respectively, of the plurality of nanodevices after the removal of the substrate, in accordance with the embodiment of the present invention.
Figure 75:
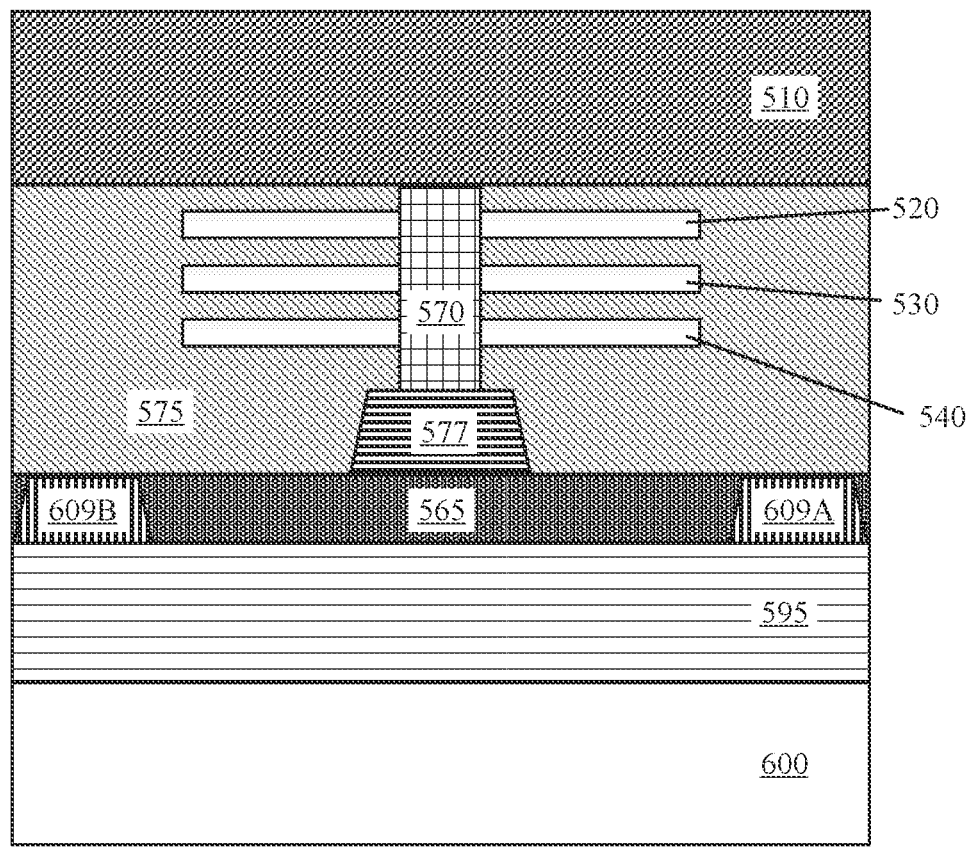
Figure 76:
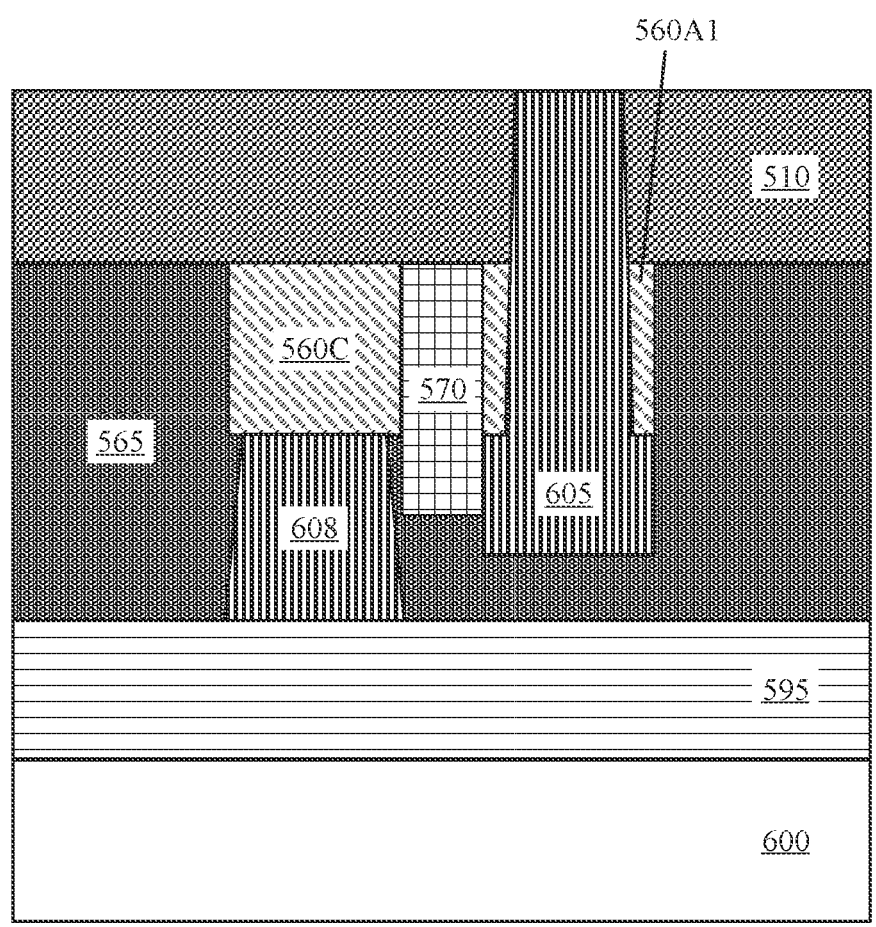

FIGS. 74-76 illustrate cross sections $X_1$, $Y_1$, and $Y_2$, respectively, of the plurality of nanodevices ND1, ND2 after the removal of the substrate 505, in accordance with the embodiment of the present invention. The carrier wafer 600 is flipped and the substrate 505 is removed by, for example, grinding, CMP, and selective wet/dry etch processes, stopping on the buried oxide layer 510. FIGS. 59-73 illustrate the processing of the frontside of the substrate 505, while FIGS. 74-79 illustrate the processing of the backside of the substrate 505.

Figure 77:
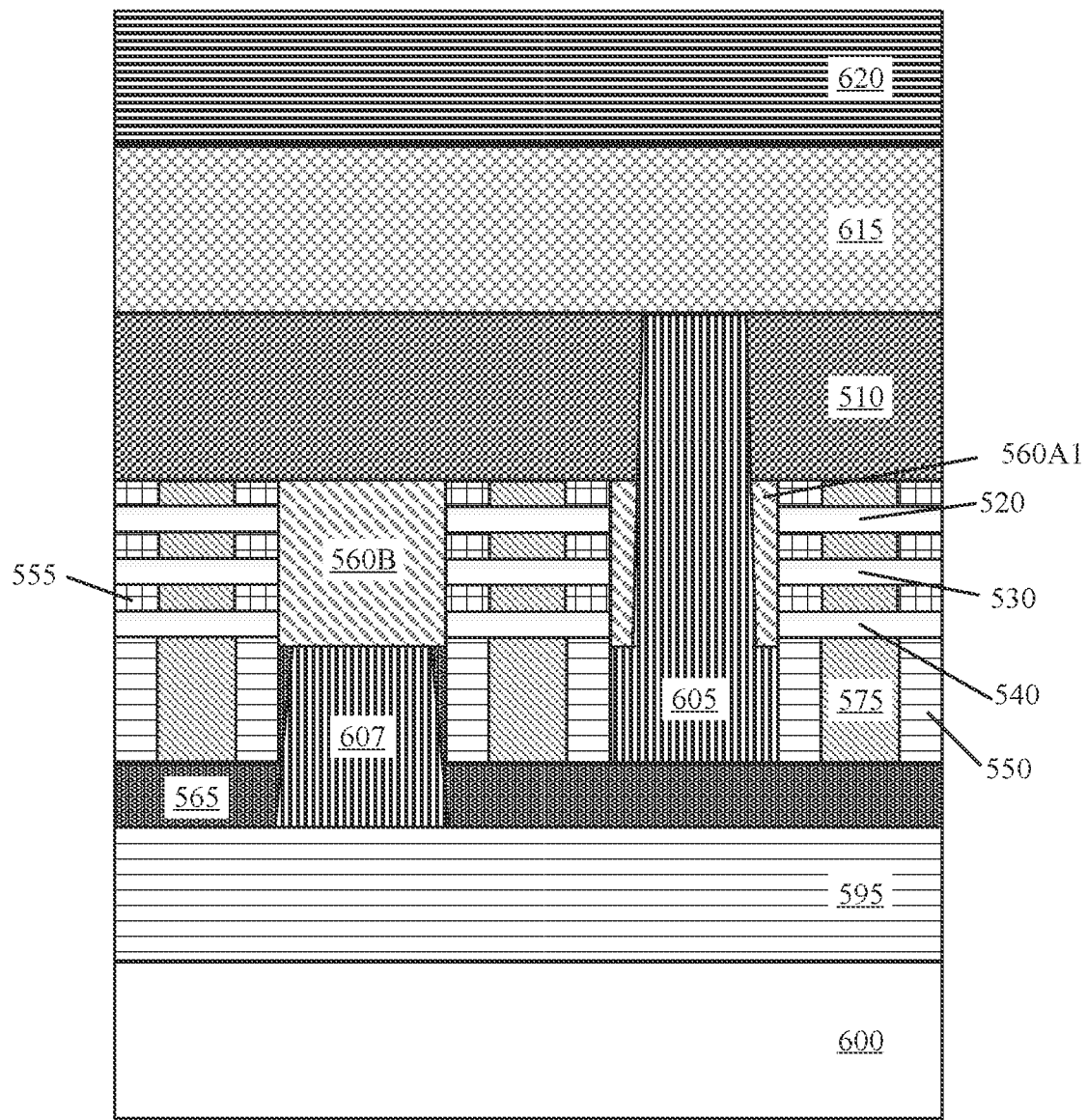
FIGS. 77-79 illustrate cross sections $X_1$, $Y_1$, and $Y_2$, respectively, of the plurality of nanodevices after the formation of the BPR and the BSPDN.
Figure 78:
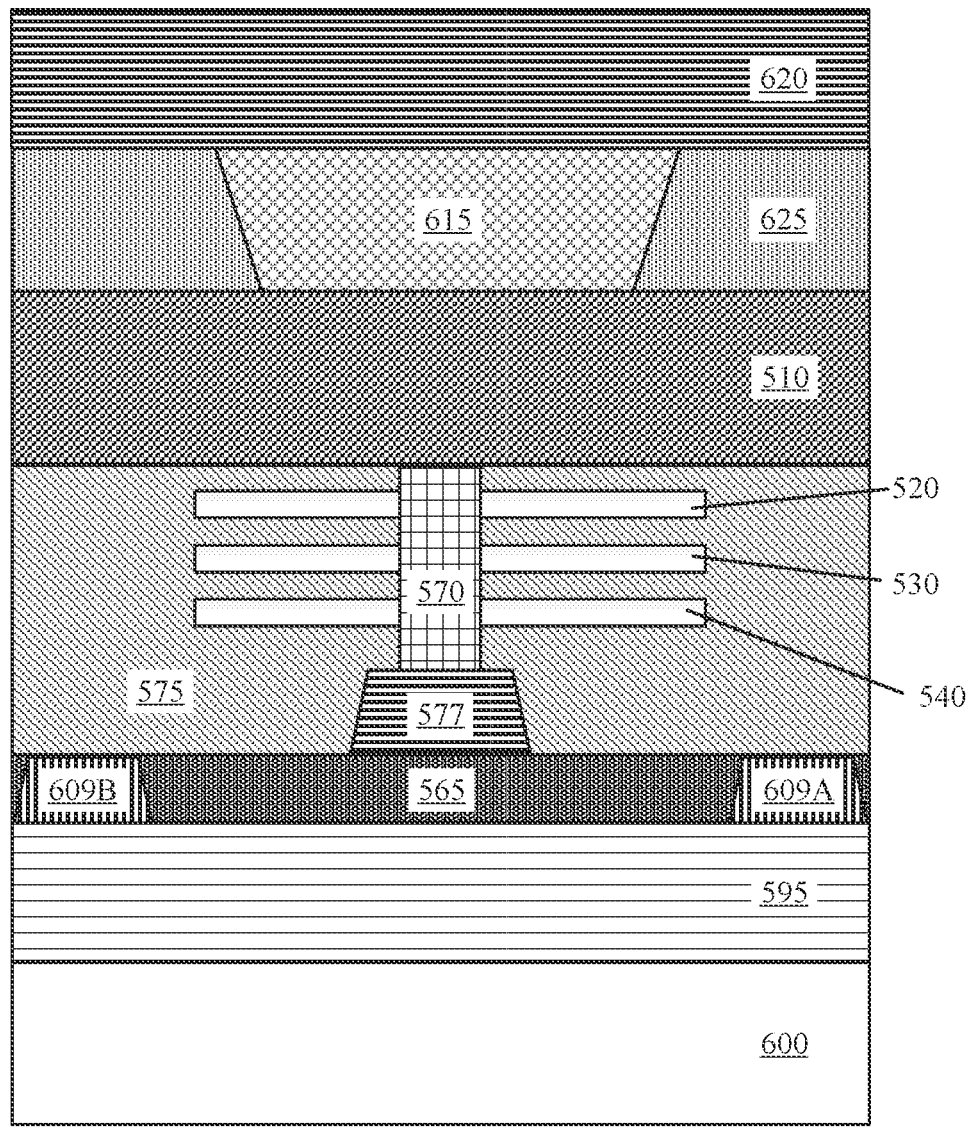
Figure 79:
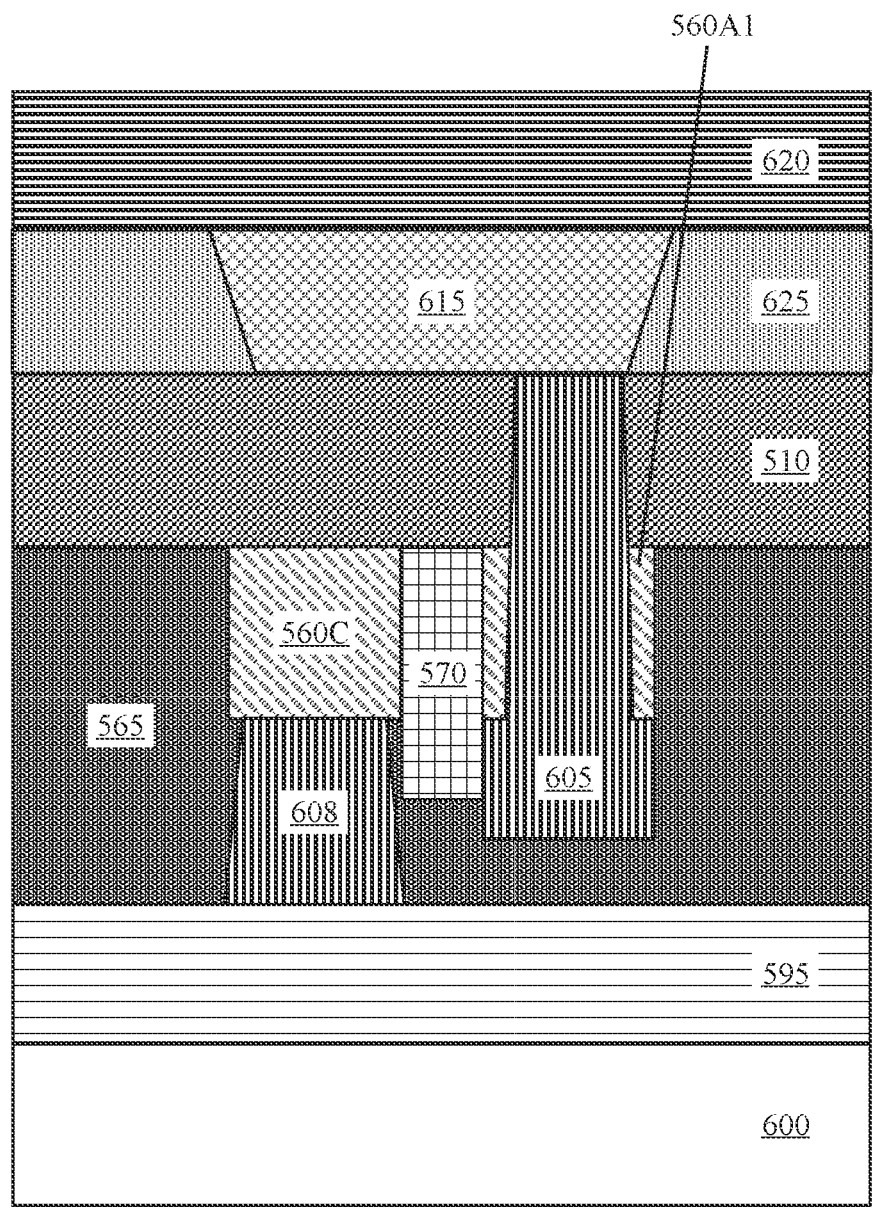

FIGS. 77-79 illustrate cross sections $X_1$, $Y_1$, and $Y_2$, respectively, of the plurality of nanodevices ND1, ND2 after the formation of the BPR 615 and the BSPDN 620. In FIG. 77, the BPR 615 is formed directly atop the buried oxide layer 510 and the VBPR 605. The BSPDN 620 is formed directly atop the BPR 615. The top surface of the VBPR 605 is connected to the bottom surface of the BPR 615. In FIG. 78, the BPR 615 is formed directly atop the buried oxide layer 510. The BSPDN 620 is formed directly atop the BILD 625 and the BPR 615. In FIG. 79, the BPR 615 is formed directly atop the buried oxide layer 510 and the VBPR 605. The BSPDN 620 is formed directly atop the BILD 625 and the BPR 615. The bottom surface of the VBPR 605 is connected to the BPR 615.

It may be appreciated that FIGS. 1-79 provide only an illustration of one implementation and do not imply any limitations with regard to how different embodiments may be implemented. Many modifications to the depicted environments may be made based on design and implementation requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a first source/drain and a second source/drain of a semiconductor device;
a first source/drain contact including a first portion and a second portion, wherein the first portion of the first source/drain contact is located directly atop the first source/drain, wherein the second portion of the first source/drain contact extends vertically past the first source/drain, and wherein the first source/drain is in direct contact with three different sides of a first section of the second portion of the first source/drain contact.

2. The semiconductor device of claim 1, further comprising:
an interlayer dielectric layer located around the first source/drain contact, wherein the interlayer dielectric is in contact with two side surfaces of the first portion of the first source/drain contact, wherein the interlayer dielectric is in contact with a plurality of side surfaces of the second portion of the first source/drain contact.

3. The semiconductor device of claim 2, further comprising:
a trench liner located around the first source/drain contact, wherein the trench liner is in contact with a second side surface of the first portion of the first source/drain contact, wherein the trench liner is in contact with a plurality of second side surfaces of the second portion of the first source/drain contact.

4. The semiconductor device of claim 3, wherein the first portion of the first source/drain contact is in contact with the first source/drain and the interlayer dielectric.

5. The semiconductor device of claim 1, wherein the first source/drain is smaller than the second source/drain.

6. The semiconductor device of claim 5, further comprising:
a second source/drain contact located directly atop the second source/drain.

7. The semiconductor device of claim 6, wherein the first source/drain is located in a seat of the L.

8. The semiconductor device of claim 7, further comprising:
a backside power rail located directly atop a buried oxide layer, wherein a top surface of the second portion of the first source/drain contact is in contact with a bottom surface of the backside power rail.

9. The semiconductor device of claim 1, wherein the first portion of the first source/drain contact and the second portion of the first source/drain have an L-shape.

10. The semiconductor device of claim 1, wherein a critical dimension of the second portion of the first source/drain contact is smaller than a critical dimension of the first portion of the first source/drain contact.

11. The semiconductor device of claim 1, wherein sidewalls of a second section of the second portion of the first source/drain contact are in contact with a buried oxide layer.

12. The semiconductor device of claim 11, further comprising:
an interlayer dielectric layer located around the first source/drain contact, wherein the interlayer dielectric is in contact with two side surfaces of the first portion of the first source/drain contact, wherein the interlayer dielectric is in contact with a plurality of side surfaces of the second portion of the first source/drain contact.

13. The semiconductor device of claim 12, further comprising:
a trench liner located around the first source/drain contact, wherein the trench liner is in contact with a second side surface of the first portion of the first source/drain contact, wherein the trench liner is in contact with a plurality of second side surfaces of the second portion of the first source/drain contact.

14. The semiconductor device of claim 11, wherein the first source/drain is smaller than the second source/drain.

15. The semiconductor device of claim 14, further comprising:
a second source/drain contact located directly atop the second source/drain.

16. The semiconductor device of claim 11, wherein a critical dimension of the second portion of the first source/drain contact is smaller than a critical dimension of the first portion of the first source/drain contact.

17. The semiconductor device of claim 11, wherein the first source/drain and the second source/drain are an n-type epitaxy.

18. The semiconductor device of claim 11, wherein the first source/drain and the second source/drain are a p-type epitaxy.

19. The semiconductor device of claim 1, wherein sidewalls of a second section of the second portion of the first source/drain contact are in contact with a bottom dielectric isolation layer.

20. The semiconductor device of claim 1, wherein the first source/drain and the second source/drain are an n-type epitaxy.

21. The semiconductor device of claim 1, wherein the first source/drain and the 14. second source/drain are a p-type epitaxy.

22. A semiconductor device comprising:
a first source/drain and a second source/drain of a semiconductor device;
a first source/drain contact including a first portion and a second portion, wherein the first portion of the first source/drain contact is located directly atop the first source/drain, wherein the second portion of the first source/drain contact extends vertically past the first source/drain, and wherein the first source/drain is in direct contact with three different sides of a first section of the second portion of the first source/drain contact; and
a backside power rail in contact with a surface of the second portion of the first source/drain contact.

23. A semiconductor device comprising:
a first source/drain and a second source/drain of a semiconductor device;
a first source/drain contact including a first portion and a second portion, wherein the first portion of the first source/drain contact is located directly atop the first source/drain, wherein the second portion of the first source/drain contact extends vertically past the first source/drain, and wherein the first source/drain is in direct contact with three different sides of a first section of the second portion of the first source/drain contact; and a backside power rail in contact with a surface of the second portion of the first source/drain contact, wherein a bottom surface of the backside power rail is larger than a top surface of the second portion of the first source/drain contact.

24. The method of claim 23, wherein the first source/drain contact is formed by removing a lithography layer to form a combined trench, wherein the combined trench is filled with a conductive metal.

25. A method of making a semiconductor device, the method comprising:

forming a first source/drain and a second source/drain on a buried oxide layer; and forming a first source/drain contact including a first portion and a second portion, wherein the first portion of the first source/drain contact is located directly atop the first source/drain, wherein the second portion of the first source/drain contact extends vertically past the first source/drain, and wherein the first source/drain is in direct contact with three different sides of a first section of the second portion of the first source/drain contact.

* * * * *